United States Patent
Yoshitani et al.

(10) Patent No.: US 10,133,531 B2
(45) Date of Patent: Nov. 20, 2018

(54) DISPLAY DEVICE COMPRISING PLURAL PANELS

(71) Applicant: Semiconductor Energy Laboratory Co., Ltd., Kanagawa-ken (JP)

(72) Inventors: Yusuke Yoshitani, Kanagawa (JP); Kazuhiko Fujita, Hiratsuka Kanagawa (JP); Akihiro Kaita, Kanagawa (JP)

(73) Assignee: Semiconductor Energy Laboratories Co., Ltd. (JP)

( * ) Notice: Subject to any disclaimer, the term of this patent is extended or adjusted under 35 U.S.C. 154(b) by 0 days.

(21) Appl. No.: 14/876,238

(22) Filed: Oct. 6, 2015

(65) Prior Publication Data

US 2016/0103649 A1 Apr. 14, 2016

(30) Foreign Application Priority Data

Oct. 8, 2014 (JP) .................................. 2014-206873
Oct. 28, 2014 (JP) .................................. 2014-219086

(Continued)

(51) Int. Cl.
*G06F 3/14* (2006.01)
*G09G 3/32* (2016.01)
(Continued)

(52) U.S. Cl.
CPC ............ *G06F 3/1446* (2013.01); *G06F 3/147* (2013.01); *G09G 3/20* (2013.01); *G09G 3/2003* (2013.01);
(Continued)

(58) Field of Classification Search
CPC ..... G06F 3/1446; G06F 3/147; G09G 3/2003; G09G 3/3208; G09G 2310/0264;
(Continued)

(56) References Cited

U.S. PATENT DOCUMENTS

| 5,801,797 A | 9/1998 | Iida et al. |
| 7,399,991 B2 | 7/2008 | Seo et al. |

(Continued)

FOREIGN PATENT DOCUMENTS

| CN | 001363200 A | 8/2002 |
| CN | 001713035 A | 12/2005 |

(Continued)

OTHER PUBLICATIONS

International Search Report re Application No. PCT/IB2015/057411, dated Dec. 15, 2015.

(Continued)

*Primary Examiner* — Temesghen Ghebretinsae
*Assistant Examiner* — Yaron Cohen
(74) *Attorney, Agent, or Firm* — Husch Blackwell LLP

(57) ABSTRACT

To provide a display device that is suitable for increasing in size. To provide a display device in which display unevenness is suppressed. To provide a display device that can display an image along a curved surface. The display device includes two display panels, two plates, two stages, two driver circuits, two adjusting units, and a frame. Each display panel includes a display portion, an operating circuit portion, a terminal, an external electrode, a transparent portion, and a first portion and has flexibility. Each transparent portion includes a region transmitting visible light. The display panels are fixed so that transparent portions and parts of the display portions extend beyond the plates. The display portion of one of the two display panels overlaps with the transparent portion of the other display panel.

11 Claims, 34 Drawing Sheets

(30) Foreign Application Priority Data

Nov. 27, 2014 (JP) ................................ 2014-240213
Mar. 5, 2015 (JP) ................................ 2015-043931

(51) Int. Cl.

| | | |
|---|---|---|
| *G06F 3/147* | (2006.01) | |
| *G09G 3/20* | (2006.01) | |
| *G09G 3/3208* | (2016.01) | |
| *H01L 27/32* | (2006.01) | |
| *H01L 25/04* | (2014.01) | |

(52) U.S. Cl.

CPC ......... *G09G 3/3208* (2013.01); *H01L 25/048* (2013.01); *H01L 27/3267* (2013.01); *H01L 27/3293* (2013.01); *G09G 2300/026* (2013.01); *G09G 2300/043* (2013.01); *G09G 2300/0426* (2013.01); *G09G 2310/0264* (2013.01); *H01L 2251/5338* (2013.01); *H01L 2924/0002* (2013.01)

(58) Field of Classification Search

CPC ............... G09G 2300/043; G09G 3/20; G09G 2300/026; G09G 2300/0426; H01L 25/048; H01L 27/3293; H01L 27/3267; H01L 2924/0002; H01L 2251/5338; H01L 2924/00

See application file for complete search history.

(56) References Cited

U.S. PATENT DOCUMENTS

| | | | |
|---|---|---|---|
| 7,663,149 B2 | 2/2010 | Seo et al. | |
| 8,367,440 B2 | 2/2013 | Takayama et al. | |
| 8,415,208 B2 | 4/2013 | Takayama et al. | |
| 2002/0011783 A1 | 1/2002 | Hosokawa | |
| 2005/0285811 A1 | 12/2005 | Kawase et al. | |
| 2010/0177018 A1 | 7/2010 | Wang et al. | |
| 2010/0298032 A1* | 11/2010 | Lee ....................... | G06F 1/1616 |
| | | | 455/566 |
| 2011/0050657 A1 | 3/2011 | Yamada | |
| 2011/0057861 A1 | 3/2011 | Cok et al. | |
| 2012/0119235 A1* | 5/2012 | Nishiyama ............. | H05B 33/10 |
| | | | 257/88 |
| 2012/0268445 A1 | 10/2012 | Ogata et al. | |
| 2013/0200783 A1 | 8/2013 | Van Heck et al. | |
| 2013/0201636 A1 | 8/2013 | Van Den Brand et al. | |
| 2013/0201637 A1 | 8/2013 | De Kok et al. | |
| 2013/0214324 A1 | 8/2013 | Takayama et al. | |
| 2015/0028316 A1 | 1/2015 | Kojima et al. | |
| 2015/0228704 A1 | 8/2015 | Miyake et al. | |
| 2016/0019019 A1 | 1/2016 | Ikeda et al. | |
| 2016/0037608 A1 | 2/2016 | Ikeda et al. | |
| 2016/0044751 A1 | 2/2016 | Ikeda et al. | |

FOREIGN PATENT DOCUMENTS

| | | |
|---|---|---|
| EP | 1 191 820 A1 | 3/2002 |
| EP | 1 612 658 A2 | 1/2006 |
| JP | 2001-230086 A | 8/2001 |
| JP | 2002-324673 | 11/2002 |
| JP | 2003-174153 | 6/2003 |
| JP | 2005-202077 A | 7/2005 |
| JP | 2006-10811 | 1/2006 |
| JP | 2011-215380 A | 10/2011 |
| JP | 2012-028638 A | 2/2012 |
| JP | 2014-075547 A | 4/2014 |
| JP | 2015-180924 A | 10/2015 |
| KR | 2006-0048387 A | 5/2006 |
| KR | 2007-0087082 A | 8/2007 |
| TW | I257596 B | 7/2006 |
| TW | 201532012 A | 8/2015 |
| WO | WO 2001/062051 A1 | 8/2001 |
| WO | WO 2015/121770 A1 | 8/2015 |

OTHER PUBLICATIONS

Written Opinion re Application No. PCT/IB2015/057411, dated Dec. 15, 2015.

* cited by examiner

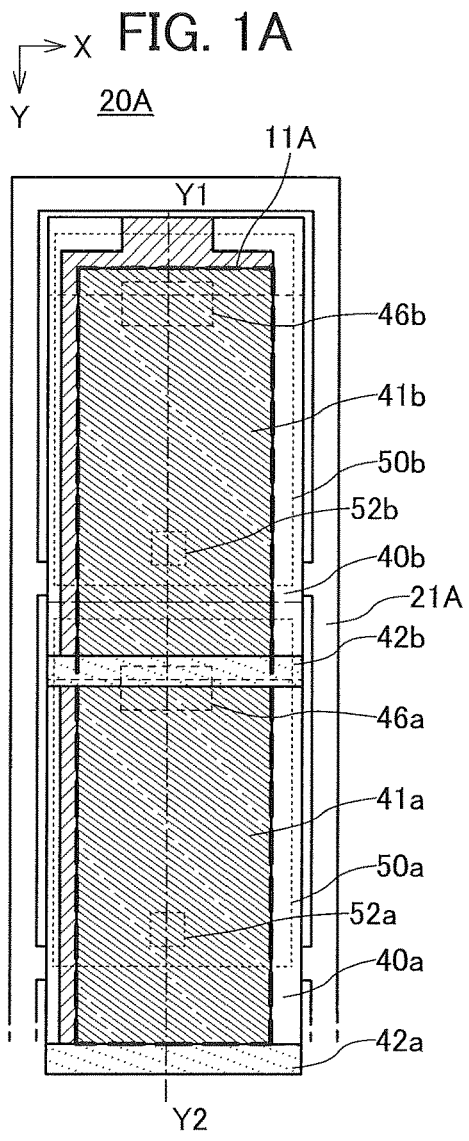
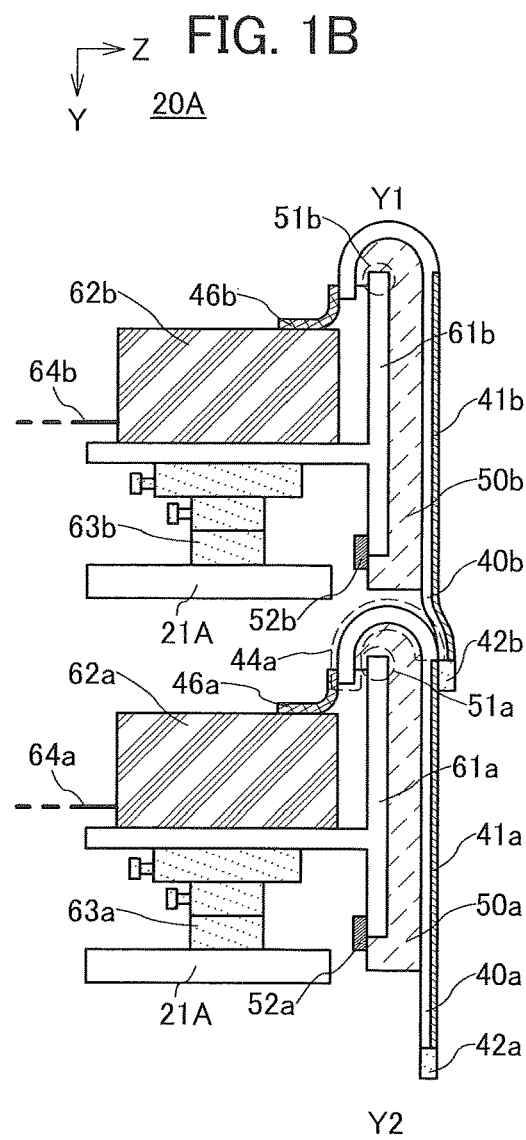
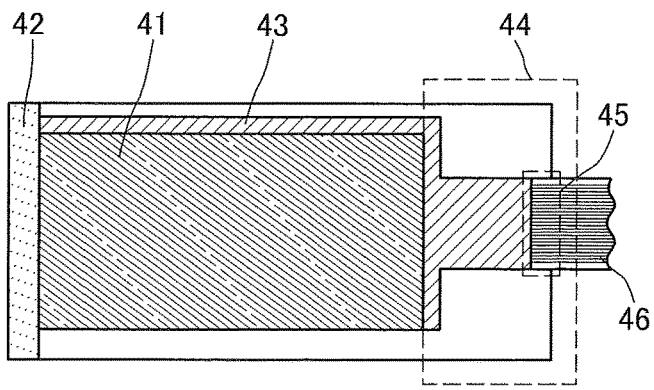

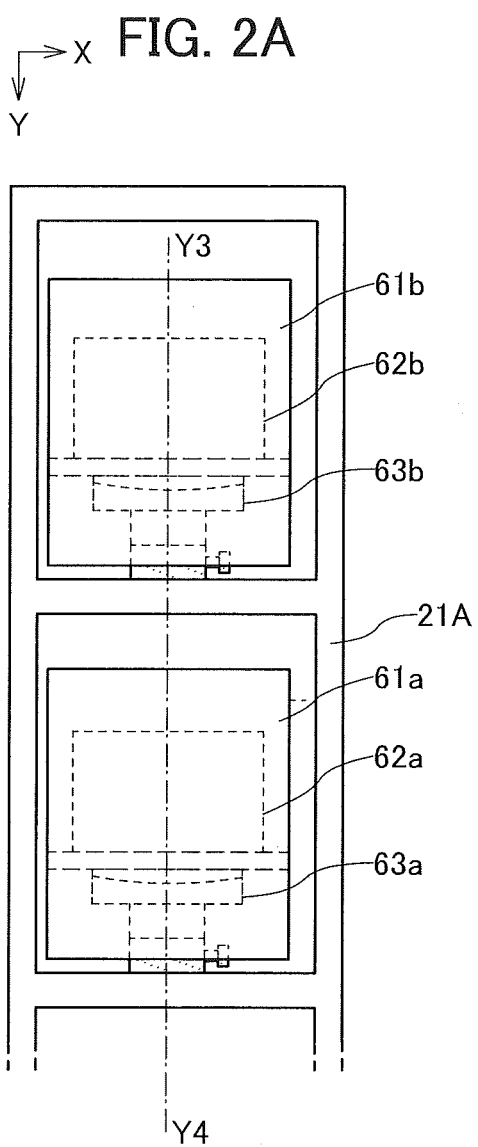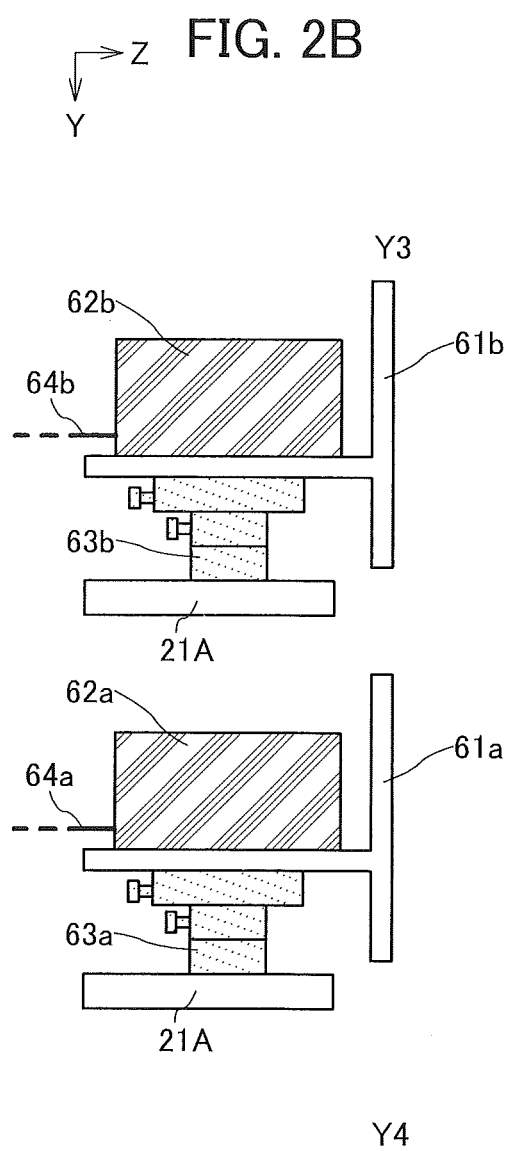

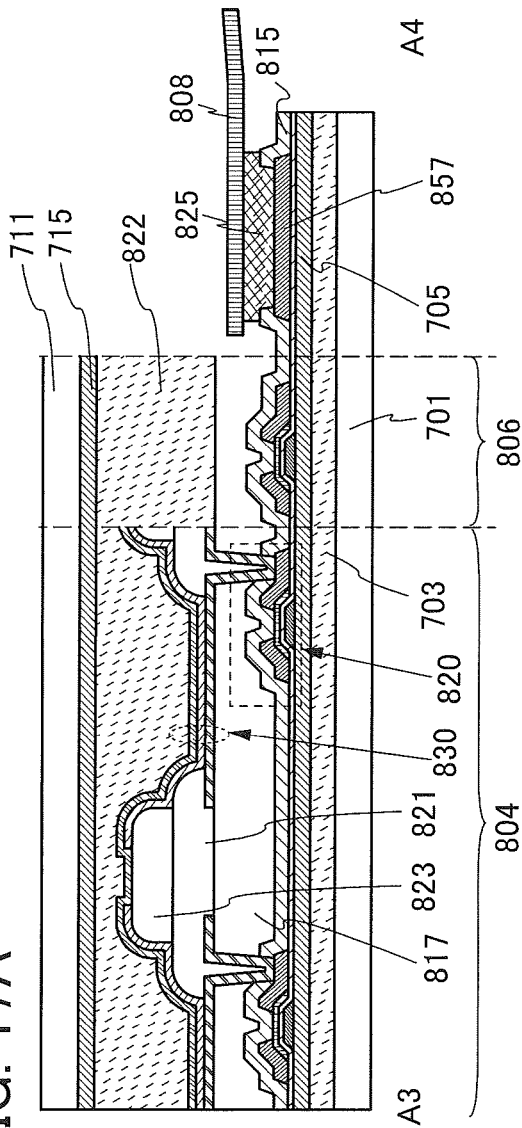

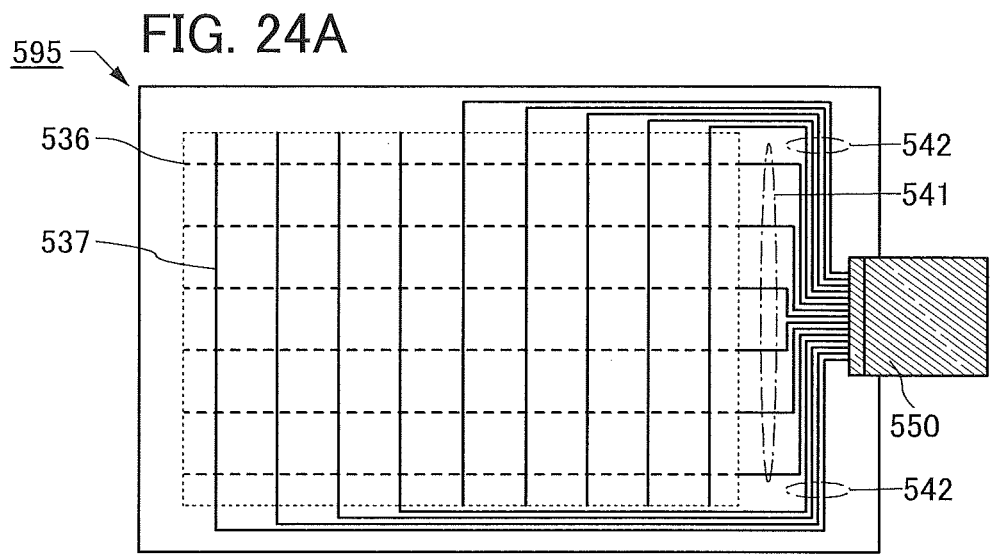
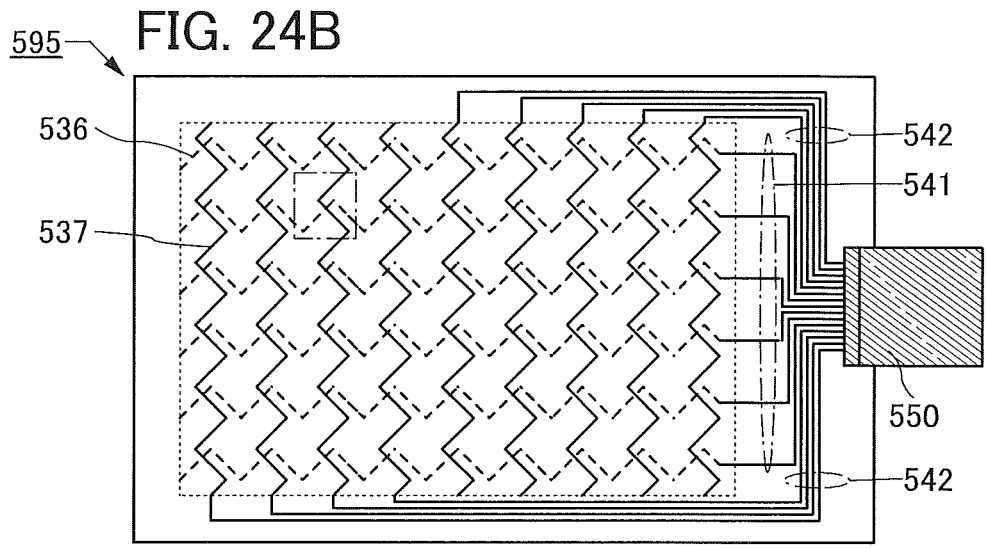
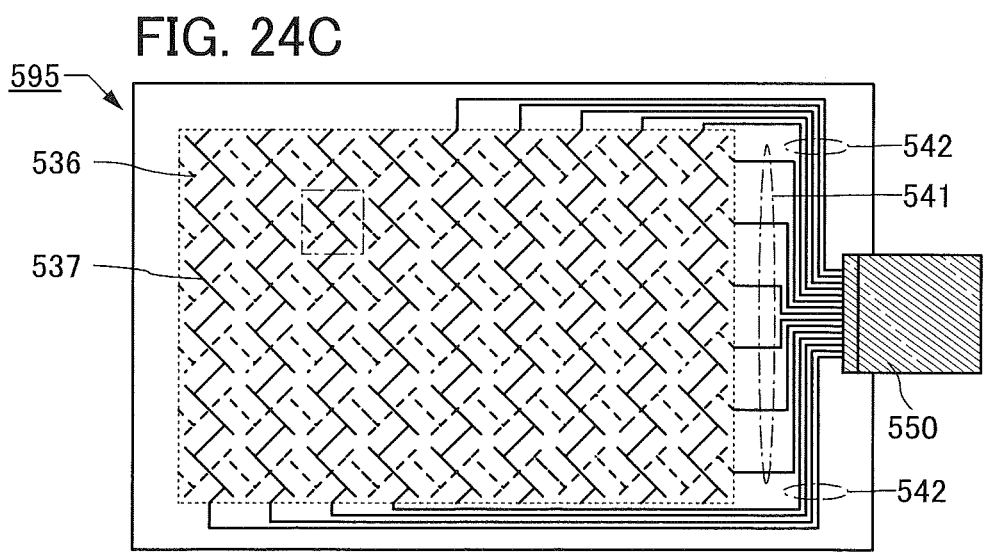

80

DISPLAY DEVICE COMPRISING PLURAL PANELS

TECHNICAL FIELD

One embodiment of the present invention relates to a display device.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a light-emitting device, a lighting device, a power storage device, an input device, a method for driving any of them, and a method for manufacturing any of them.

BACKGROUND ART

In recent years, larger display devices have been required. For example, a television device for home use (also referred to as a TV or a television receiver), digital signage, and a public information display (PID) are given. Larger digital signage, PID, and the like can provide the increased amount of information, and attract more attention when used for advertisement or the like, so that the effectiveness of the advertisement is expected to be increased.

Examples of the display device include, typically, a light-emitting device including a light-emitting element such as an organic electroluminescent (EL) element or a light-emitting diode (LED), a liquid crystal display device, and an electronic paper performing display by an electrophoretic method or the like.

For example, in a basic structure of an organic EL element, a layer containing a light-emitting organic compound is provided between a pair of electrodes. By voltage application to this element, the light-emitting organic compound can emit light. A display device including such an organic EL element needs no backlight which is necessary for liquid crystal display devices and the like; therefore, thin, lightweight, high contrast, and low power consumption display devices can be obtained. For example, Patent Document 1 discloses an example of a display device including an organic EL element.

Furthermore, Patent Document 2 discloses a flexible active matrix light-emitting device in which an organic EL element and a transistor serving as a switching element are provided over a film substrate.

REFERENCES

Patent Documents

[Patent Document 1] Japanese Published Patent Application No. 2002-324673

[Patent Document 2] Japanese Published Patent Application No. 2003-174153

DISCLOSURE OF INVENTION

An object of one embodiment of the present invention is to provide a display device that is suitable for increasing in size. Another object of one embodiment of the present invention is to provide a display device in which display unevenness is suppressed. Another object of one embodiment of the present invention is to provide a display device capable of uniform display in a display surface. Another object of one embodiment of the present invention is to provide a display device capable of display in which a joint portion in a display surface is hardly seen.

Another object is to provide a novel display device.

Note that the descriptions of these objects do not disturb the existence of other objects. In one embodiment of the present invention, there is no need to achieve all the objects. Objects other than the above objects will be apparent from and can be derived from the description of the specification and the like.

One embodiment of the present invention is a display device including two display panels, two plates, two stages, two driver circuits, two adjusting units, and a frame. The frame includes a plurality of pillars, a plurality of beams, and a plurality of bottom plates. The adjusting units have a function of adjusting positions and angles of the stages and are fixed to the frame. The driver circuits have a function of outputting signals for driving the display panels. The stages are fixed to the adjusting units and include regions provided with the driver circuits and the plates. The plates include first surfaces provided with mechanisms for connection to the stages and include convexly curved surfaces. Each display panel includes a display portion, an operating circuit portion, a terminal, an external electrode, a transparent portion, and a first portion and has flexibility. The display portion has a function of displaying an image. The operating circuit portion includes a circuit having a function of outputting a signal to the display portion and a wiring capable of electrically connecting the circuit to the terminal. The operating circuit is located in a region adjacent to the display portion. The terminal is electrically connected to the external electrode. The external electrode has a function of transmitting the signal output from the driver circuit to the operating circuit portion. The transparent portion includes a region transmitting visible light and is located in a region not overlapping with the operating circuit portion and adjacent to one side of the display portion. In each display panel, the first portion includes a region between the terminal and the display portion. Surfaces opposite to image display surfaces of the display panels are fixed to second surfaces opposite to the first surfaces of the plates so that the transparent portions and parts of the display portions extend beyond the plates. The first portions are provided along the convexly curved surfaces. The display portion of one of the two display panels overlaps with the transparent portion of the other display panel.

The display device further including a video signal divider and a video output unit is also one embodiment of the present invention. The video output unit has a function of outputting a video signal or an image signal to the video signal divider. The video signal divider has a function of dividing the video signal or the image signal into a plurality of signals and outputting the signals to the driver circuits.

The display device in which, in each display panel, the transparent portion is located in a region not overlapping with the operating circuit portion and adjacent to two sides of the display portion, and the first portion of one of the two display panels overlaps with the first portion of the other display panel is also one embodiment of the present invention.

In the display device, the driver circuits preferably have a function of adjusting color tone, luminance, or the like of images or video that is to be displayed on the display panels.

The display device in which the display portions each include a plurality of pixels, the pixels each include a light-emitting element and a transistor, and each light-emitting element includes a lower electrode, an upper electrode, and an EL layer between the lower electrode and the upper electrode is also one embodiment of the present invention.

The display device in which the display portions each include an auxiliary electrode and the auxiliary electrode is in contact with the upper electrode in a region between adjacent lower electrodes is also one embodiment of the present invention.

One embodiment of the present invention can provide a display device that is suitable for increasing in size. One embodiment of the present invention can provide a display device in which display unevenness is suppressed. One embodiment of the present invention can provide a display device capable of uniform display in a display surface. One embodiment of the present invention can provide a display device capable of display in which a joint portion in a display surface is hardly seen.

One embodiment of the present invention can provide a novel display device. Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF DRAWINGS

In the accompanying drawings:

FIGS. 1A to 1C illustrate a display device according to one embodiment;

FIGS. 2A and 2B illustrate a display device according to one embodiment;

FIGS. 11A, 11B, 11C, 11D1, and 11D2 illustrate display panels according to one embodiment;

FIGS. 17A and 17B illustrate display panels according to one embodiment;

FIGS. 24A to 24C illustrate touch panels according to one embodiment;

BEST MODE FOR CARRYING OUT THE INVENTION

Figure 3A:
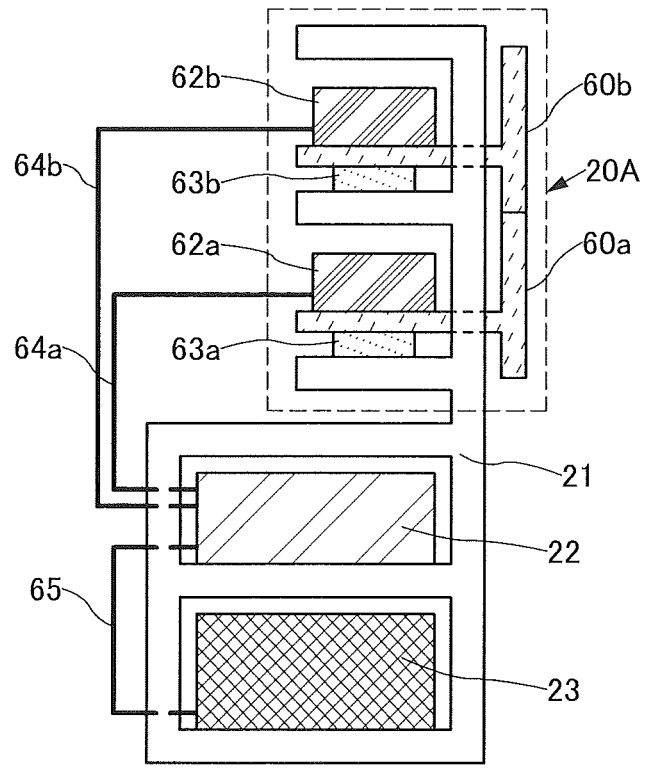
FIGS. 3A and 3B each illustrate a display device according to one embodiment.

Embodiments will be described in detail with reference to drawings. Note that the present invention is not limited to the description below, and it is easily understood by those skilled in the art that various changes and modifications can be made without departing from the spirit and scope of the present invention. Accordingly, the present invention should not be interpreted as being limited to the content of the embodiments below.

Note that in the structures of the invention described below, the same portions or portions having similar functions are denoted by the same reference numerals in different drawings, and description of such portions is not repeated. Further, the same hatching pattern is applied to portions having similar functions, and the portions are not especially denoted by reference numerals in some cases.

Note that in each drawing described in this specification, the size, the layer thickness, or the region of each component is exaggerated for clarity in some cases. Therefore, embodiments of the present invention are not limited to such a scale.

Note that in this specification and the like, ordinal numbers such as "first", "second", and the like are used in order to avoid confusion among components and do not limit the number.

Note that in this specification, the description "A has a shape such that an end portion extends beyond an end portion of B" may indicate, for example, the case where at least one of end portions of A is positioned on an outer side than at least one of end portions of B in a top view or a cross-sectional view.

Note that the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

Embodiment 1

In this embodiment, structure examples of a display device of one embodiment of the present invention are described with reference to drawings.

In each of two display panels included in the display device of one embodiment of the present invention, a transparent portion is provided adjacent to one side of a display portion. The display portion has a function of displaying an image, and the transparent portion transmits light emitted from the display portion. The two display panels are arranged to overlap with each other, and the transparent portion of one of the display panels and the display portion of the other display panel are arranged to overlap with each other. Thus, the display device can perform large-area display in which the joint portion of the display portions is hardly seen.

Each component of the display device will be described in detail below.

FIG. 1A is a front view of a display device 20A. FIG. 1B is a cross-sectional view of the display device 20A along the dashed-dotted line Y1-Y2 in FIG. 1A.

The display device 20A includes two display panels 40, two plates 50, two stages 61, two driver circuits 62, two adjusting units 63, and a frame 21A.

Note that one of two components in the display device 20A is denoted by a reference numeral with the letter "a", and the other is denoted by a reference numeral with the letter "b". Note that in describing common parts of the two components, the two components are denoted by reference numerals without the letters "a" and "b" in some cases. The same can apply to two components included in a display device 10 and a display device 20B which will be described later.

FIGS. 2A and 2B show the display device 20A from which the plates 50 and the display panels 40 are removed. FIG. 2A is a front view of the display device 20A. FIG. 2B is a cross-sectional view of the display device 20A along the dashed-dotted line Y3-Y4 in FIG. 2A. Components of the display device 20A which are not shown in FIG. 1A and their reference numerals are shown in FIG. 2A.

In the display device 20A, the display panel 40 is attached to the plate 50 with a part of the display panel 40 bent (see FIG. 1B). FIG. 1C is a top view of the display panel 40 placed alone on a flat surface.

In the display device 20A, a display portion 41a of the display panel 40a and a display portion 41b of the display panel 40b are arranged seamlessly. Thus, a display portion 11A can be used as one display region displaying an image or video. The display portion 11A is a region surrounded by a thick dashed line in FIG. 1A.

The frame 21A includes a plurality of pillars and a plurality of beams. The frame 21A can be provided with the two adjusting units 63. In this embodiment, the adjusting units 63 are fixed to the beams of the frame 21A (see FIG. 2A).

The frame 21A can be formed of a metal material which is processed easily and not deformed easily. Examples of the metal material include aluminum; copper; manganese; magnesium; an alloy of aluminum, copper, manganese, or magnesium (an aluminum alloy); iron; chromium; nickel; and an alloy of iron, chromium, or nickel (stainless steel).

The adjusting unit 63 has a function of adjusting the position and the angle of the stage 61 fixed onto the adjusting unit 63. Specifically, the adjusting unit 63 allows the display panel 40 connected to the stage 61 to move in an X-axis direction and/or a Y-axis direction or to rotate around a Z-axis.

The adjusting unit 63 can adjust the positions of the two display panels 40 so that the display portions 41a and 41b of the display panels 40 become parallel and have no space therebetween.

As the adjusting unit 63, a one-axis stage (also referred to as an X-axis stage) for adjusting the position in the X-axis direction, a one-axis stage (also referred to as a Y-axis stage) for adjusting the position in the Y-axis direction, and a tilt stage (also referred to as a goniometer stage) for adjusting the position in a direction of rotation around the Z-axis in FIG. 1B can be used in combination. Alternatively, a two-axis stage for adjusting the position in the X-axis direction and the Y-axis direction and the tilt stage may be used in combination. In this embodiment, the adjusting unit 63 includes the X-axis stage, the Y-axis stage, and the goniometer stage in the order from the side fixed to the frame 21A (see FIGS. 2A and 2B).

The driver circuit 62 has a function of converting an image signal or a video signal input to the driver circuit 62 to a signal for driving the display panel 40 and of outputting the converted signal to the display panel 40. Furthermore, the driver circuit 62 has a function of supplying a power supply voltage required for light emission of the display panel 40.

The driver circuit 62 preferably has a function of adjusting color tone, luminance, or the like in display of the display panel 40, in which case variation can be corrected when the variation in display performance between the display panel 40a and the display panel 40b occurs.

The driver circuit 62 may have a function of generating an image signal or a video signal. A cable 64 may be connected to the driver circuit 62. For example, a signal can be input to the driver circuit 62 from an external video output device through the cable 64 (see FIG. 2B).

FIG. 3A is a side view illustrating the display device 10 of one embodiment of the present invention. The display device 10 includes the display device 20A, a video signal divider 22, and a video output unit 23. In the display device 10, for example, a frame 21 includes the frame 21A and a plurality of bottom plates over which the video signal divider 22 and the video output unit 23 are provided. The frame 21 can be formed of a metal material similar to that of the frame 21A.

In the display device 10, the driver circuit 62a and the driver circuit 62b are electrically connected to the video signal divider 22 through the cable 64a and the cable 64b, respectively. The video signal divider 22 is electrically connected to the video output unit 23 through a cable 65. Note that the display panel 40, the plate 50, and the stage 61 are collectively referred to as a component group 60 (60a or 60b) in FIG. 3A.

The video output unit 23 has a function of outputting, to the video signal divider 22, a signal for an image or video that is to be displayed on the display panels 40a and 40b. As the video output unit 23, a recording/reproducing device such as a Blu-ray Disc recorder or a digital versatile disc (DVD) recorder can be used.

In the case where a plurality of display panels is arranged in a tile pattern to form the display device, an uncompressed disk recorder (UDR) capable of outputting an image with high resolution, e.g., 4K (3840×2160 pixels) or 8K (7680×4320 pixels), without compression can be favorably used as the video output unit 23. The number of display panels arranged in a tile pattern is, for example, nine (3×3) or thirty-six (6×6).

The video signal divider 22 has a function of dividing an input signal for an image or video and outputting the divided signals to a plurality of driver circuits or display devices.

For example, in the case where an image signal for certain display resolution is divided into nine and the divided signals are output to nine display devices by the video signal divider 22, an image displayed using an image signal output to and received by each display device provides a pixel aspect equal to an original image and ⅑ display resolution. Then, display regions of the nine display devices are arranged to correspond to the order in which the original image signal is divided. Thus, an image can be displayed with the display resolution of the original image. Note that here, the term "pixel aspect" refers to the ratio between the display resolution of an image in the longitudinal direction and the display resolution of the image in the horizontal direction. The term "display resolution" refers to the total number of pixels forming a display portion of a display device or the total number of pixels forming an image.

In this embodiment, the image signal or the video signal input to the video signal divider 22 is divided into two and the divided signals are output to the two driver circuits 62.

Referring again to the display device 20A, the stage 61 has a region where the driver circuit 62 can be provided and a region where the plate 50 can be provided (see FIG. 1B). Since the stage 61 has the region where the driver circuit 62 can be provided, the replacement of a component due to the specification change of the driver circuit 62 or maintenance can be performed easily, for example.

Note that the driver circuit 62 may be reduced in volume so as to be attached to the surface of the stage 61 opposite to the region where the plate 50 can be provided. This can reduce the region of the stage 61 where the driver circuit 62 is provided and accordingly can reduce the depth of the display device 20A (the length in the Z-axis direction in FIG. 1B).

The stage 61 can be formed of a metal material similar to that of the frame 21A.

The plate 50 includes a first surface provided with a mechanism for connection to the stage 61 and a side surface provided with a convexly curved surface (see FIG. 1B). The plate 50 includes a region where the display panel 40 is provided on a surface (hereinafter referred to as a second surface) opposite to the first surface. In this embodiment, the mechanism includes a depression 51 to which a part of the stage 61 can be fit and a fastening 52 capable of sliding in the Y-axis direction. However, the mechanism is not limited thereto. Note that not the plate 50, but the stage 61 may include a mechanism for setting the plate 50 to the stage 61.

The plate 50 needs to be connected precisely to the stage 61 to accurately adjust the relative positions of the display portion 41a and the display portion 41b using the adjusting unit 63. The alignment of the plate 50 and the stage 61 in the Y-axis direction can be achieved using the depression 51 and the fastening 52. The alignment of the plate 50 and the stage 61 in the X-axis direction can be achieved using guides 53 to be described later.

The plate 50 can be formed of a metal material similar to that of the frame 21A.

The display panel 40 is provided with the display portion 41, a transparent portion 42, an operating circuit portion 43, a terminal 45, and an external electrode 46 (see FIG. 1C). The display panel 40 has flexibility.

The terminal 45 is electrically connected to a wiring in the operating circuit portion 43 and the external electrode 46. The external electrode 46 is electrically connected to the driver circuit 62, and a signal is output from the driver circuit 62 to the display panel 40 through the external electrode 46 (see FIG. 1B). In this embodiment, a flexible printed circuit (FPC) is used as an example of the external electrode 46.

The display portion 41 has a function of displaying an image. The display portion 41 may include a light-emitting element such as an organic EL element.

The operating circuit portion 43 has a function of outputting a signal to the display portion 41. The operating circuit portion 43 includes a scan line driver circuit, a signal line driver circuit, and the like. Wirings for connecting the external electrode 46 to the scan line driver circuit and the signal line driver circuit are also included in the operating circuit portion 43.

In the display panel 40, the operating circuit portion 43 is provided in a position adjacent to the display portion 41. In the structure shown in FIG. 1C, the operating circuit portion 43 is adjacent to two sides of the display portion 41. The operating circuit portion 43 may be adjacent to one side of the display portion 41. The operating circuit portion 43 may be a region which does not transmit visible light or a region which transmits visible light, depending on the structure of the scan line driver circuit or the like.

The transparent portion 42 includes a region which transmits visible light. A region where the transparent portion 42 is located is adjacent to the display portion 41 and does not overlap with the operating circuit portion 43.

In the example shown in FIG. 1C, the transparent portion 42 is adjacent to a bottom side of the display portion 41 (a side opposite to the side near the terminal 45); however, the position of the transparent portion 42 is not limited thereto. For example, the transparent portion 42 may be adjacent to a right side of the display portion 41 (a side opposite to a longer side of the display portion 41 which is adjacent to the operating circuit portion 43).

The transparent portion 42 may be adjacent to two sides of the display portion 41 (e.g., the bottom side and the right side). The transparent portion 42 adjacent to two sides of the display portion 41 is preferable because the display panels 40 can be seamlessly arranged in a tile pattern. Furthermore, when there is no space between the display portion 41 and the transparent portion 42, large-area display can be performed in which a joint portion of the display panels 40 arranged in a tile pattern is hardly seen.

It is preferable that the transparent portion 42 have high transmittance, because the boundary between a region behind the transparent portion 42 and the other region is hardly seen in performing display on the display portion 41. Furthermore, it is preferable that the refractive index of a material of the transparent portion 42 be close to 1 because the reflection of external light can be suppressed.

The width of the transparent portion 42 (the length of the transparent portion 42 in the Y-axis direction in FIG. 1B) is equal to the distance between an end portion of the display panel 40 and a side of the display portion 41 which is adjacent to the transparent portion 42 (see FIG. 1C). The transparent portion 42 may include a sealing layer having a function of suppressing the entry of an impurity such as water into the light-emitting element of the display portion 41. That is, the width of the transparent portion 42 can be set depending on the sealing performance of the sealing layer and/or reliability required for the light-emitting element.

A specific structure of the display panel will be described in detail in Embodiment 2.

FIG. 1B shows a structure in which the two display panels 40 are arranged in the Y-axis direction so that the display portion 41a and the display portion 41b are arranged seamlessly.

Note that in the two display panels shown in FIGS. 1A and 1B, the display panel located on the rear side (the display panel whose front surface is overlapped by the transparent portion 42 of the other display panel) is denoted by 40a, and the display panel located on the front side is denoted by 40b. Note that the positional relation and the connection relation between the display panel 40a and the plate 50a are equal to the positional relation and the connection relation between the display panel 40b and the plate 50b.

In FIG. 1B, the display panel 40 has a surface where display on the display portion 41 can be seen and a surface opposite thereto (hereinafter the latter surface is referred to as a display rear surface), and the display rear surface is in contact with the second surface and the convexly curved surface of the plate 50.

The display rear surface and the second surface may adhere to each other or be fixed to each other to be attachable to and detachable from each other. In the case where the display rear surface and the second surface are attachable to and detachable from each other, the display panel 40 can be replaced easily.

For example, a film having an adsorbing property (hereinafter referred to as an adsorptive film) can be used to make the display rear surface and the second surface attachable to and detachable from each other. Air between an object and the adsorptive film is removed to produce a low-pressure or vacuum state therebetween, so that the adsorptive film can be attached to the object. Alternatively, an adhesive film may be used to make the display rear surface and the second surface attachable to and detachable from each other.

In the case of using the adsorptive film or the adhesive film to fix the display rear surface and the second surface to each other, the film is attached to the second surface first. The film may be attached to either the whole area of the second surface or a part thereof. In the latter case, the film is preferably attached to at least a region of the second surface in the vicinity of the convexly curved surface. This can prevent the display panel 40 in the vicinity of an upper portion of the display portion 41 from being apart from the second surface in the case where a first portion 44 of the display panel 40 is bent along the convexly curved surface.

In the display panel 40, a region between the terminal 45 and the display portion 41 is the first portion 44 (see FIG. 1C). The first portion 44 is preferably provided along the convexly curved surface of the plate 50 as shown in FIG. 1B.

Furthermore, it is preferable that the first portion 44 and the convexly curved surface not be fixed to each other. Such a structure can enlarge the movable area of the external electrode 46 and increase the degree of flexibility in connection between the external electrode 46 and the driver circuit 62. In addition, two display panels 80 can be arranged easily in the X-axis direction as described later.

Figure 3B:
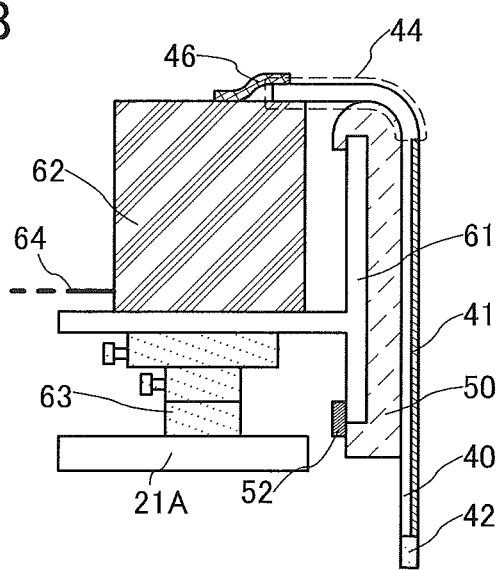

Note that the first portion 44 of the display panel 40 is not necessarily provided along the whole area of the convexly curved surface of the plate 50 and may be provided along a part of the convexly curved surface as shown in FIG. 3B. Such a structure can increase the curvature radius of the first portion 44 and reduce physical stress applied to the display panel 40 accordingly.

As shown in FIG. 1B, the display panel 40b is fixed to the plate 50b so that the transparent portion 42b and a part of the display portion 41b extend beyond the plate 50b. The part of the display portion 41b extending beyond the plate 50b allows the display portion 41b to be placed on the display panel 40a without contact between the plate 50b and the first portion 44a.

For example, the length in the Y-axis direction of the part of the display portion 41b extended beyond the plate 50b can be determined by making the top side of the display portion 41a align with the bottom side of the display portion 41b in the Z-axis direction.

It is preferable that, in a portion where the transparent portion 42b and the display portion 41a are in contact with each other, air and the like not be present between the transparent portion 42b and the display portion 41a. Furthermore, it is preferable that the transparent portion 42b and the display portion 41a be attachable to and detachable from each other.

The above-described adsorptive film can be used to make the transparent portion 42b and the display portion 41a attachable to and detachable from each other. In the case of using the adsorptive film, it is preferable that the difference between the refractive index of the material of the transparent portion 42b and the refractive index of a material of the adsorptive film be small. This can suppress the reflection of external light at the interface between the transparent portion 42b and the adsorptive film and increase visibility of display on the display portion 41a in a region overlapping with the transparent portion 42b.

Since the display panels 40 have flexibility, the plates 50a and 50b can be arranged so that the second surfaces thereof form one plane and a part of the display panel 40b extending beyond the plate 50b can be bent and placed on the surface of the display panel 40a.

By arranging the plates 50a and 50b so that the second surfaces thereof form one plane, a display surface of the display portion 11A can be made approximately flat without steps.

The process for setting the display panels 40a and 40b to form the display device 20A is described below with reference to FIGS. 1A and 1B and FIGS. 2A and 2B.

Note that the adjusting units 63a and 63b and the stages 61a and 61b are provided for the frame 21A in advance. First, the driver circuits 62a and 62b are set onto the stages 61a and 61b, respectively (see FIGS. 2A and 2B).

Then, the plate 50a is made to adhere to the display panel 40a or fixed to the display panel 40a so as to be attachable thereto and detachable therefrom. Specifically, the display rear surface of the display panel 40a and the second surface of the plate 50a are disposed in close contact with each other with the adsorptive film or the film having an adhesion property. At this time, it is preferable that the first portion 44a and the convexly curved surface of the plate 50a not be fixed to each other.

The plate 50a is provided for the stage 61a. Specifically, a part of the stage 61a is fit into the depression 51a, and the first surface of the plate 50a is made to overlap with a side surface of the stage 61a so as to be in contact with each other. After that, the fastening 52a is slid up to fix the plate 50a to the stage 61a. Then, the external electrode 46a and the driver circuit 62a are connected to each other.

Next, the display panel 40b is fixed to the plate 50b in a manner similar to the above-described manner in which the display panel 40a is fixed to the plate 50a.

The plate 50b is provided for the stage 61b. The plate 50b can be provided for the stage 61b in a manner similar to the above-described manner in which the plate 50a is provided for the stage 61a. Note that the plate 50b is provided such that the part of the display panel 40b extended beyond the plate 50b is located on the front surface of the display panel 40a. Then, the external electrode 46b and the driver circuit 62b are connected to each other.

Note that when the plate 50b is provided for the stage 61b, the stage 61a may be moved in the Y-axis direction using the adjusting unit 63a so that the plate 50b does not contact the first portion 44a in contact with the convexly curved surface of the plate 50a. Alternatively, the stage 61b may be moved in the Y-axis direction using the adjusting unit 63b.

Then, the position or the angle of the display portion 41a is adjusted using the adjusting unit 63a and/or the position or the angle of the display portion 41b is adjusted using the adjusting unit 63b so that the joint portion of the display portions 41a and 41b is hardly seen when the display portion 11A is seen in the Z-axis direction.

In one method for relative alignment of the display portions 41a and 41b, for example, an image is displayed on the display portion 11A as one display area, and then, a discontinuous portion of the image at or in the vicinity of the boundary between the display portions 41a and 41b is made as small as possible using the adjusting unit 63a and/or the adjusting unit 63b. As the image to be displayed on the display portion 11A at this time, for example, an image having a stripe-like scale crossing the discontinuous portion is used, in which case the relative alignment of the display portions 41a and 41b can be easily performed.

Finally, the transparent portion 42b and the display portion 41a are fixed to each other so as to be attachable to and detachable from each other while air is prevented from being present therebetween (see FIGS. 1A and 1B). For example, the adsorptive film can be used to fix them so as to be attachable to and detachable from each other.

Through the above-described process, the display panels 40a and 40b can be set in the display device 10.

Modification Example 1

In this embodiment described so far, the structure of the display device 20A in which the two display panels are adjacent to each other in the Y-axis direction is described. In Modification Example 1, a structure of a display device 20B in which two display panels are adjacent to each other in the X-axis direction will be described.

Note that only differences between the display device 20B and the display device 20A shown in FIGS. 1A and 1B will be described below.

Figure 4A:
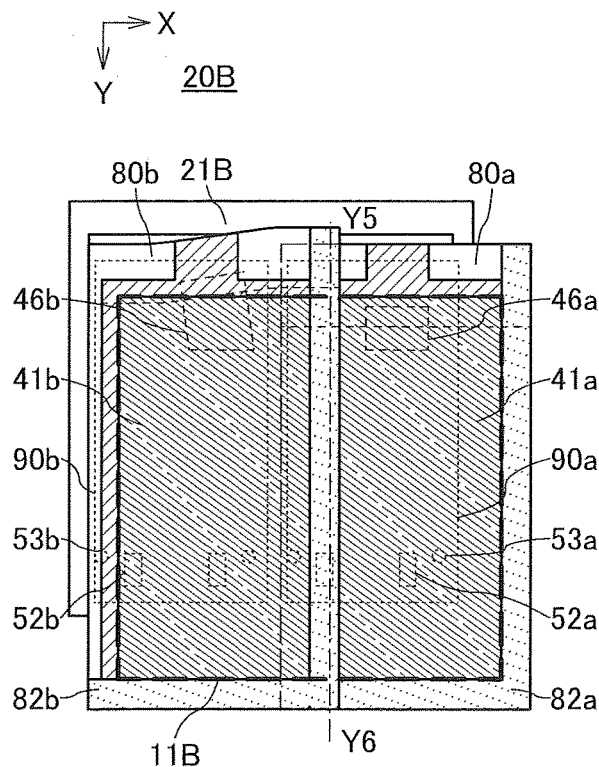
FIGS. 4A to 4D illustrate a display device according to one embodiment.
Figure 4B:
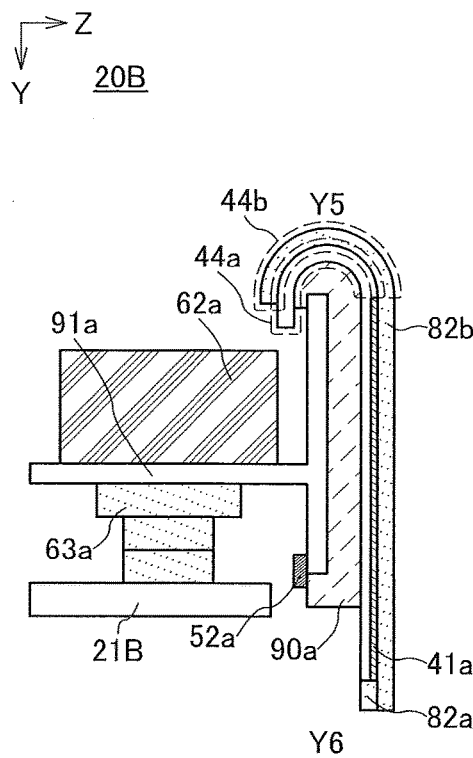

FIG. 4A is a front view of the display device 20B in which two display panels 80a and 80b are arranged in the X-axis direction. FIG. 4B is a cross-sectional view of the display device 20B along the dashed-dotted line Y5-Y6 in FIG. 4A. Note that in the two display panels shown in FIGS. 4A and 4B, the display panel located on the rear side is denoted by 80a, and the display panel located on the front side is denoted by 80b.

Figure 4C:
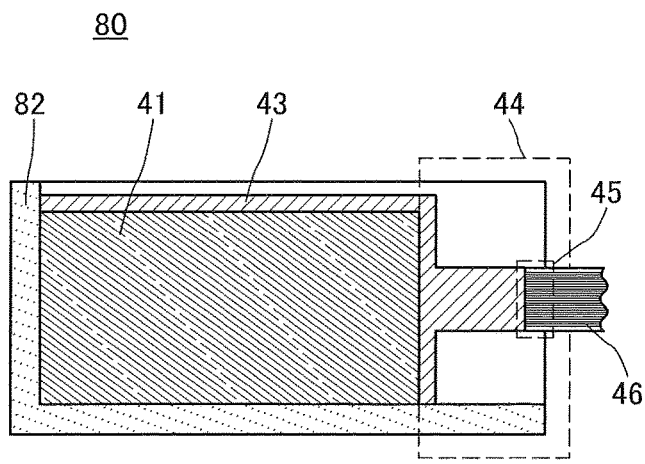

In the display device 20B, the display panel 80 is attached to the plate 90 with a part of the display panel 80 bent (see FIG. 4B). FIG. 4C is a top view of the display panel 80 placed alone on a flat surface.

Figure 5A:
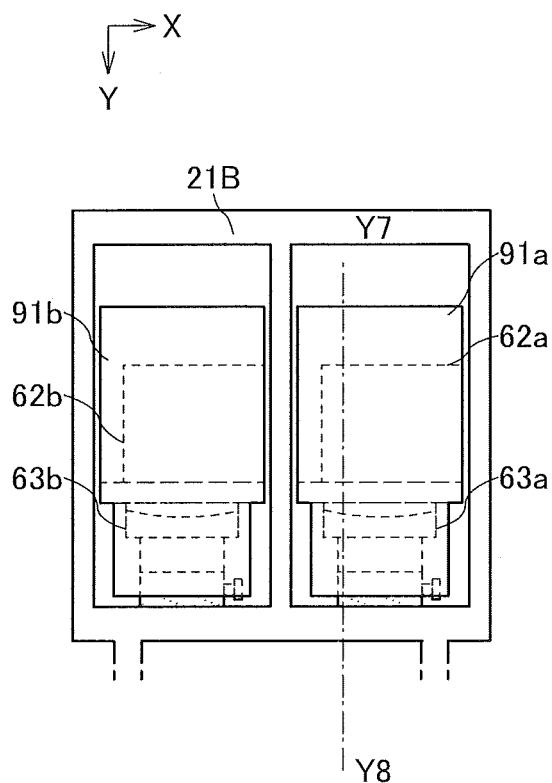
FIGS. 5A and 5B illustrate a display device according to one embodiment.
Figure 5B:
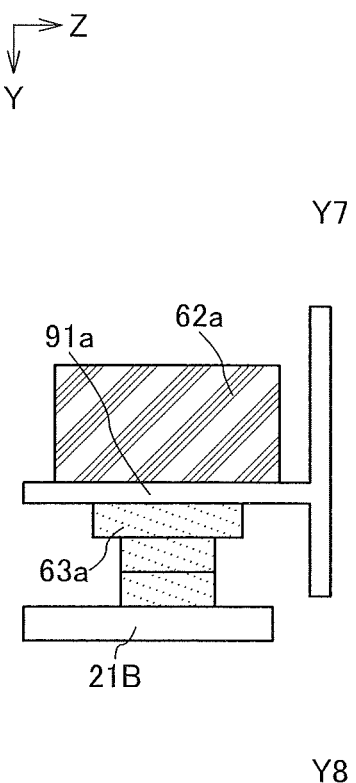

FIGS. 5A and 5B show the display device 20B from which the plates 90 and the display panels 80 are removed. FIG. 5A is a front view of the display device 20B. FIG. 5B is a cross-sectional view of the display device 20B along the dashed-dotted line Y7-Y8 in FIG. 5A. Components of the display device 20B which are not shown in FIG. 4A and their reference numerals are shown in FIG. 5A.

In the display device 20B, the display portion 41a of the display panel 80a and the display portion 41b of the display panel 80b are arranged seamlessly. Thus, a display portion 11B can be used as one display region displaying an image or video. The display portion 11B is a region surrounded by a thick dashed line in FIG. 4A.

A frame 21B differs from the frame 21A shown in FIG. 2A in that the frame 21B includes a plurality of pillars and a plurality of beams with which the two display panels 80 are arranged in the X-axis direction (see FIG. 5A).

Figure 4D:
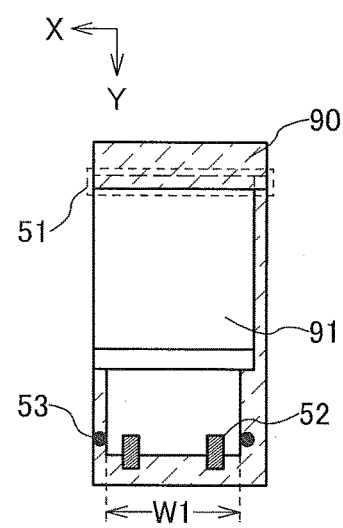

FIG. 4D is a rear view of a stage 91 and a plate 90 in a state where the plate 90 is provided for the stage 91. In the stage 91, the width (the length in the X-axis direction) of a lower portion of a region where the plate 90 is provided is smaller than the width of an upper portion of the region where the plate 90 is provided, which is different from that in the stage 61. A first surface of the plate 90 is provided with the guides 53. The distance between the two guides 53 is equal to the width of the lower portion of the stage 91 and is indicated by W1. With such a structure, the positions of the plate 90 and the stage 91 in the X-axis direction can be aligned with high precision at the time of attaching the plate 90 to the stage 91.

The frame 21B and the stage 91 can be formed of a metal material similar to that of the frame 21A. The frame 21B and the stage 91 may be formed of different materials.

The display panel 80 is provided with a transparent portion 82 in a position adjacent to the right side and the lower side of the display portion 41 (see FIG. 4C). As shown in FIG. 4A, the display portion 41a and the transparent portion 82b overlap with each other in the display device 20B. Furthermore, the first portion 44a of the display panel 80a and the first portion 44b of the display panel 80b overlap with each other. Such a structure allows a plurality of display panels 80 to be arranged in the X-axis direction and the Y-axis direction without the joint portion of the display portions 41, achieving large-area display. Note that FIGS. 1A and 1B and the description relating to FIGS. 1A and 1B in this specification can be referred to for a method of arranging the display panels 80 in the Y-axis direction.

The display panel 80b is fixed to the plate 90b so that the transparent portion 82b and a part of the display portion 41b extend beyond the plate 90b in the X-axis direction and the Y-axis direction (see FIG. 4A).

For example, the length in the X-axis direction of the part of the display portion 41b extended beyond the plate 90b can be determined by making the right side of the display portion 41b align with the left side of the display portion 41a in the Z-axis direction.

The process for setting the display panels 80a and 80b to form the display device 20B is described below with reference to FIGS. 4A to 4D and FIGS. 5A and 5B.

Note that the adjusting units 63a and 63b and stages 91a and 91b are provided for the frame 21B in advance. First, the driver circuits 62a and 62b are set onto the stages 91a and 91b, respectively (see FIGS. 5A and 5B).

Then, the plate 90a is made to adhere to the display panel 80a or fixed to the display panel 80a so as to be attachable thereto and detachable therefrom. Specifically, the display rear surface of the display panel 80a and the second surface of the plate 90a are disposed in close contact with each other with the adsorptive film or the film having an adhesion property. At this time, it is preferable that the first portion 44a and the convexly curved surface of the plate 90a not be fixed to each other.

The plate 90a is provided for the stage 91a. Specifically, a part of the stage 91a is fit into the depression 51a, and the plate 90a is moved in the X-axis direction so that a lower portion of the stage 91a is positioned between the two guides 53a. Then, the first surface of the plate 90a is made to overlap with a side surface of the stage 91a so that they are in contact with each other. After that, the fastening 52a is pulled up to fix the plate 90a to the stage 91a. Then, the external electrode 46a and the driver circuit 62a are connected to each other.

Next, the display panel 80b is fixed to the plate 90b in a manner similar to the above-described manner in which the display panel 80a is fixed to the plate 90a. Note that a convexly curved surface of the plate 90b and the first portion 44b are not fixed to each other.

The plate 90b is provided for the stage 91b. The plate 90b can be provided for the stage 91b in a manner similar to the above-described manner in which the plate 90a is provided for the stage 91a. Note that the plate 90b is provided such that the part of the display panel 80b extended beyond the plate 90b is located on the front surface of the display panel 80a.

Note that when the plate 90b is attached to the stage 91b, the stage 91a may be moved in the X-axis direction using the adjusting unit 63a so that the plate 90b does not contact the display panel 80a. Alternatively, the stage 91b may be moved in the X-axis direction using the adjusting unit 63b.

Then, the position or the angle of the display portion 41a is adjusted using the adjusting unit 63a or the position or the angle of the display portion 41b is adjusted using the adjusting unit 63b so that the joint portion of the display portions 41a and 41b is hardly seen when the display portion 11B is seen in the Z-axis direction.

Finally, the transparent portion 82b and the display portion 41a are fixed to each other so as to be attachable to and detachable from each other while air is prevented from being present therebetween (see FIGS. 4A and 4B). For example, the adsorptive film can be used to fix them so as to be attachable to and detachable from each other.

Finally, the first portion 44b is placed along the convexly curved surface of the plate 90a and the first portion 44a, and the external electrode 46b is connected to the driver circuit 62b.

Note that a curvature radius of a bent portion of the first portion 44b is longer than a curvature radius of a bent portion of the first portion 44a because the first portion 44b overlaps the first portion 44a. Therefore, the external electrode 46b required for connection between the display panel 80b and the driver circuit 62b is longer than the external electrode 46a required for connected between the display panel 80a and the driver circuit 62a (see FIG. 4A). This means that excess tension is generated in the external electrode 46b and the terminal 45b when the display panel 80b and the driver circuit 62b are connected to each other. Thus, the length of the external electrode 46b or the first portion 44b in the longitudinal direction of the display panel 80b is preferably adjusted. A connection position of the driver circuit 62b and the external electrode 46b may be adjusted.

Structure Example of Display Portion

Figure 6A:
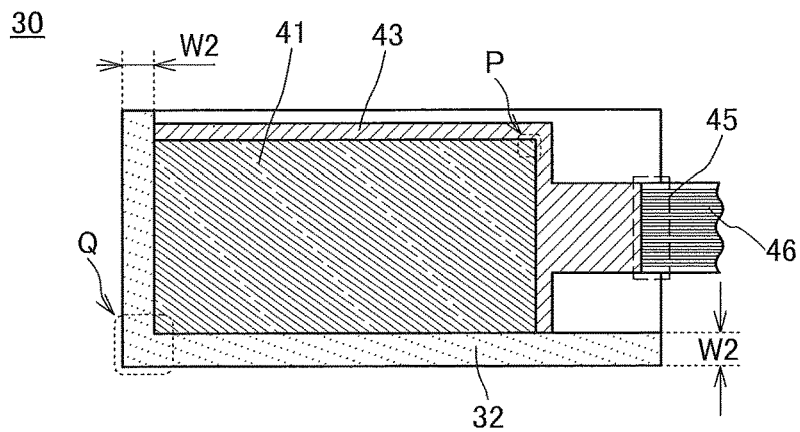
FIGS. 6A to 6D illustrate a display panel according to one embodiment.
Figure 6B:
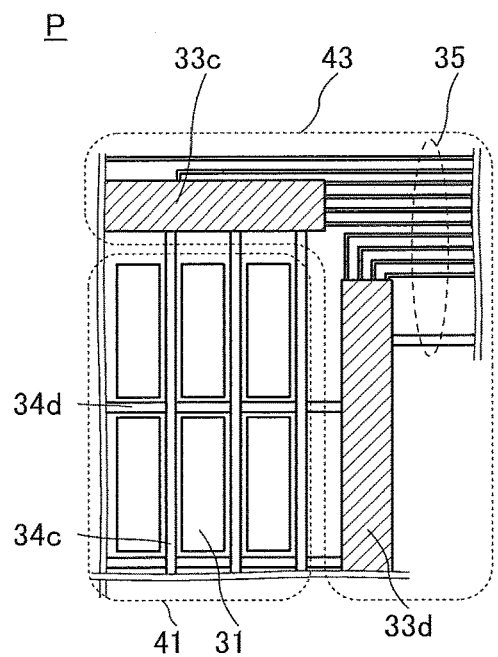

Next, a structure example of a display portion of a display panel included in a display device of one embodiment of the present invention will be described. FIG. 6A is a top view of a display panel 30 in which a transparent portion 32 is adjacent to two sides of the display portion 41. FIG. 6B is a top view in which a region P in FIG. 6A is enlarged, and FIG. 6C is a top view in which a region Q in FIG. 6A is enlarged.

Figure 6C:
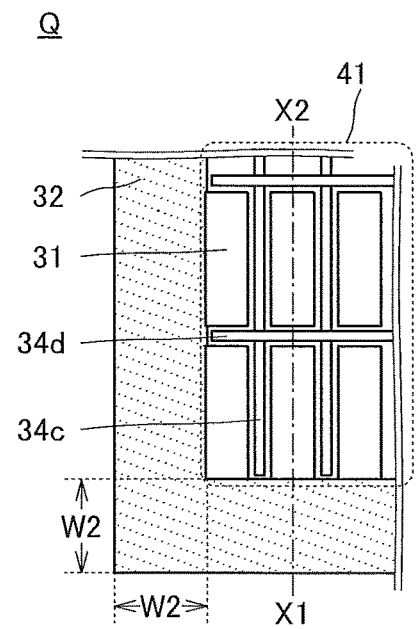

As illustrated in FIG. 6C, in the display portion 41, a plurality of pixels 31 is arranged in a matrix. In the case where the display panel 30 which is capable of full color display with three colors of red, blue, and green is formed, the pixel 31 can display any of the three colors. Alternatively, a pixel which can display white or yellow in addition to the three colors may be provided. A region including the pixels 31 corresponds to the display portion 41.

One pixel 31 is electrically connected to a wiring 34c and a wiring 34d. The plurality of wirings 34c each intersects with the wiring 34d, and is electrically connected to an operating circuit 33c. The plurality of wirings 34d is electrically connected to an operating circuit 33d. One of the operating circuits 33c and 33d can function as a scan line driver circuit, and the other can function as a signal line driver circuit. A structure without one of the operating circuits 33c and 33d or both of them may be employed.

In FIG. 6B, a plurality of wirings 35 electrically connected to the operating circuit 33c or the operating circuit 33d is provided. The wiring 35 is electrically connected to the external electrode 46 in a region not shown in the figure and has a function of supplying a signal from the outside to the operating circuits 33c and 33d.

In FIG. 6B, a region including the operating circuit 33c, the operating circuit 33d, and the plurality of wirings 35 corresponds to the operating circuit portion 43 in FIG. 6A.

In FIG. 6C, a region outside the pixel 31 provided closest to the end corresponds to the transparent portion 32. The transparent portion 32 does not include the members blocking visible light, such as the pixel 31, the wiring 34c, and the wiring 34d. Note that in the case where part of the pixel 31, the wiring 34c, or the wiring 34d transmits visible light, the part of the pixel 31, the wiring 34c, or the wiring 34d may be provided to extend to the transparent portion 32.

Here, the width W2 of the transparent portion 32 indicates the narrowest width of the transparent portion 32 provided in the display panel 30 in some cases. In the case where the width W2 of the display panel 30 varies depending on the positions, the width of the shortest portion can be referred to as the width W2. In FIG. 6C, the distance between the pixel 31 and the end surface of the substrate (that is, the width W2 of the transparent portion 32) in the vertical direction is the same as that in the horizontal direction.

Figure 6D:
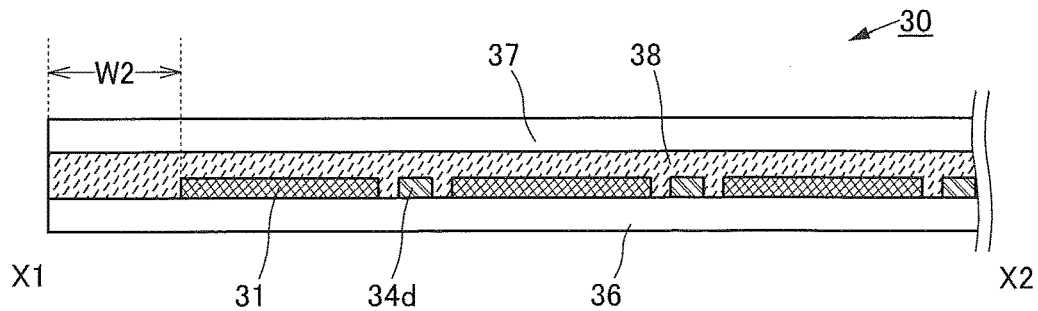

FIG. 6D is a cross-sectional view taken along the dashed-dotted line X1-X2 in FIG. 6C. The display panel 30 illustrated in FIG. 6D includes a pair of substrates (a substrate 36 and a substrate 37) each of which transmits visible light. The substrate 36 and the substrate 37 are bonded to each other with an adhesive layer 38. The pixel 31, the wiring 34d, and the like are provided for the substrate 36.

As illustrated in FIGS. 6C and 6D, in the case where the pixel 31 is positioned closest to the end of the display portion 41, the width W2 of the transparent portion 42 is the distance between the end portion of the substrate 36 or the substrate 37 and the end portion of the pixel 31.

Note that the end portion of the pixel 31 refers to the end portion of the member that is positioned closest to the end and blocks visible light in the pixel 31. Alternatively, in the case where a light-emitting element including a layer containing a light-emitting organic compound between a pair of electrodes (also referred to as an organic EL element) is used as the pixel 31, the end portion of the pixel 31 may be any of the end portion of the lower electrode, the end portion of the layer containing a light-emitting organic compound, and the end portion of the upper electrode.

Figure 7A:
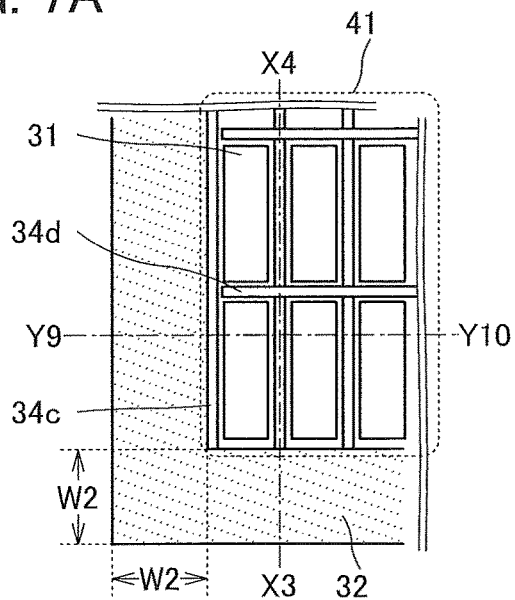
FIGS. 7A to 7C illustrate a display panel according to one embodiment.
Figure 7B:
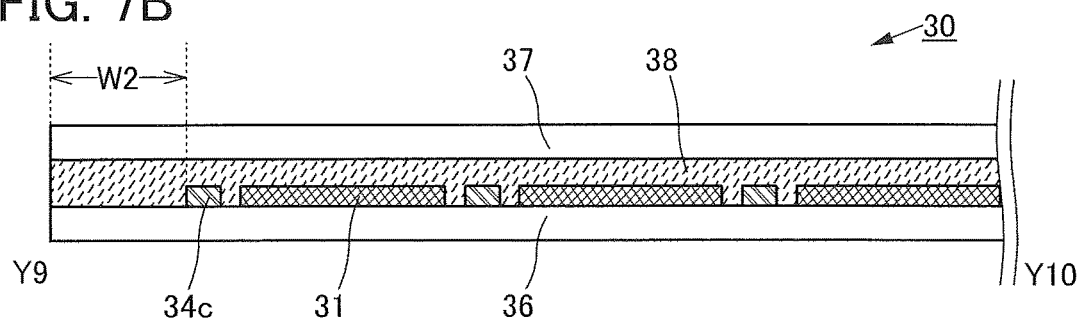

FIG. 7A shows the case where the position of the wiring 34c is different from that in FIG. 6C. FIG. 7B is a cross-sectional view taken along dashed-dotted line Y9-Y10 in FIG. 7A, and FIG. 7C is a cross-sectional view taken along dashed-dotted line X3-X4 in FIG. 7A.

Figure 7C:
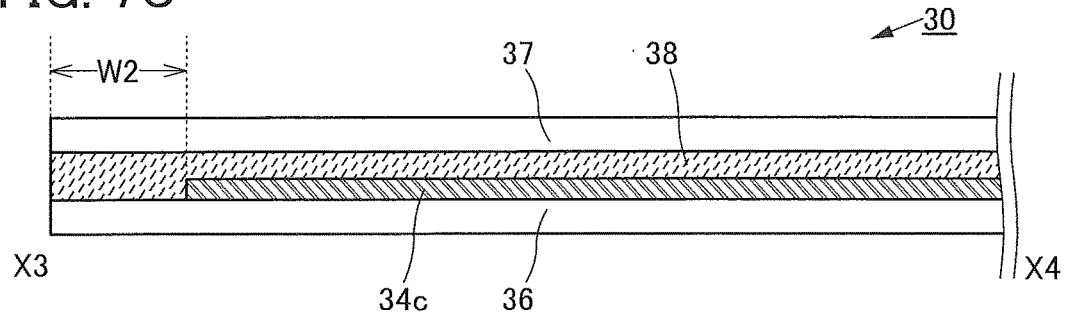

As illustrated in FIGS. 7A to 7C, in the case where the wiring 34c is positioned closest to the end of the display portion 41, the width W2 of the transparent portion 32 is the distance between the end portion of the substrate 36 or the substrate 37 and the end portion of the wiring 34c. In the case where the wiring 34c transmits visible light, the transparent portion 32 may include a region where the wiring 34c is provided.

Here, in the case where the density of pixels provided in the display portion 41 of the display panel 30 is high, misalignment may occur when the two display panels 30 are bonded.

Figure 8A:
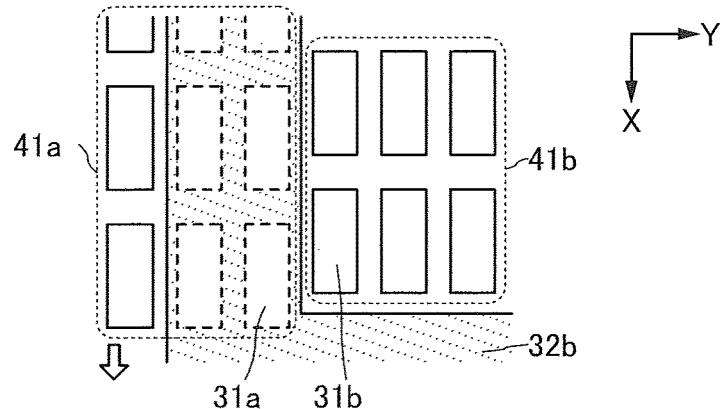
FIGS. 8A to 8C each illustrate a positional relation between display panels according to one embodiment.

FIG. 8A shows a positional relationship between the display portion 41a of the display panel 30a provided on the rear side and the display portion 41b of the display panel 30b provided on the front side, seen from the display surface side. FIG. 8A shows the vicinities of the corner portions of the display portions 41a and 41b. Part of the display portion 41a is covered with the transparent portion 32b.

Figure 8B:
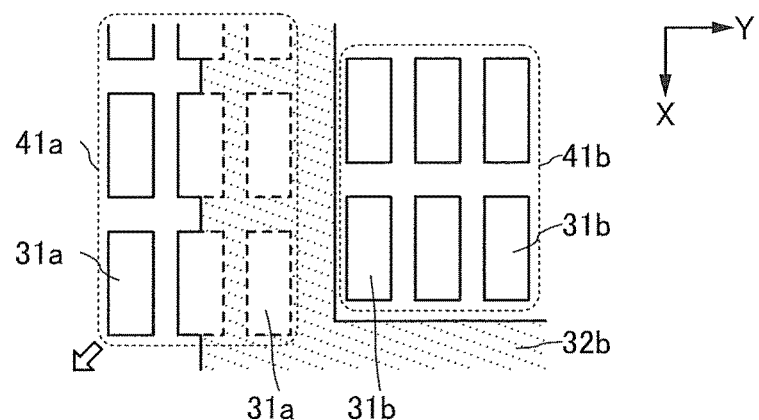

FIG. 8A shows an example in which adjacent pixels 31a and 31b are relatively deviated in one direction (X-axis direction). The arrow in the drawing denotes a direction in which the display panel 30a is deviated from the display panel 30b. FIG. 8B shows an example in which the adjacent pixels 31a and 31b are relatively deviated in a vertical direction and a horizontal direction (X-axis direction and Y-axis direction).

In the examples of FIGS. 8A and 8B, the distances deviated in the vertical direction and the horizontal direction are each shorter than the length of one pixel. In this case, image data of the image displayed on either one of the display portions 41a and 41b is corrected depending on the deviation distance, whereby the display quality can be maintained. Specifically, when the deviation makes the distance between the pixels smaller, the data is corrected so that the gray level (luminance) of the pixels is low, and when the deviation makes the distance between the pixels larger, the data is corrected so that the gray level (luminance) of the pixels is high. Alternatively, when the pixels are deviated by a distance of more than one pixel, the data is corrected so that the pixel positioned on a rear side is not driven and the image data is shifted by one column.

Figure 8C:
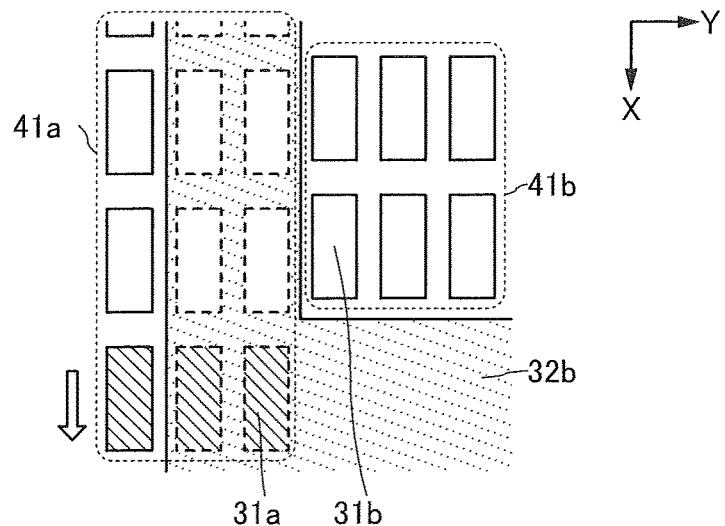

FIG. 8C shows an example in which the pixels 31a and 31b, which should be adjacent, are relatively deviated in one direction (X-axis direction) by a distance of more than one pixel. When the deviation of more than one pixel occurs, the pixels are driven so that projecting pixels (pixels which are hatched) are not displayed. Note that the same applies to the case where the deviation direction is the Y-axis direction.

When the plurality of display panels 30 are made to overlap with each other, in order to suppress misalignment, each of the display panels 30 is preferably provided with an alignment marker or the like. Alternatively, a projection and a depression may be formed on the surfaces of the display panels 30, and the projection and the depression may be attached to each other in a region where the two display panels 30 overlap.

Furthermore, in consideration of alignment accuracy, it is preferable that pixels more than the pixels to be used be placed in advance in the display portion 41 of the display panel 30. For example, it is preferable that one or more, preferably three or more, further preferably five or more extra pixel columns along either one or both of a scan line and a signal line be provided in addition to the pixel columns used for display.

This embodiment can be combined with any other embodiment as appropriate.

Embodiment 2

In this embodiment, structure examples of a display panel which can be used in a display device of one embodiment of the present invention are described with reference to drawings.

Although a display panel mainly including an organic EL element is described in this embodiment as an example, a display panel which can be used in a display device of one embodiment of the present invention is not limited to this example. A light-emitting panel or a display panel including another light-emitting element or display element which will be described later in this embodiment as an example can also be used in a display device of one embodiment of the present invention.

Structure Example 1

Figure 9A:
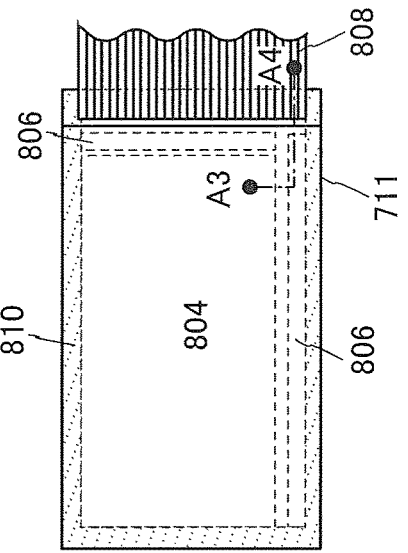
FIGS. 9A to 9C illustrate display panels according to one embodiment.
Figure 9B:
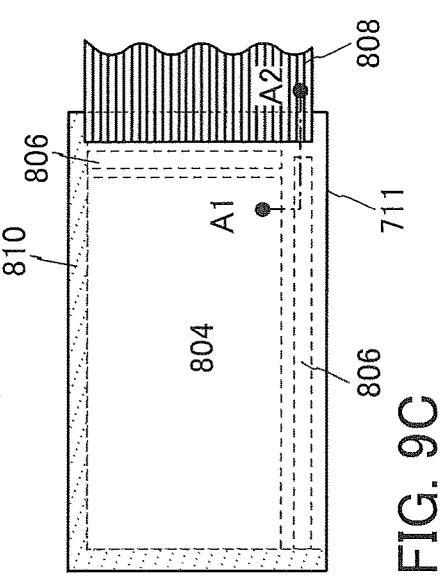
Figure 9C:
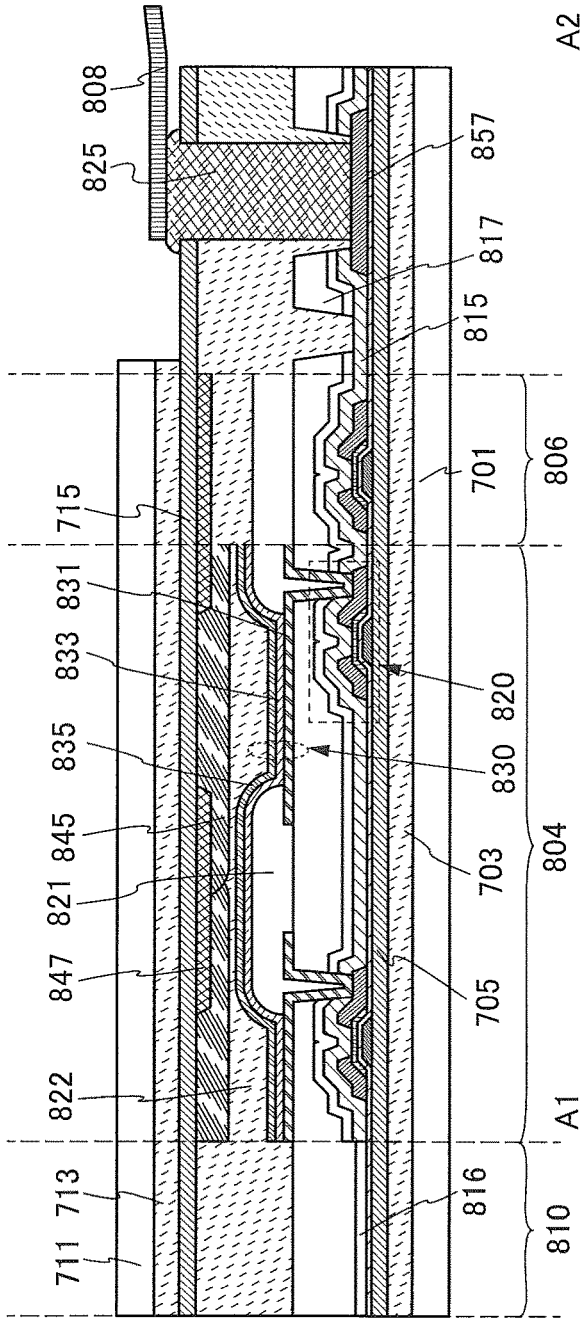

FIG. 9A is a plan view of the display panel, and FIG. 9C is an example of a cross-sectional view taken along the dashed-dotted line A1-A2 in FIG. 9A. FIG. 9C also shows an example of a cross-sectional view of a transparent portion 810.

The display panel in Structure Example 1 is a top-emission display panel using a color filter method. In this embodiment, the display panel can have a structure in which subpixels of three colors of red (R), green (G), and blue (B), for example, express one color; a structure in which subpixels of four colors of R, G, B, and white (W) express one color; a structure in which subpixels of four colors of R, G, B, and yellow (Y) express one color; or the like. There is no particular limitation on color elements, and colors other than R, G, B, W, and Y may be used. For example, cyan, magenta, or the like may be used.

The display panel shown in FIG. 9A includes the transparent portion 810, a display portion 804, an operating circuit portion 806, and an FPC 808. The transparent portion 810 is adjacent to the display portion 804 and provided along two sides of the display portion 804. The operating circuit portion 806 includes a scan line driver circuit, a signal line driver circuit, and the like.

The display panel illustrated in FIG. 9C includes a substrate 701, an adhesive layer 703, an insulating layer 705, a plurality of transistors, a conductive layer 857, an insulating layer 815, an insulating layer 816, an insulating layer 817, a plurality of light-emitting elements, an insulating layer 821, an adhesive layer 822, a coloring layer 845, a light-blocking layer 847, an insulating layer 715, an adhesive layer 713, and a substrate 711. The adhesive layer 822, the insulating layer 715, the adhesive layer 713, and the substrate 711 transmit visible light. Light-emitting elements and transistors included in the display portion 804 and the operating circuit portion 806 are sealed with the insulating layer 705, the insulating layer 715, and the adhesive layer 822.

The display portion 804 includes a transistor 820 and a light-emitting element 830 over the substrate 701 with the adhesive layer 703 and the insulating layer 705 provided therebetween. The light-emitting element 830 includes a lower electrode 831 over the insulating layer 817, an EL layer 833 over the lower electrode 831, and an upper electrode 835 over the EL layer 833. That is, the light-emitting element 830 includes the lower electrode 831, the upper electrode 835, and the EL layer 833 provided between the lower electrode 831 and the upper electrode 835.

The lower electrode 831 is electrically connected to a source electrode or a drain electrode of the transistor 820. An end portion of the lower electrode 831 is covered with the insulating layer 821. The lower electrode 831 preferably reflects visible light. The upper electrode 835 transmits visible light.

In addition, the display portion 804 includes the coloring layer 845 overlapping with the light-emitting element 830 and the light-blocking layer 847 overlapping with the insulating layer 821. The space between the light-emitting element 830 and the coloring layer 845 is filled with the adhesive layer 822.

The insulating layer 815 and the insulating layer 816 have an effect of inhibiting diffusion of impurities to a semiconductor included in the transistors. As the insulating layer 817, an insulating layer having a planarization function is preferably selected in order to reduce surface unevenness due to the transistor.

Note that the insulating layer 815 and/or the insulating layer 816 may be omitted in a region where a transistor is not provided in the display panel. In particular, it is preferable that the insulating layer 815 and/or the insulating layer 816 not be formed in the transparent portion 810 because the transmittance is improved. FIGS. 9A to 9C show structures in each of which the insulating layer 815 is not formed in the transparent portion 810. For example, silicon nitride and silicon oxynitride can be used as the insulating layer 815 and the insulating layer 816, respectively.

The operating circuit portion 806 includes a plurality of transistors over the substrate 701 with the adhesive layer 703 and the insulating layer 705 provided therebetween. In FIG. 9C, one of transistors included in the operating circuit portion 806 is illustrated.

The insulating layer 705 and the insulating layer 715 are preferably highly resistant to moisture, in which case entry of impurities such as water into the light-emitting element 830 or the transistor 820 can be inhibited, leading to higher reliability of the display panel. When the display panel includes a substrate, the surface of the display panel can be protected from a physical impact, which is preferable. The substrate 701 is bonded to the insulating layer 705 with the adhesive layer 703. The substrate 711 is bonded to the insulating layer 715 with the adhesive layer 713.

The conductive layer 857 is electrically connected to an external electrode through which a signal (e.g., a video signal, a clock signal, a start signal, or a reset signal) or a potential from the outside is transmitted to the operating circuit portion 806. Here, an example in which the FPC 808 is provided as the external electrode is described. To prevent an increase in the number of manufacturing steps, the conductive layer 857 is preferably formed using the same material and the same step(s) as those of the electrode or the wiring in the display portion or the driver circuit portion. Here, an example is described in which the conductive layer 857 is formed using the same material and the same step(s) as those of the electrodes of the transistor 820.

In the display panel in FIG. 9C, the FPC 808 is positioned over the insulating layer 715. The connector 825 is connected to the conductive layer 857 through an opening provided in the insulating layer 715, the adhesive layer 822, the insulating layer 817, the insulating layer 816, and the insulating layer 815. The connector 825 is also connected to the FPC 808. The FPC 808 and the conductive layer 857 are electrically connected to each other via the connector 825.

Figure 10:
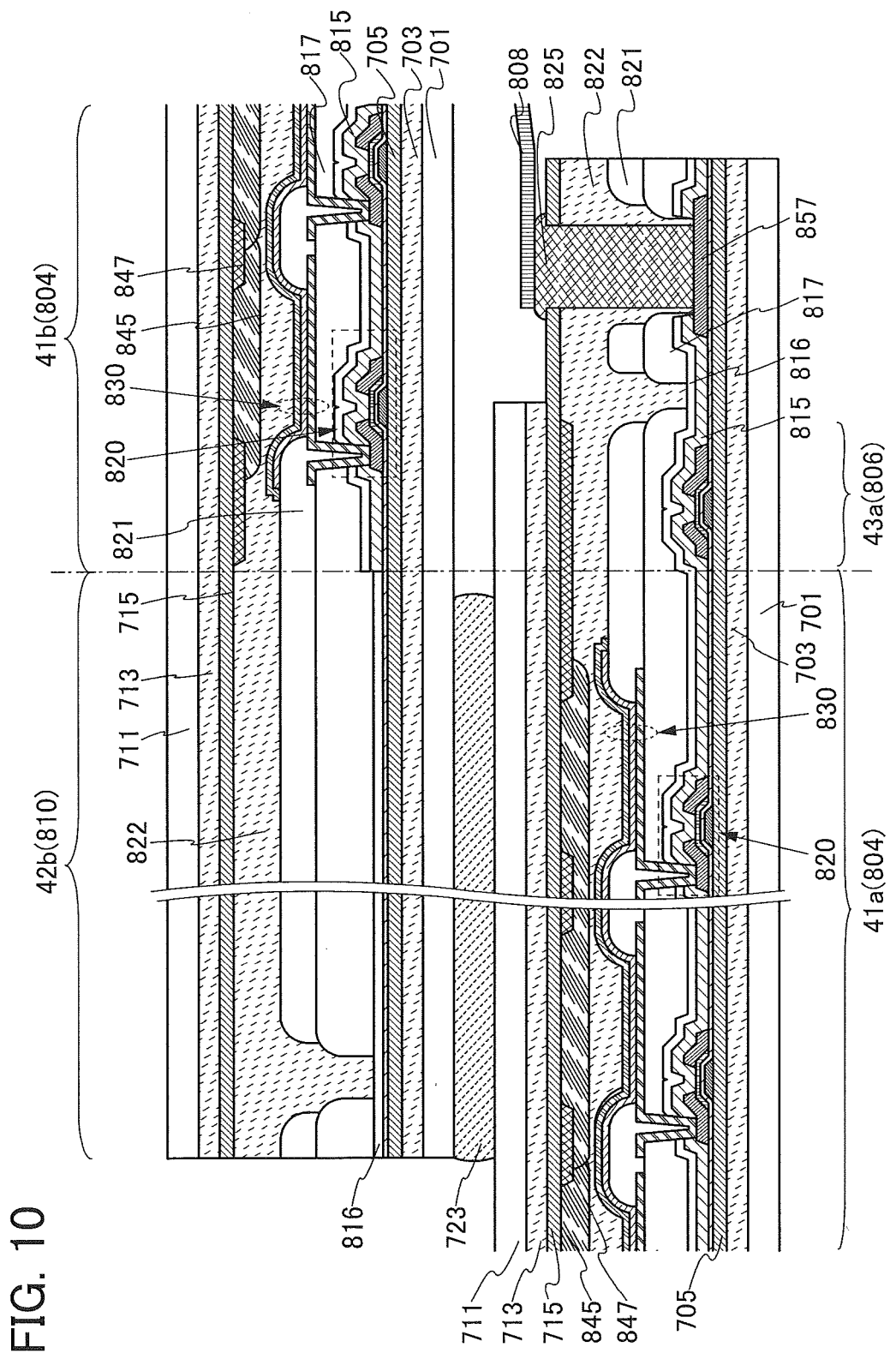
FIG. 10 illustrates a display panel according to one embodiment.

FIG. 10 shows an example of a cross-sectional view of a state where two display panels each shown in FIG. 9C are attached to each other with an adhesive layer 723 therebetween. Note that the two display panels may be fixed to each other so as to be attachable to and detachable from each other using an adsorptive layer instead of the adhesive layer 723.

FIG. 10 shows the display portion 41a (corresponding to the display portion 804 shown in FIG. 9A) and the operating circuit portion 43a (corresponding to the operating circuit portion 806 and the like shown in FIG. 9A) of the lower (rear) display panel and the display portion 41b (corresponding to the display portion 804 shown in FIG. 9A) and the transparent portion 42b (corresponding to the transparent portion 810 shown in FIG. 9A) of the upper (front) display panel. Furthermore, the cross-sectional view shown in FIG. 10 shows an example of an overlapping portion (see FIG. 1B) where the two display panels 40a and 40b described in Embodiment 1 overlap with each other.

In FIG. 10, the display panel positioned on the upper side (the display surface side) includes the transparent portion 810 adjacent to the display portion 804. Furthermore, the display portion 804 of the lower display panel and the transparent, portion 810 of the upper display panel overlap each other. Thus, a non-display region between the display regions of the two overlapping display panels can be reduced and even removed. As a result, a large-sized display device in which a joint portion of the display portions is hardly seen by the user can be obtained.

In FIG. 10, the adhesive layer 723 transmitting visible light is provided between the display portion 804 of the lower display panel and the transparent portion 810 of the upper display panel. The difference in refractive index between the adhesive layer 723 and the substrate 701 of the upper display panel and/or the substrate 711 of the lower display panel is preferably small. Such a structure can reduce reflection by the interface due to the difference in refractive index in a stack located over the display portion 804 of the lower display panel. In addition, display unevenness or luminance unevenness of a large display device can be suppressed.

Structure Example 2

Figure 11:
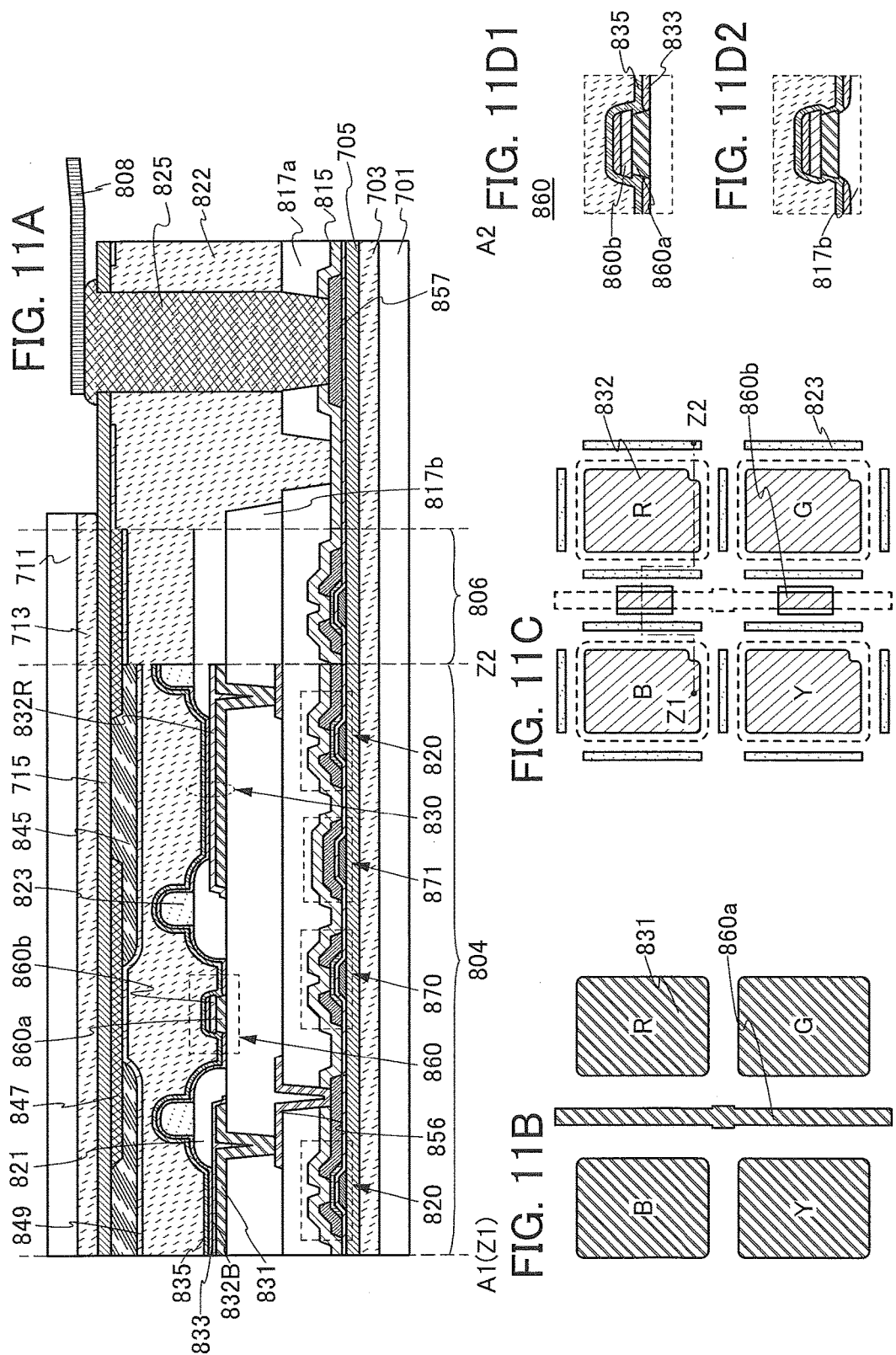

FIG. 9A is a plan view of the display panel, and FIG. 11A is an example of a cross-sectional view taken along the dashed-dotted line A1-A2 in FIG. 9A. The display panel in Structure Example 2 is a top-emission display panel using a color filter method, which differs from the display panel in Structure Example 1. Here, only different points from those of Structure Example 1 are described and the description of the same points as Structure Example 1 is omitted.

A display panel which can be used in a display device of one embodiment of the present invention is a display panel in which a plurality of pixels and a plurality of auxiliary electrodes are provided in a display portion, each pixel includes a light-emitting element and a transistor, the light-emitting element includes a lower electrode, an upper electrode, and an EL layer between the lower electrode and the upper electrode, and the auxiliary electrode is in contact with the upper electrode between adjacent lower electrodes.

A display panel shown in FIG. 11A has a structure in which subpixels of four colors of R, G, B, and Y express one color. FIG. 11C shows an example of the arrangement of the subpixels of R, G, B, and Y. The cross-sectional view of the display portion 804 in FIG. 11A is taken along the dashed-dotted line Z1-Z2 in FIG. 11C.

As in the display panel shown in FIG. 11A, the light-emitting element 830 includes an optical adjustment layer 832 between the lower electrode 831 and the EL layer 833. A light-transmitting conductive material is preferably used for the optical adjustment layer 832. Owing to the combination of the coloring layer and a microcavity structure utilizing the optical adjustment layer, light with high color purity can be extracted from the display device of one embodiment of the present invention. The thickness of the optical adjustment layer may be varied depending on the color of the sub-pixel. In FIG. 11A, an optical adjustment layer 832R of the subpixel R and an optical adjustment layer 832B of the subpixel B are shown.

The display panel in FIG. 11A includes a spacer 823 over the insulating layer 821. The spacer 823 can adjust the distance between the substrate 701 and the substrate 711.

The display panel in FIG. 11A includes an overcoat 849 covering the coloring layer 845 and the light-blocking layer 847. The space between the light-emitting element 830 and the overcoat 849 is filled with the adhesive layer 822.

In the display panel that can be used in the display device of one embodiment of the present invention, the transparent portion is adjacent to the display portion and provided along the sides of the display portion. In particular, in the case where the size of the display panel is large, it is required that a region not overlapping with the transparent portion include a contact region where an upper electrode (in this embodiment, the upper electrode 835) common to pixels in the display portion is connected to a wiring in the vicinity of the display portion supplied with a power supply voltage. In the case where a conductive layer forming the upper electrode has high electric resistance, there is a concern that luminance of light emitted from a pixel apart from the contact region in the display portion be lowered by a voltage drop of the upper electrode.

The display panel shown in FIG. 11A includes, between pixels, an auxiliary electrode 860 for suppressing the voltage drop of the upper electrode 835. The auxiliary electrode 860 is preferably formed of conductive materials whose electric resistance is lower than that of the upper electrode 835.

The conductive layer forming the auxiliary electrode 860, the lower electrode 831, and the like are preferably formed at the same time because a process can be shortened. In FIG. 11A, the auxiliary electrode 860 is formed of a conductive material of the lower electrode 831 and a conductive material of the optical adjustment layer 832.

Here, a method of forming the auxiliary electrode 860 will be described. FIGS. 11B and 11C show examples of a top view of sub-pixels R, G, B, and Y in the display portion 804. FIG. 11B is a top view at the time of finishing the formation of the lower electrode 831. FIG. 11C is a top view at the time of finishing the formation of the optical adjustment layer 832, the insulating layer 821, and the spacer 823 after the state shown in FIG. 11B. Note that components such as the transistor 820 which are formed before the formation of the lower electrode 831 are not shown in FIGS. 11B and 11C.

The auxiliary electrode 860 can be provided so as to fill a space between sub-pixels. For example, the auxiliary electrode 860 may be provided in a net-like shape so as to surround the lower electrode 831 in each sub-pixel, or may be provided in a plurality of lines (or stripes) in a space in one direction between adjacent lower electrodes 831.

The auxiliary electrode 860 forming one line is preferably continuous because the electric resistance of the upper electrode 835 can be further reduced. FIG. 11B shows an example in which a conductive layer 860a is provided in a line. Note that here, the conductive layer 860a is formed of the conductive layer used for forming the lower electrode 831.

The auxiliary electrode 860 is in contact with the upper electrode 835 so as to be electrically connected to the upper electrode 835. Therefore, in the case where EL layers 833 are formed by a separate coloring method, the EL layers 833 are not formed over the auxiliary electrode 860, and the upper electrode 835 is formed over the auxiliary electrode 860, whereby the auxiliary electrode 860 and the upper electrode 835 can be in contact with each other.

In this embodiment, the EL layers 833 are formed also on the auxiliary electrode 860 because the EL layers 833 are formed without using a separate coloring method. Therefore, a method for forming the upper electrode 835 so that a part of a surface of the auxiliary electrode 860 is not covered with the EL layer 833 and the part is covered with the upper electrode 835 is required.

FIG. 11D1 is an enlarged view of the auxiliary electrode 860. The auxiliary electrode 860 has a stacked-layer structure of the conductive layer 860a and a conductive layer 860b. In the structure, the area of a bottom surface of the conductive layer 860b is larger than the area of a top surface of the conductive layer 860a, and a part of the conductive layer 860b extends beyond the conductive layer 860a.

When the auxiliary electrode 860 has such a structure, the conductive layer 860b serves as eaves in forming the EL layer 833. Therefore, the EL layer 833 is not formed on a part of a side surface of the conductive layer 860a, so that the part of the side surface can be exposed. Furthermore, the upper electrode 835 is formed by a formation method which has lower anisotropy than a formation method for forming the EL layer 833. Thus, the upper electrode 835 can be formed on the side surface of the conductive layer 860a, and the conductive layer 860a and the upper electrode 835 can be in contact with each other.

Note that in a process of manufacturing the display panel, a film lower than the conductive layer 860a might be etched in etching the conductive layer 860a or the conductive layer 860b. In the case where a region in contact with an end portion of a lower surface of the conductive layer 860a is etched in the film, the EL layer 833 is less likely to be formed on the side surface of the conductive layer 860a in forming the EL layer 833.

FIG. 11D2 is a cross-sectional view of the auxiliary electrode 860 in the case where a part of an insulating layer 817b in contact with the end portion of the lower surface of the conductive layer 860a is etched. In this case, the voltage drop of the upper electrode 835 can be suppressed more effectively than in the case of FIG. 11D1.

In FIG. 11C, a portion which is surrounded by a dashed line and is not hatched is covered with the insulating layer 821. In other words, regions surrounded by a solid line except the spacer 823 (a part of the optical adjustment layer 832 and a part of the conductive layer 860b) coincide with opening portions formed in the insulating layer 821. Here, the conductive layer 860b and the optical adjustment layer 832 are formed of the same conductive layer.

In FIG. 11C, the opening portion is formed in the insulating layer 821 so that a part of the auxiliary electrode 860 between a plurality of lower electrodes 831 is exposed. The size of the opening portion can be adjusted as appropriate depending on the electric resistance of the upper electrode 835 and the area of the display portion 804. The width of the auxiliary electrode 860, i.e., the length in a direction in which pixels are adjacent to each other with the auxiliary electrode 860 provided therebetween can be adjusted as appropriate depending on the electric resistance of the upper electrode 835 and the area of the display portion 804.

Described below is a method for checking whether the auxiliary electrode 860 in the display panel performs its function, i.e., whether the side surface of the auxiliary electrode 860 is in contact with the upper electrode 835 as shown in FIG. 11D1 or FIG. 11D2.

In the display portion 804, a wiring (hereinafter referred to as a measurement wiring) electrically connected to the auxiliary electrodes 860 extending in one direction in a stripe is connected to one terminal (hereinafter referred to as a terminal A) included in the FPC 808. One terminal included in the FPC 808 electrically connected to the upper electrode 835 is referred to as a terminal B.

When an electric resistance value between the terminal A and the terminal B is greater than or equal to 100Ω and less than or equal to 10 kΩ, the auxiliary electrode 860 can be regarded as being in contact with the upper electrode 835 in the display portion 804. Note that the lower limit of the electric resistance value may vary depending on the materials of the auxiliary electrode 860, the material of the upper electrode 835, and a material and a length of the measurement wiring.

Correction circuits may be provided in pixels to suppress variation in current flowing in the light-emitting elements 830 in the pixels. Specifically, a plurality of transistors and/or a plurality of capacitors may be provided in each sub-pixel so that variation in current flowing in the transistors 820 each having a source electrode or a drain electrode connected to the lower electrode 831 through a conductive layer 856 is suppressed in different sub-pixels of the same color. The variation in current is due to variation in the thickness of a semiconductor layer of the transistor 820 in some cases. For example, a transistor 870 and a capacitor 871 shown in FIG. 11A may have a function of correcting variation in current flowing in the transistor 820.

FIG. 12, FIGS. 13A and 13B, FIGS. 14A and 14B, FIGS. 15A and 15B, and FIGS. 16A and 16B show examples of a pixel circuit including the above-described correction circuit.

Figure 12:
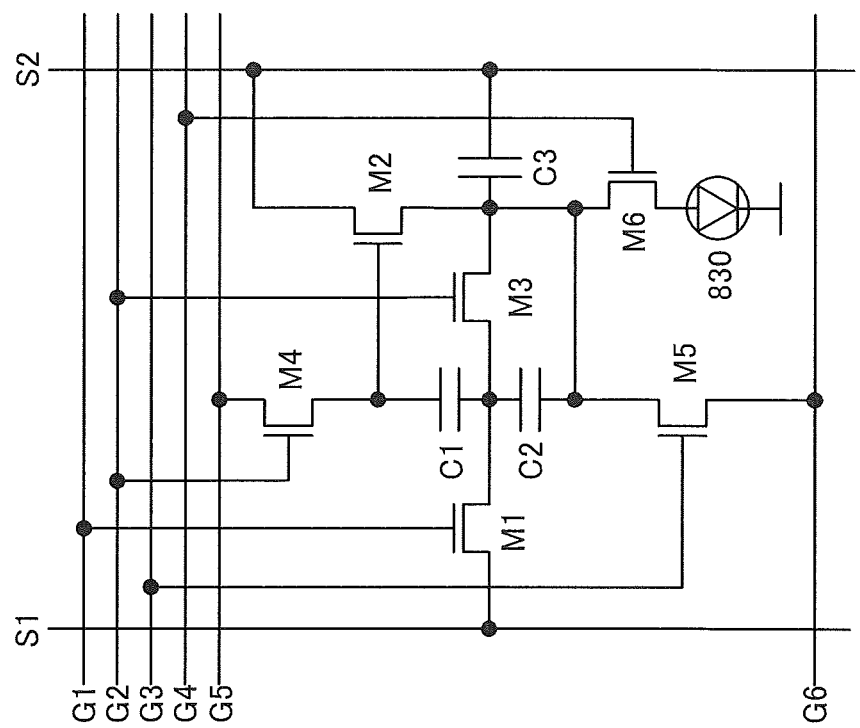
FIG. 12 is a circuit diagram of a pixel of a display panel according to one embodiment.

A pixel circuit shown in FIG. 12 includes six transistors (transistors M1 to M6), three capacitors (capacitors C1 to C3), and the light-emitting element 830. A wiring S1, a wiring S2, and wirings G1 to G6 are electrically connected to the pixel circuit shown in FIG. 12. Note that as the transistors M1 to M6, for example, n-channel transistors can be used.

For example, the wirings G1 to G4 shown in FIG. 12 are electrically connected to the scan line driver circuit in the operating circuit portion 806. For example, the wiring S1 shown in FIG. 12 is electrically connected to the signal line driver circuit in the operating circuit portion 806. For example, the wiring G5, the wiring G6, and the wiring S2 shown in FIG. 12 are electrically connected to a constant voltage source.

For example, the transistor 820 in FIG. 11A can serve as the transistor M6. For example, the transistor 870 in FIG. 11A can serve as any one of the transistors M1 to M5. For example, the capacitor 871 in FIG. 11A can serve as any one of the capacitors C1 to C3.

Figure 13A:
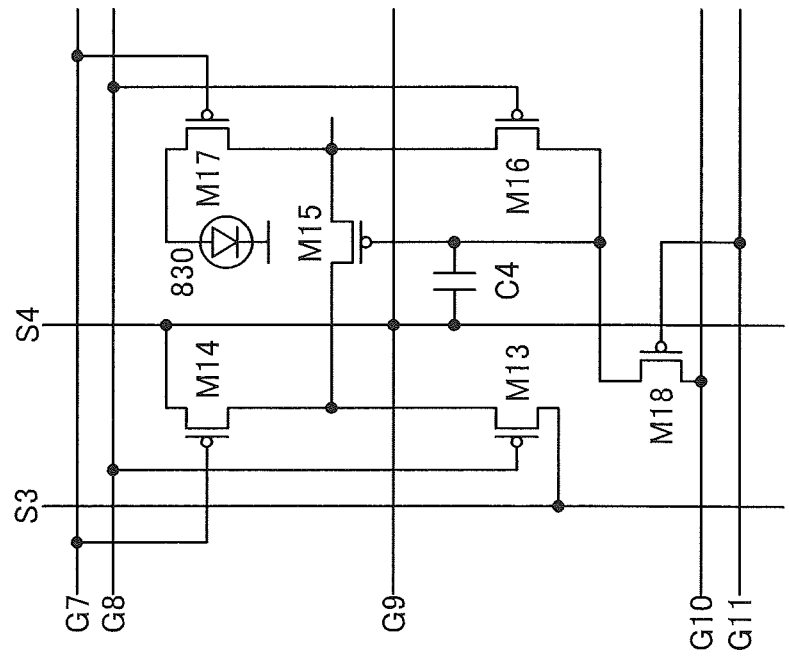
FIGS. 13A and 13B are each a circuit diagram of a pixel of a display panel according to one embodiment.

A pixel circuit shown in FIG. 13A includes six transistors (M7 to M12), a capacitor C4, and the light-emitting element 830. The pixel circuit shown in FIG. 13A is electrically connected to wirings S3 and S4 and wirings G7 to G11. Note that as the transistors M7 to M12, for example, n-channel transistors can be used. Alternatively, p-channel transistors (M13 to M18) may be used instead of the transistors M7 to M12, as shown in FIG. 13B.

Figure 14A:
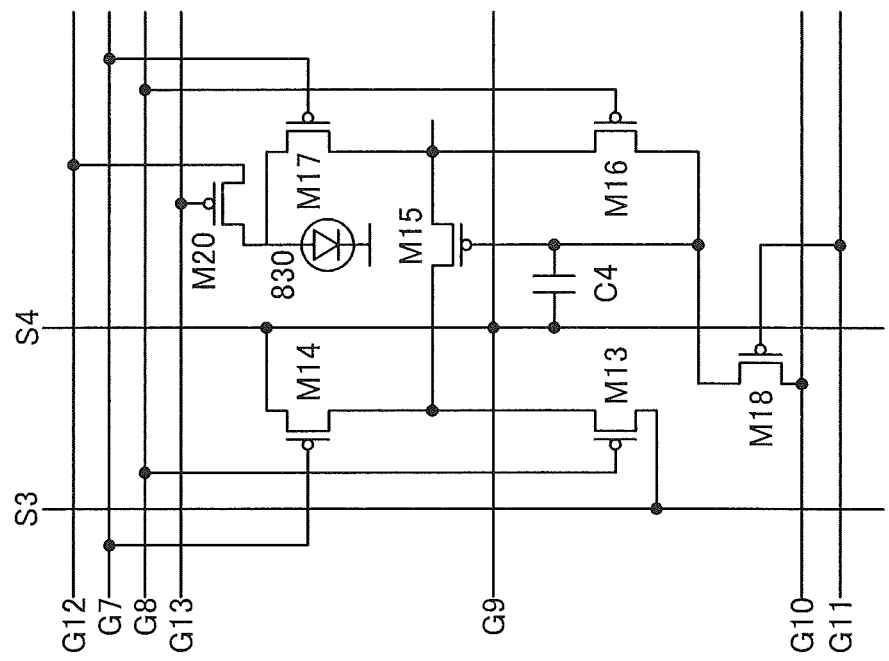
FIGS. 14A and 14B are each a circuit diagram of a pixel of a display panel according to one embodiment.

A pixel circuit shown in FIG. 14A has a structure in which a transistor M19 is added to the pixel circuit shown in FIG. 13A. The pixel circuit shown in FIG. 14A is electrically connected to wirings G12 and G13. The wirings G11 and G12 may be electrically connected to each other. Note that as the transistor M19, for example, an n-channel transistor can be used.

Figure 13B:
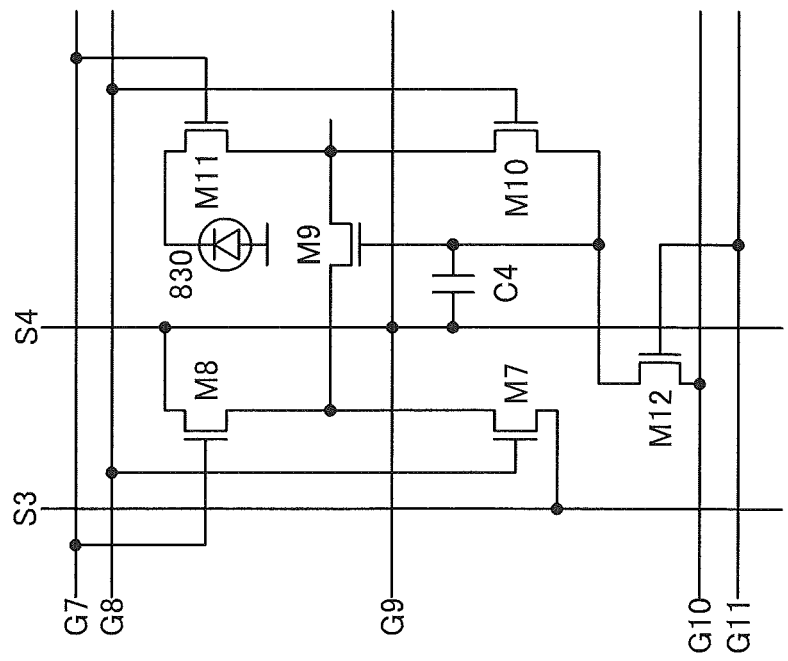
Figure 14B:
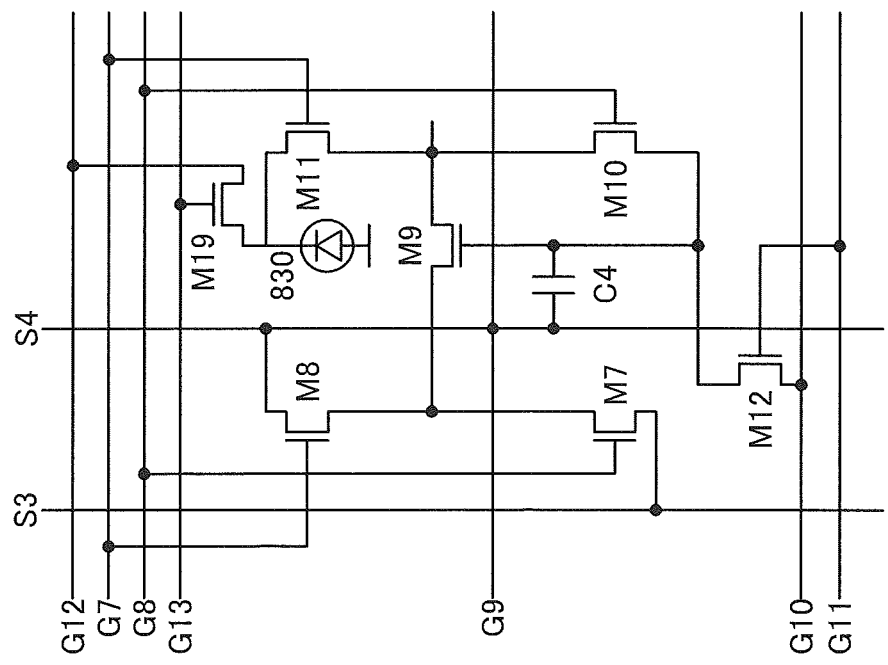

A pixel circuit shown in FIG. 14B has a structure in which a transistor M20 is added to the pixel circuit shown in FIG. 13B. The pixel circuit shown in FIG. 14B is electrically connected to the wirings G12 and G13. The wirings G11 and G12 may be electrically connected to each other. Note that as the transistor M20, for example, a p-channel transistor can be used.

Figures 15A, 15B:
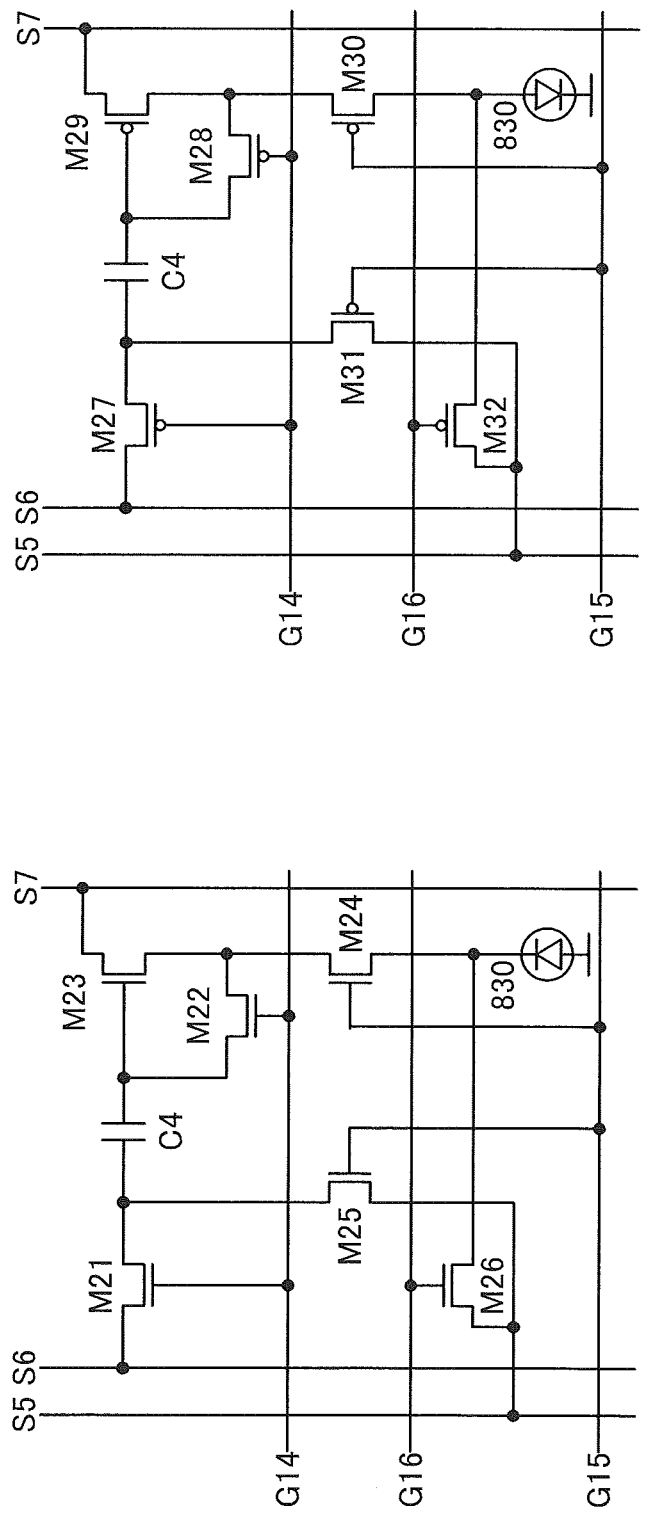
FIGS. 15A and 15B are each a circuit diagram of a pixel of a display panel according to one embodiment.

A pixel circuit shown in FIG. 15A includes six transistors (M21 to M26), the capacitor C4, and the light-emitting element 830. The pixel circuit shown in FIG. 15A is electrically connected to wirings S5 to S7 and wirings G14 to G16. The wirings G14 to G16 may be electrically connected to each other. Note that as the transistors M21 to M26, for example, n-channel transistors can be used. Alternatively, p-channel transistors (M27 to M32) may be used instead of the transistors M21 to M26, as shown in FIG. 15B.

Figure 16A:
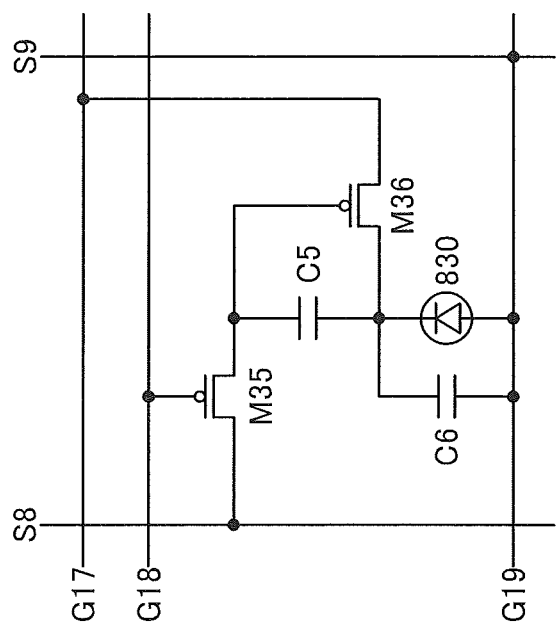
FIGS. 16A and 16B are each a circuit diagram of a pixel of a display panel according to one embodiment.
Figure 16B:
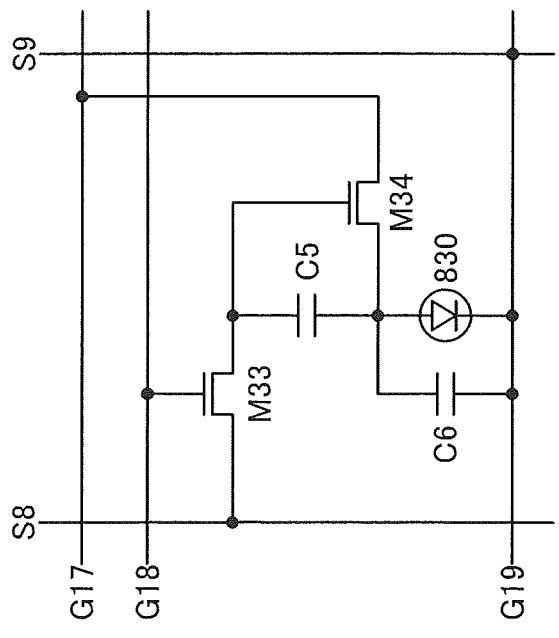

A pixel circuit shown in FIG. 16A includes two transistors (transistors M33 and M34), two capacitors (capacitors C5 and C6), and the light-emitting element 830. The pixel circuit shown in FIG. 16A is electrically connected to wirings S8 to S9 and wirings G17 to G19. With the configuration of the pixel circuit shown in FIG. 16A, the pixel circuit shown in FIG. 16A can be driven by a voltage inputting current driving method (also referred to as CVCC). Note that as the transistors M33 and M34, for example, n-channel transistors can be used. Alternatively, p-channel transistors (M35 and M36) may be used instead of the transistors M33 to M34, as shown in FIG. 16B.

Structure Example 3

FIG. 9B is a plan view of the display panel, and FIG. 17A is an example of a cross-sectional view taken along the dashed-dotted line A3-A4 in FIG. 9B. The display panel in Structure Example 3 is a top-emission display device using a separate coloring method.

The display panel in FIG. 17A includes the substrate 701, the adhesive layer 703, the insulating layer 705, a plurality of transistors, the conductive layer 857, the insulating layer 815, the insulating layer 817, a plurality of light-emitting elements, the insulating layer 821, the spacer 823, the adhesive layer 822, the insulating layer 715, and the substrate 711. The adhesive layer 822, the insulating layer 715, and the substrate 711 transmit visible light.

In the display panel in FIG. 17A, the connector 825 is positioned over the insulating layer 815. The connector 825 is connected to the conductive layer 857 through an opening provided in the insulating layer 815. Moreover, the connector 825 is connected to the FPC 808. The FPC 808 and the conductive layer 857 are electrically connected to each other with the connector 825 provided therebetween.

Structure Example 4

FIG. 9B is a plan view of the display panel, and FIG. 17B is an example of a cross-sectional view taken along the dashed-dotted line A3-A4 in FIG. 9B. The display panel in Structure Example 4 is a bottom-emission display panel using a color filter method.

The display panel in FIG. 17B includes the substrate 701, the adhesive layer 703, the insulating layer 705, a plurality of transistors, the conductive layer 857, the insulating layer 815, the coloring layer 845, the insulating layer 817a, the insulating layer 817b, the conductive layer 856, a plurality of light-emitting elements, the insulating layer 821, the adhesive layer 822, and the substrate 711. The substrate 701, the adhesive layer 703, the insulating layer 705, the insulating layer 815, the insulating layer 817a, and the insulating layer 817b transmit visible light.

The display portion 804 includes the transistor 820, the transistor 824, and the light-emitting element 830 over the insulating layer 705. The light-emitting element 830 includes the lower electrode 831 over the insulating layer 817b, the EL layer 833 over the lower electrode 831, and the upper electrode 835 over the EL layer 833. The lower electrode 831 is electrically connected to a source electrode or a drain electrode of the transistor 820. An end portion of the lower electrode 831 is covered with the insulating layer 821. The upper electrode 835 preferably reflects visible light. The lower electrode 831 transmits visible light. The coloring layer 845 that overlaps with the light-emitting element 830 can be provided anywhere; for example, the coloring layer 845 may be provided between the insulating layers 817a and 817b or between the insulating layers 815 and 817a.

In the operating circuit portion 806, a plurality of transistors are provided over the substrate 701 with the adhesive layer 703 and the insulating layer 705 provided therebetween. In FIG. 17B, two of the transistors included in the operating circuit portion 806 is illustrated.

The insulating layer 705 is preferably highly resistant to moisture, in which case impurities such as water can be prevented from entering the light-emitting element 830, the transistor 820, or the transistor 824, leading to higher reliability of the display panel.

The conductive layer 857 is electrically connected to an external electrode through which a signal or a potential from the outside is transmitted to the operating circuit portion 806. Here, an example in which the FPC 808 is provided as the external electrode is described. Here, an example is described in which the conductive layer 857 is formed using the same material and the same step(s) as those of the conductive layer 856.

Examples of Materials and Formation Method

Next, materials and the like that can be used for the display panel or the light-emitting panel are described. Note that description of the components already described in this specification and the like is omitted in some cases.

For each of the substrates, a material such as glass, quartz, an organic resin, a metal, or an alloy can be used. The substrate through which light is extracted from the light-emitting element is formed using a material which transmits the light.

In particular, a flexible substrate is preferably used. For example, an organic resin; or glass, a metal, or an alloy that is thin enough to have flexibility can be used.

An organic resin, which has a specific gravity smaller than that of glass, is preferably used for the flexible substrate, in which case the display panel can be lightweight as compared with the case where glass is used.

The substrate is preferably formed using a material with high toughness. In that case, a display panel with high impact resistance that is less likely to be broken can be provided. For example, when an organic resin substrate or a thin metal or alloy substrate is used, the display panel can be lightweight and unlikely to be broken as compared with the case where a glass substrate is used.

A metal material and an alloy material, which have high thermal conductivity, are preferable because they can easily conduct heat to the whole substrate and accordingly can prevent a local temperature rise in the display panel. The thickness of a substrate using a metal material or an alloy material is preferably greater than or equal to 10 µm and less than or equal to 200 µm, further preferably greater than or equal to 20 µm and less than or equal to 50 µm.

There is no particular limitation on a material of the metal substrate or the alloy substrate, but it is preferable to use, for example, aluminum, copper, nickel, or a metal alloy such as an aluminum alloy or stainless steel.

Furthermore, when a material with high thermal emissivity is used for the substrate, the surface temperature of the display panel can be prevented from rising, leading to inhibition of breakage or a decrease in reliability of the display panel. For example, the substrate may have a stacked-layer structure of a metal substrate and a layer with high thermal emissivity (the layer can be formed using a metal oxide or a ceramic material, for example).

As the substrate having flexibility and a light-transmitting property, a plastic substrate that is formed as a film, for example, a plastic substrate made from polyimide (PI), an aramid, polyethylene terephthalate (PET), polyethersulfone (PES), polyethylene naphthalate (PEN), polycarbonate (PC), nylon, polyetheretherketone (PEEK), polysulfone (PSF), polyetherimide (PEI), polyarylate (PAR), polybutylene terephthalate (PBT), a silicone resin, and the like, or a glass substrate can be used. The substrate may include a fiber or the like (e.g., a prepreg). Furthermore, the substrate is not limited to the resin film, and a transparent nonwoven fabric formed by processing pulp into a continuous sheet, a sheet including an artificial spider's thread fiber containing protein called fibroin, a complex in which the transparent nonwoven fabric or the sheet and a resin are mixed, a stack of a resin film and a nonwoven fabric containing a cellulose fiber whose fiber width is 4 nm or more and 100 nm or less, or a stack of a resin film and a sheet including an artificial spider's thread fiber may be used.

The flexible substrate may have a stacked-layer structure in which a hard coat layer (e.g., a silicon nitride layer) by which a surface of the device is protected from damage, a layer which can disperse pressure (e.g., an aramid resin layer), or the like is stacked over a layer of any of the above-mentioned materials.

The flexible substrate may be formed by stacking a plurality of layers. When a glass layer is used, a barrier property against water and oxygen can be improved and thus a highly reliable display panel can be provided.

For example, a flexible substrate in which a glass layer, an adhesive layer, and an organic resin layer are stacked from the side closer to a light-emitting element can be used. The thickness of the glass layer is greater than or equal to 20 µm and less than or equal to 200 µm, preferably greater than or equal to 25 µm and less than or equal to 100 µm. With such a thickness, the glass layer can have both a high barrier property against water and oxygen and high flexibility. The thickness of the organic resin layer is greater than or equal to 10 µm and less than or equal to 200 µm, preferably greater than or equal to 20 µm and less than or equal to 50 µm. By providing such an organic resin layer outside the glass layer, occurrence of a crack or a break in the glass layer can be inhibited and mechanical strength can be improved. With the substrate that includes such a composite material of a glass material and an organic resin, a highly reliable flexible display panel can be provided.

Here, a method for forming a flexible display panel is described.

For convenience, a structure including a pixel and a driver circuit, a structure including an optical member such as a color filter, a structure including a touch sensor, or a structure including a functional member is referred to as an element layer. An element layer includes a display element, for example, and may include a wiring electrically connected to a display element or an element such as a transistor used in a pixel or a circuit in addition to the display element.

Here, a support provided with an insulating surface over which an element layer is formed is called a base material.

As a method for forming an element layer over a flexible base material, there are a method in which an element layer is formed directly over a base material, and a method in which an element layer is formed over a supporting base material that is different from the base material and has stiffness and then the element layer is separated from the supporting base material and transferred to the base material.

In the case where a material of the base material can withstand heating temperature in the process for forming the element layer, it is preferred that the element layer be formed directly over the base material, in which case a manufacturing process can be simplified. At this time, the element layer is preferably formed in a state where the base material is fixed to the supporting base material, in which case the transfer of the element layer in a device and between devices can be easy.

In the case of employing the method in which the element layer is formed over the supporting base material and then transferred to the base material, first, a separation layer and an insulating layer are stacked over a supporting base material, and then the element layer is formed over the insulating layer. Then, the element layer is separated from the supporting base material and then transferred to the base material. At this time, a material is selected such that separation at an interface between the supporting base material and the separation layer, at an interface between the separation layer and the insulating layer, or in the separation layer occurs. With such a method, the element layer can be formed at temperatures higher than the upper temperature limit of the base material, which improves the reliability of the display panel.

For example, it is preferable that stacked layers of a layer including a high-melting-point metal material, such as tungsten, and a layer including an oxide of the metal material be used as the separation layer, and stacked layers of a plurality of layers as the insulating layer, such as a silicon nitride layer and a silicon oxynitride layer be used over the separation layer. By using a high-melting-point metal material, a high-temperature process can be performed to form the element layer, resulting in high reliability. For example, impurities contained in the element layer can be further reduced, and the crystallinity of a semiconductor or the like included in the element layer can be further increased. For the base material, any of the above flexible materials can be preferably used.

Examples of the separation include peeling off by application of mechanical power, removal of the separation layer by etching, or separation by dripping of a liquid into part of the separation interface to penetrate the entire separation interface.

The separation layer is not necessarily provided in the case where separation can occur at an interface between the supporting base material and the insulating layer. For example, glass may be used as the supporting base material, an organic resin such as polyimide may be used as the insulating layer, a separation trigger may be formed by locally heating part of the organic resin by laser light or the like, and separation may be performed at an interface between the glass and the insulating layer. Alternatively, it is possible that a layer containing a material with high thermal conductivity (e.g., a metal or a semiconductor) is provided between the supporting base material and the insulating layer containing an organic resin, and this layer is heated by current so that separation easily occurs, and then separation is performed. In this case, the insulating layer containing an organic resin can also be used as the base material.

As the adhesive layer, a variety of curable resins such as a reactive curable resin, a thermosetting resin, an anaerobic resin, and a photo curable resin such as an ultraviolet curable resin can be used. Examples of such resins include an epoxy resin, an acrylic resin, a silicone resin, a phenol resin, a polyimide resin, an imide resin, a polyvinyl chloride (PVC) resin, a polyvinyl butyral (PVB) resin, an ethylene vinyl acetate (EVA) resin, and the like. In particular, a material with low moisture permeability, such as an epoxy resin, is preferable. Alternatively, a two-component-mixture-type resin may be used. Further alternatively, an adhesive sheet or the like may be used.

Furthermore, the resin may include a drying agent. For example, a substance which adsorbs moisture by chemical adsorption, such as an oxide of an alkaline earth metal (e.g., calcium oxide or barium oxide), can be used. Alternatively, a substance that adsorbs moisture by physical adsorption, such as zeolite or silica gel, may be used. The drying agent is preferably included, in which case entry of impurities such as moisture into the light-emitting element can be inhibited and the reliability of the display panel can be improved.

In addition, a filler with a high refractive index or a light scattering member is mixed into the resin, in which case the efficiency of light extraction from the light-emitting element can be improved. For example, titanium oxide, barium oxide, zeolite, zirconium, or the like can be used.

Insulating films with high resistance to moisture are preferably used for the insulating layer 705 and the insulating layer 715. Alternatively, the insulating layer 705 and the insulating layer 715 preferably have a function of preventing diffusion of impurities to a light-emitting element.

As an insulating film having an excellent moisture-proof property, a film containing nitrogen and silicon (e.g., a silicon nitride film or a silicon nitride oxide film), a film containing nitrogen and aluminum (e.g., an aluminum nitride film), or the like can be used. Alternatively, a silicon oxide film, a silicon oxynitride film, an aluminum oxide film, or the like can be used.

For example, the water vapor transmittance of the insulating film having an excellent moisture-proof property is lower than or equal to $1\times10^{-5}$ [g/(m$^2$·day)], preferably lower than or equal to $1\times10^{-6}$ [g/(m$^2$·day)], further preferably lower than or equal to $1\times10^{-7}$ [g/(m$^2$·day)], still further preferably lower than or equal to $1\times10^{-8}$ [g/(m$^2$·day)].

In the display panel, it is necessary that at least one of the insulating layers 705 and 715, which is on the light-emitting surface side, transmit light emitted from the light-emitting element. In the case where the display panel includes the insulating layers 705 and 715, one of the insulating layers 705 and 715, which transmits light emitted from the light-emitting element, preferably has higher average transmittance than the other in a wavelength of 400 nm or more and 800 nm or less.

The insulating layers 705 and 715 each preferably include oxygen, nitrogen, and silicon. The insulating layers 705 and 715 each preferably include, for example, silicon oxynitride. Moreover, the insulating layers 705 and 715 each preferably include silicon nitride or silicon nitride oxide. It is preferable that the insulating layers 705 and 715 be each formed using a silicon oxynitride film and a silicon nitride film, which are in contact with each other. The silicon oxynitride film and the silicon nitride film are alternately stacked so that antiphase interference occurs more often in a visible region, whereby the stack can have higher transmittance of light in the visible region.

There is no particular limitation on the structure of the transistor in the display panel. For example, a forward staggered transistor or an inverted staggered transistor may be used. Furthermore, a top-gate transistor or a bottom-gate transistor may be used. A semiconductor material used for the transistors is not particularly limited, and for example, silicon, germanium, or an organic semiconductor can be used. Alternatively, an oxide semiconductor containing at least one of indium, gallium, and zinc, such as an In—Ga—Zn-based metal oxide, may be used.

There is no particular limitation on the crystallinity of a semiconductor material used for the transistors, and an amorphous semiconductor or a semiconductor having crystallinity (a microcrystalline semiconductor, a polycrystalline semiconductor, a single-crystal semiconductor, or a semiconductor partly including crystal regions) may be used. It is preferable that a semiconductor having crystallinity be used, in which case deterioration of the transistor characteristics can be inhibited.

For stable characteristics of the transistor, a base film is preferably provided. The base film can be formed to have a single-layer structure or a stacked-layer structure using an inorganic insulating film such as a silicon oxide film, a silicon nitride film, a silicon oxynitride film, or a silicon nitride oxide film. The base film can be formed by a sputtering method, a chemical vapor deposition (CVD) method (e.g., a plasma CVD method, a thermal CVD method, or a metal organic CVD (MOCVD) method), an atomic layer deposition (ALD) method, a coating method, a printing method, or the like. Note that the base film is not necessarily provided. In each of the above structure examples, the insulating layer 705 can serve as a base film of the transistor.

As the light-emitting element, a self-luminous element can be used, and an element whose luminance is controlled by current or voltage is included in the category of the light-emitting element. For example, a light-emitting diode (LED), an organic EL element, an inorganic EL element, or the like can be used.

The light-emitting element may have any of a top emission structure, a bottom emission structure, and a dual emission structure. A conductive film that transmits visible light is used as the electrode through which light is extracted. A conductive film that reflects visible light is preferably used as the electrode through which light is not extracted.

The conductive film that transmits visible light can be formed using, for example, indium oxide, indium tin oxide (ITO), indium zinc oxide, zinc oxide (ZnO), or zinc oxide to which gallium is added. Alternatively, a film of a metal material such as gold, silver, platinum, magnesium, nickel, tungsten, chromium, molybdenum, iron, cobalt, copper, palladium, or titanium; an alloy containing any of these metal materials; a nitride of any of these metal materials (e.g., titanium nitride); or the like can be formed thin so as to transmit light. Alternatively, a stacked film of any of the above materials can be used as the conductive layer. For example, a stacked film of ITO and an alloy of silver and magnesium is preferably used, in which case conductivity can be increased. Further alternatively, graphene or the like may be used.

For the conductive film that reflects visible light, for example, a metal material, such as aluminum, gold, platinum, silver, nickel, tungsten, chromium, molybdenum, iron, cobalt, copper, or palladium or an alloy including any of these metal materials can be used. Lanthanum, neodymium, germanium, or the like may be added to the metal material or the alloy. Furthermore, an alloy containing aluminum (an aluminum alloy) such as an alloy of aluminum and titanium, an alloy of aluminum and nickel, an alloy of aluminum and neodymium, or an alloy of aluminum, nickel, and lanthanum (Al—Ni—La), or an alloy containing silver such as an alloy of silver and copper, an alloy of silver, palladium, and copper (Ag—Pd—Cu, also referred to as APC), or an alloy of silver and magnesium can be used for the conductive film. An alloy of silver and copper is preferable because of its high heat resistance. Moreover, a metal film or a metal oxide film is stacked on an aluminum alloy film, whereby oxidation of the aluminum alloy film can be suppressed. Examples of a material for the metal film or the metal oxide film are titanium and titanium oxide. Alternatively, the conductive film having a property of transmitting visible light and a film containing any of the above metal materials may be stacked. For example, a stacked film of silver and ITO or a stacked film of an alloy of silver and magnesium and ITO can be used.

The lower electrode 831, the upper electrode 835, and the conductive layers forming the auxiliary electrode 860 (the conductive layers 860a and 860b) can be formed of the conductive film that transmits visible light or the conductive film that reflects visible light.

The electrodes may be formed separately by an evaporation method or a sputtering method. Alternatively, a discharging method such as an ink-jet method, a printing method such as a screen printing method, or a plating method may be used.

When a voltage higher than the threshold voltage of the light-emitting element is applied between the lower electrode 831 and the upper electrode 835, holes are injected to the EL layer 833 from the anode side and electrons are injected to the EL layer 833 from the cathode side. The injected electrons and holes are recombined in the EL layer 833 and a light-emitting substance contained in the EL layer 833 emits light.

The EL layer 833 includes at least a light-emitting layer. In addition to the light-emitting layer, the EL layer 833 may further include one or more layers containing any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

For the EL layer 833, either a low molecular compound or a high molecular compound can be used, and an inorganic compound may also be used. Each of the layers included in the EL layer 833 can be formed by any of the following methods: an evaporation method (including a vacuum evaporation method), a transfer method, a printing method, an inkjet method, a coating method, and the like.

The light-emitting element 830 may contain two or more kinds of light-emitting substances. Thus, for example, a light-emitting element that emits white light can be achieved. For example, a white emission can be obtained by selecting light-emitting substances so that two or more kinds of light-emitting substances emit light of complementary colors. A light-emitting substance that emits red (R) light, green (G) light, blue (B) light, yellow (Y) light, or orange (O) light or a light-emitting substance that emits light containing spectral components of two or more of R light, G light, and B light can be used, for example. A light-emitting substance that emits blue light and a light-emitting substance that emits yellow light may be used, for example. At this time, the emission spectrum of the light-emitting substance that emits yellow light preferably contains spectral components of G light and R light. The emission spectrum of the light-emitting element 830 preferably has two or more peaks in the wavelength range in a visible region (e.g.; greater than or equal to 350 nm and less than or equal to 750 nm or greater than or equal to 400 nm and less than or equal to 800 nm).

The EL layer 833 may include a plurality of light-emitting layers. In the EL layer 833, the plurality of light-emitting layers may be stacked in contact with one another or may be stacked with a separation layer provided therebetween. The separation layer may be provided between a fluorescent layer and a phosphorescent layer, for example.

The separation layer can be provided, for example, to prevent energy transfer by the Dexter mechanism (particularly triplet energy transfer) from a phosphorescent material or the like in an excited state which is generated in the phosphorescent layer to a fluorescent material or the like in the fluorescent layer. The thickness of the separation layer may be several nanometers. Specifically, the thickness of the separation layer may be greater than or equal to 0.1 nm and less than or equal to 20 nm, greater than or equal to 1 nm and less than or equal to 10 nm, or greater than or equal to 1 nm and less than or equal to 5 nm. The separation layer contains a single material (preferably, a bipolar substance) or a plurality of materials (preferably, a hole-transport material and an electron-transport material).

The separation layer may be formed using a material contained in a light-emitting layer in contact with the separation layer. This facilitates the manufacture of the light-emitting element and reduces the drive voltage. For example, in the case where the phosphorescent layer includes a host material, an assist material, and a phosphorescent material (guest material), the separation layer may be formed using the host material and the assist material. In other words, the separation layer includes a region not containing the phosphorescent material and the phosphorescent layer includes a region containing the phosphorescent material in the above structure. Accordingly, the separation layer and the phosphorescent layer can be evaporated separately depending on whether a phosphorescent material is used or not. With such a structure, the separation layer and the phosphorescent layer can be formed in the same chamber. Thus, the manufacturing costs can be reduced.

Moreover, the light-emitting element 830 may be a single element including one EL layer or a tandem element in which EL layers are stacked with a charge generation layer provided therebetween.

The light-emitting element is preferably provided between a pair of insulating films having an excellent moisture-proof property. In that case, entry of an impurity such as moisture into the light-emitting element can be inhibited, leading to inhibition of a decrease in the reliability of the display panel.

As the insulating layer 815 and the insulating layer 816, for example, an inorganic insulating film such as a silicon oxide film, a silicon oxynitride film, or an aluminum oxide film can be used. Note that the insulating layer 815 and the insulating layer 816 may be formed using different materials. As the insulating layer 817, the insulating layer 817a, and the insulating layer 817b, an organic material such as polyimide, acrylic, polyamide, polyimide amide, or a benzocyclobutene-based resin can be used, for example. Alternatively, a low-dielectric constant material (a low-k material) or the like can be used. Furthermore, each insulating layer may be formed by stacking a plurality of insulating films.

The insulating layer 821 is formed using an organic insulating material or an inorganic insulating material. As the resin, for example, a polyimide resin, a polyamide resin, an acrylic resin, a siloxane resin, an epoxy resin, or a phenol resin can be used. It is particularly preferable that the insulating layer 821 be formed using a photosensitive resin material to have an opening portion over the lower electrode 831 so that a side wall of the opening portion is formed as an inclined surface with a continuous curvature.

There is no particular limitation on the method for forming the insulating layer 821; a photolithography method, a sputtering method, an evaporation method, a droplet discharging method (e.g., an inkjet method), a printing method (e.g., a screen printing method or an off-set printing method), or the like may be used.

The spacer 823 can be formed using an inorganic insulating material, an organic insulating material, a metal material, or the like. As the inorganic insulating material and the organic insulating material, for example, a variety of materials that can be used for the insulating layer can be used. As the metal material, titanium, aluminum, or the like can be used. When the spacer 823 containing a conductive material is electrically connected to the upper electrode 835, a potential drop due to the resistance of the upper electrode 835 can be inhibited. The spacer 823 may have either a tapered shape or an inverse tapered shape.

For example, a conductive layer functioning as an electrode or a wiring of the transistor, an auxiliary electrode of the light-emitting element, or the like, which is used for the display panel, can be formed to have a single-layer structure or a stacked-layer structure using any of metal materials such as molybdenum, titanium, chromium, tantalum, tungsten, aluminum, copper, neodymium, and scandium, and an alloy material containing any of these elements. Alternatively, the conductive layer may be formed using a conductive metal oxide. As the conductive metal oxide, indium oxide (e.g., $In_2O_3$), tin oxide (e.g., $SnO_2$), ZnO, ITO, indium zinc oxide (e.g., $In_2O_3$—ZnO), or any of these metal oxide materials in which silicon oxide is contained can be used.

The coloring layer is a colored layer that transmits light in a specific wavelength range. For example, a color filter for transmitting light in a red, green, blue, or yellow wavelength range can be used. Each coloring layer is formed in a desired position with any of various materials by a printing method, an inkjet method, an etching method using a photolithography method, or the like. In a white sub-pixel, a resin such as a transparent resin or a white resin may be provided so as to overlap with the light-emitting element.

The light-blocking layer is provided between the adjacent coloring layers. The light-blocking layer blocks light emitted from an adjacent light-emitting element to inhibit color mixture between adjacent light-emitting elements. Here, the coloring layer is provided such that its end portion overlaps with the light-blocking layer, whereby light leakage can be reduced. As the light-blocking layer, a material that can block light from the light-emitting element can be used; for example, a black matrix is formed using a resin material containing a metal material, pigment, or dye. Note that it is preferable to provide the light-blocking layer in a region other than the display portion, such as a driver circuit portion, in which case undesired leakage of guided light or the like can be inhibited.

Furthermore, an overcoat covering the coloring layer and the light-blocking layer may be provided. The overcoat can prevent an impurity and the like contained in the coloring layer from being diffused into the light-emitting element. The overcoat is formed with a material that transmits light emitted from the light-emitting element; for example, an inorganic insulating film such as a silicon nitride film or a silicon oxide film, an organic insulating film such as an acrylic film or a polyimide film can be used, and further, a stacked-layer structure of an organic insulating film and an inorganic insulating film may be employed.

In the case where upper surfaces of the coloring layer and the light-blocking layer are coated with a material of the adhesive layer, a material which has high wettability with respect to the material of the adhesive layer is preferably used as the material of the overcoat. For example, an oxide conductive film such as an ITO film or a metal film such as an Ag film which is thin enough to transmit light is preferably used as the overcoat.

As the connector, any of a variety of anisotropic conductive films (ACF), anisotropic conductive pastes (ACP), and the like can be used.

In this specification and the like, a display element, a display panel which is a panel including a display element, a light-emitting element, and a light-emitting panel which is a panel including a light-emitting element can employ various modes or can include various elements. A display element, a display panel, a light-emitting element, or a light-emitting panel may include a display medium whose contrast, luminance, reflectivity, transmittance, or the like is changed by electrical or magnetic effect, such as an EL element (e.g., an EL element including organic and inorganic materials, an organic EL element, or an inorganic EL element), an LED (e.g., a white LED, a red LED, a green LED, or a blue LED), a transistor (a transistor which emits light depending on current), an electron emitter, a liquid crystal element, electronic ink, an electrophoretic element, a grating light valve (GLV), a plasma display panel (PDP), a display element including micro electro mechanical systems (MEMS), a digital micromirror device (DMD), a digital micro shutter (DMS), an interferometric modulator display (IMOD) element, an MEMS shutter display element, optical interference type MEMS display element, an electrowetting element, a piezoelectric ceramic display, and a display element including a carbon nanotube. Note that examples of a display panel having an EL element include an EL display. Examples of a display panel having an electron emitter include a field emission display (FED) and an SED-type flat panel display (SED: surface-conduction electron-emitter display). Examples of a display panel having a liquid crystal element include a liquid crystal display (e.g., a transmissive liquid crystal display, a transflective liquid crystal display, a reflective liquid crystal display, a direct-view liquid crystal display, or a projection liquid crystal display). Examples of a display panel having electronic ink, ELECTRONIC LIQUID POWDER (registered trademark), or an electrophoretic element include electronic paper. In the case of a transflective liquid crystal display or a reflective liquid crystal display, some of or all of pixel electrodes function as reflective electrodes. For example, some or all of pixel electrodes are formed to contain aluminum or silver. Furthermore, in such a case, a memory circuit such as an SRAM can be provided under the reflective electrodes, leading to lower power consumption. Note that in the case of using an LED, graphene or graphite may be provided under an electrode or a nitride semiconductor of the LED. Graphene or graphite may be a multilayer film in which a plurality of layers are stacked. As described above, provision of graphene or graphite enables easy formation of a nitride semiconductor film thereover, such as an n-type GaN semiconductor layer including crystals. Furthermore, a p-type GaN semiconductor layer including crystals or the like can be provided thereover, and thus the LED can be formed. Note that an AlN layer may be provided between the n-type GaN semiconductor layer including crystals and graphene or graphite. The GaN semiconductor layers included in the LED may be formed by MOCVD. Note that when the graphene is provided, the GaN semiconductor layers included in the LED can also be formed by a sputtering method.

For example, in this specification and the like, an active matrix method in which an active element (a non-linear element) is included in a pixel or a passive matrix method in which an active element is not included in a pixel can be used.

In the active matrix method, not only a transistor but also a variety of active elements can be used. For example, an MIM (metal insulator metal), a TFD (thin film diode), or the like can also be used. Since such an element has few numbers of manufacturing steps, manufacturing cost can be reduced or yield can be improved. Alternatively, since the size of these elements is small, the aperture ratio can be improved, so that power consumption can be reduced or higher luminance can be achieved.

Since an active element is not used in the passive matrix method, the number of manufacturing steps can be reduced, so that manufacturing cost can be reduced or the yield can be improved. Alternatively, since an active element is not used in the passive matrix method, the aperture ratio can be improved, so that power consumption can be reduced or higher luminance can be achieved, for example.

Note that the light-emitting panel of one embodiment of the present invention may be used as a display panel or as a lighting panel. For example, it may be used as a light source such as a backlight or a front light, that is, a lighting panel for a display panel.

As described above, by using the display panel including the transparent portion described as an example in this embodiment, a large-sized display device in which a joint portion of the display portions is hardly seen and display unevenness is reduced can be obtained.

This embodiment can be combined with any other embodiment as appropriate.

Embodiment 3

In this embodiment, a touch panel that can be used in a display device of one embodiment of the present invention will be described with reference to drawings. Note that the above description can be referred to for the components of the touch panel, which are similar to those of the display panel described in Embodiment 2. Although a touch panel including a light-emitting element is described as an example in this embodiment, one embodiment of the present invention is not limited thereto. For example, a touch panel including another element (e.g., a display element), the example of which is shown in Embodiment 2, can also be used in the display device of one embodiment of the present invention.

Structure Example 1

Figure 18A:
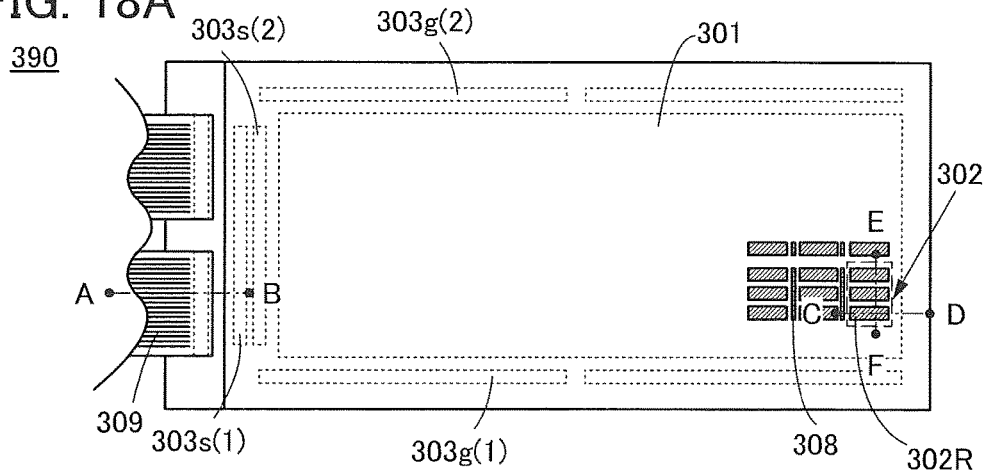
FIGS. 18A to 18C illustrate a touch panel according to one embodiment.
Figure 18B:
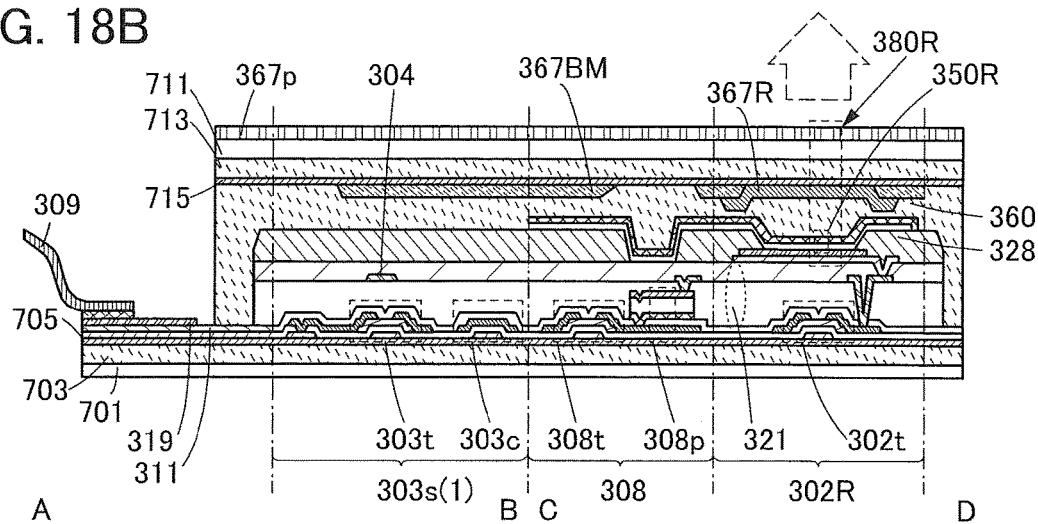
Figure 18C:
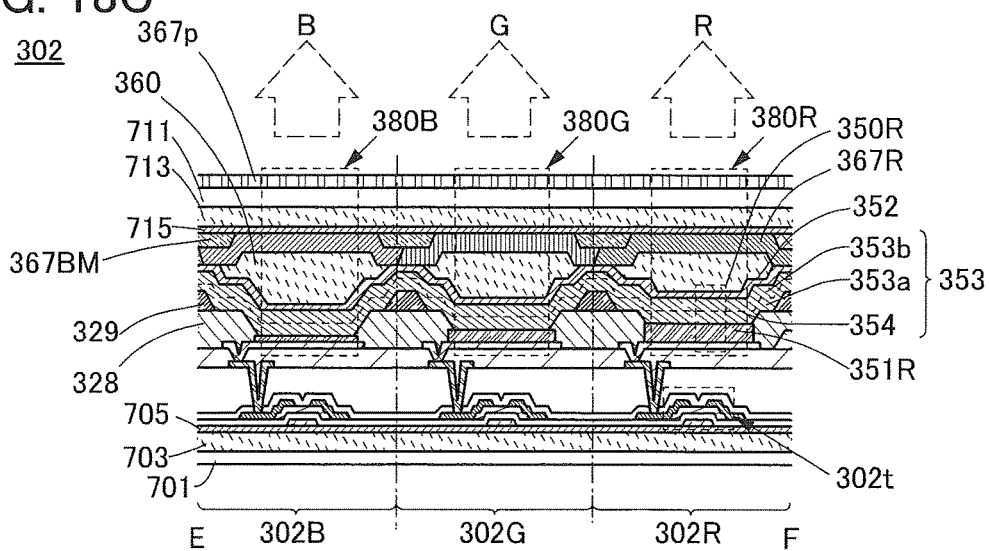

FIG. 18A is a top view of the touch panel. FIG. 18B is a cross-sectional view taken along the dashed-dotted line A-B and the dashed-dotted line C-D in FIG. 18A. FIG. 18C is a cross-sectional view taken along the dashed-dotted line E-F in FIG. 18A.

A touch panel 390 illustrated in FIG. 18A includes a display portion 301 (serving also as an input portion), a scan line driver circuit 303g(1), an imaging pixel driver circuit 303g(2), an image signal line driver circuit 303s(1), and an imaging signal line driver circuit 303s(2).

The display portion 301 includes a plurality of pixels 302 and a plurality of imaging pixels 308.

The pixel 302 includes a plurality of sub-pixels. Each sub-pixel includes a light-emitting element and a pixel circuit.

The pixel circuits can supply electric power for driving the light-emitting element. The pixel circuits are electrically connected to wirings through which selection signals are supplied. The pixel circuits are also electrically connected to wirings through which image signals are supplied.

The scan line driver circuit 303g(1) can supply selection signals to the pixels 302.

The image signal line driver circuit 303s(1) can supply image signals to the pixels 302.

A touch sensor can be formed using the imaging pixels 308. Specifically, the imaging pixels 308 can sense a touch of a finger or the like on the display portion 301.

The imaging pixels 308 include photoelectric conversion elements and imaging pixel circuits.

The imaging pixel circuits can drive photoelectric conversion elements. The imaging pixel circuits are electrically connected to wirings through which control signals are supplied. The imaging pixel circuits are also electrically connected to wirings through which power supply potentials are supplied.

Examples of the control signal include a signal for selecting an imaging pixel circuit from which a recorded imaging signal is read, a signal for initializing an imaging pixel circuit, and a signal for determining the time it takes for an imaging pixel circuit to sense light.

The imaging pixel driver circuit 303g(2) can supply control signals to the imaging pixels 308.

The imaging signal line driver circuit 303s(2) can read out imaging signals.

As illustrated in FIGS. 18B and 18C, the touch panel 390 includes the substrate 701, the adhesive layer 703, the insulating layer 705, the substrate 711, the adhesive layer 713, and the insulating layer 715. The substrates 701 and 711 are bonded to each other with an adhesive layer 360.

The substrate 701 and the insulating layer 705 are bonded to each other with the adhesive layer 703. The substrate 711 and the insulating layer 715 are bonded to each other with the adhesive layer 713.

The substrates 701 and 711 are preferably flexible.

Embodiment 2 can be referred to for materials used for the substrates, the adhesive layers, and the insulating layers.

Each of the pixels 302 includes the sub-pixel 302R, a sub-pixel 302G, and a sub-pixel 302B (see FIG. 18C). The sub-pixel 302R includes a light-emitting module 380R, the sub-pixel 302G includes a light-emitting module 380G, and the sub-pixel 302B includes a light-emitting module 380B.

For example, the sub-pixel 302R includes the light-emitting element 350R and the pixel circuit. The pixel circuit includes a transistor 302t that can supply electric power to the light-emitting element 350R. Furthermore, the light-emitting module 380R includes the light-emitting element 350R and an optical element (e.g., a coloring layer 367R that transmits red light).

The light-emitting element 350R includes a lower electrode 351R, an EL layer 353, and an upper electrode 352, which are stacked in this order (see FIG. 18C).

The EL layer 353 includes a first EL layer 353a, an intermediate layer 354, and a second EL layer 353b, which are stacked in this order.

Note that a microcavity structure can be provided for the light-emitting module 380R so that light with a specific wavelength can be efficiently extracted. Specifically, an EL layer may be provided between a film that reflects visible light and a film that partly reflects and partly transmits visible light, which are provided so that light with a specific wavelength can be efficiently extracted.

The light-emitting module 380R, for example, includes the adhesive layer 360 that is in contact with the light-emitting element 350R and the coloring layer 367R.

The coloring layer 367R is positioned in a region overlapping with the light-emitting element 350R. Accordingly, part of light emitted from the light-emitting element 350R passes through the adhesive layer 360 and the coloring layer 367R and is emitted to the outside of the light-emitting module 380R as indicated by an arrow in FIG. 18B or 18C.

The touch panel 390 includes a light-blocking layer 367BM. The light-blocking layer 367BM is provided so as to surround the coloring layer (e.g., the coloring layer 367R).

The touch panel 390 includes an anti-reflective layer 367p positioned in a region overlapping with the display portion 301. As the anti-reflective layer 367p, a circular polarizing plate can be used, for example.

The touch panel 390 includes an insulating layer 321. The insulating layer 321 covers the transistor 302t and the like. Note that the insulating layer 321 can be used as a layer for covering unevenness caused by the pixel circuits and the imaging pixel circuits. An insulating layer on which a layer that can inhibit diffusion of impurities to the transistor 302t and the like is stacked can be used as the insulating layer 321.

The touch panel 390 includes a partition 328 that overlaps with an end portion of the lower electrode 351R. In addition, a spacer 329 that controls the distance between the substrate 701 and the substrate 711 is provided on the partition 328.

The image signal line driver circuit 303s(1) includes a transistor 303t and a capacitor 303c. Note that the driver circuit can be formed in the same process and over the same substrate as those of the pixel circuits. As illustrated in FIG. 18B, the transistor 303t may include a second gate 304 over the insulating layer 321. The second gate 304 may be electrically connected to a gate of the transistor 303t, or different potentials may be supplied to these gates. Alternatively, if necessary, the second gate 304 may be provided for a transistor 308t, the transistor 302t, or the like.

The imaging pixels 308 each include a photoelectric conversion element 308p and an imaging pixel circuit. The imaging pixel circuit can sense light received by the photoelectric conversion element 308*p*. The imaging pixel circuit includes the transistor 308*t*.

For example, a PIN photodiode can be used as the photoelectric conversion element 308*p*.

The touch panel 390 includes a wiring 311 through which a signal is supplied. The wiring 311 is provided with a terminal 319. Note that an FPC 309 through which a signal such as an image signal or a synchronization signal is supplied is electrically connected to the terminal 319. Note that a printed wiring board (PWB) may be attached to the FPC 309.

Note that transistors such as the transistors 302*t*, 303*t*, and 308*t* can be formed in the same process. Alternatively, the transistors may be formed in different processes.

Structure Example 2

Figure 19A:
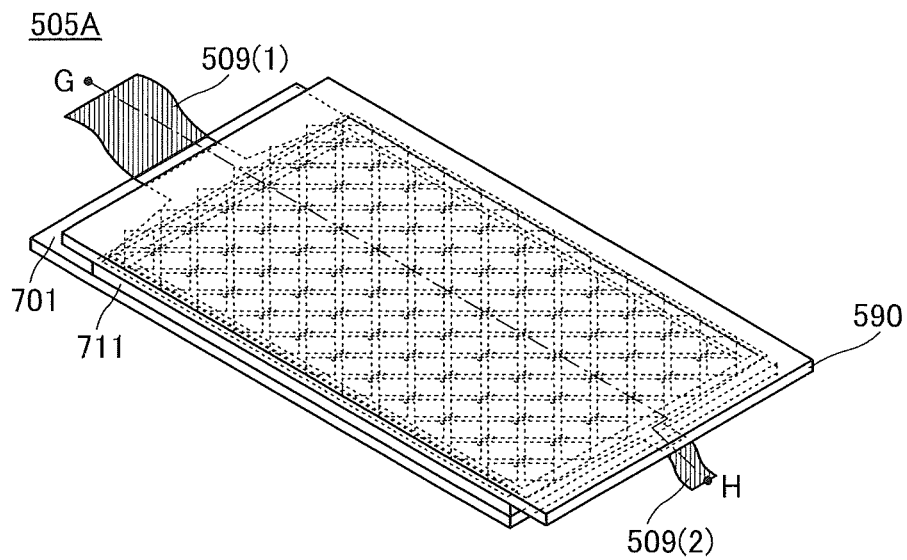
FIGS. 19A and 19B illustrate a touch panel according to one embodiment.
Figure 19B:
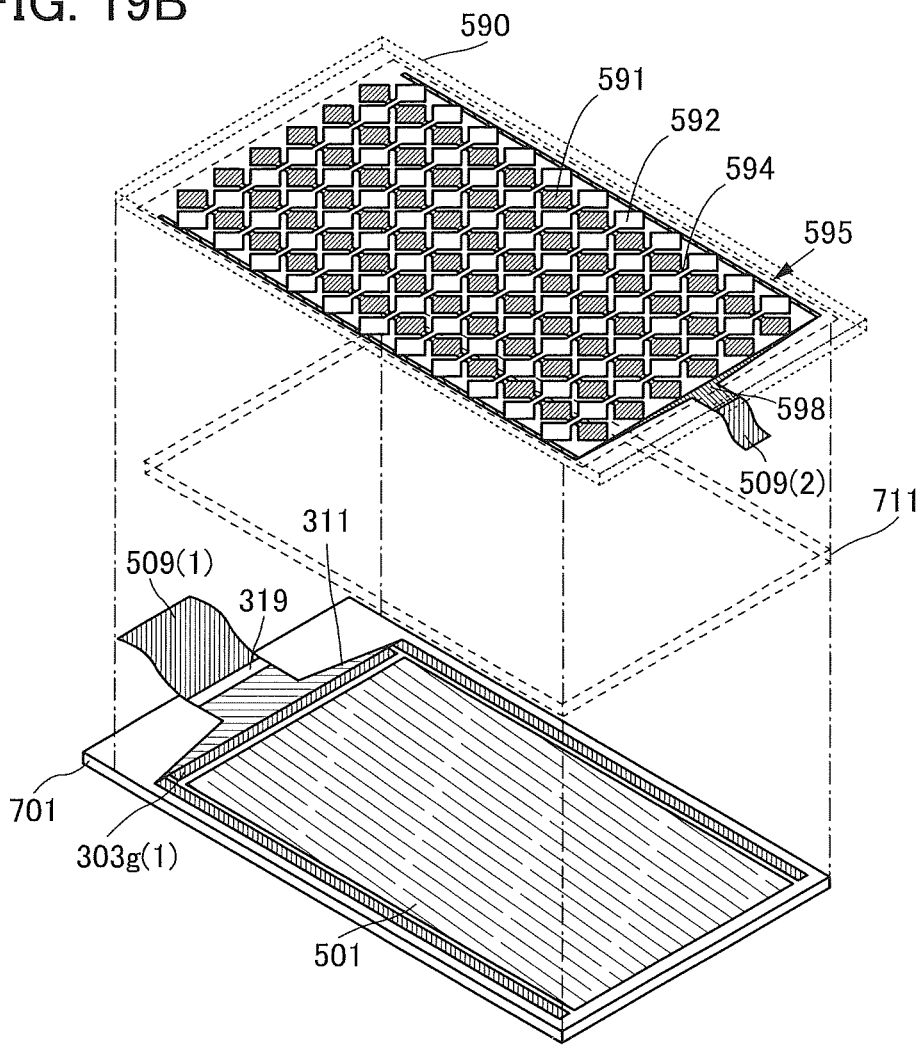
Figure 20A:
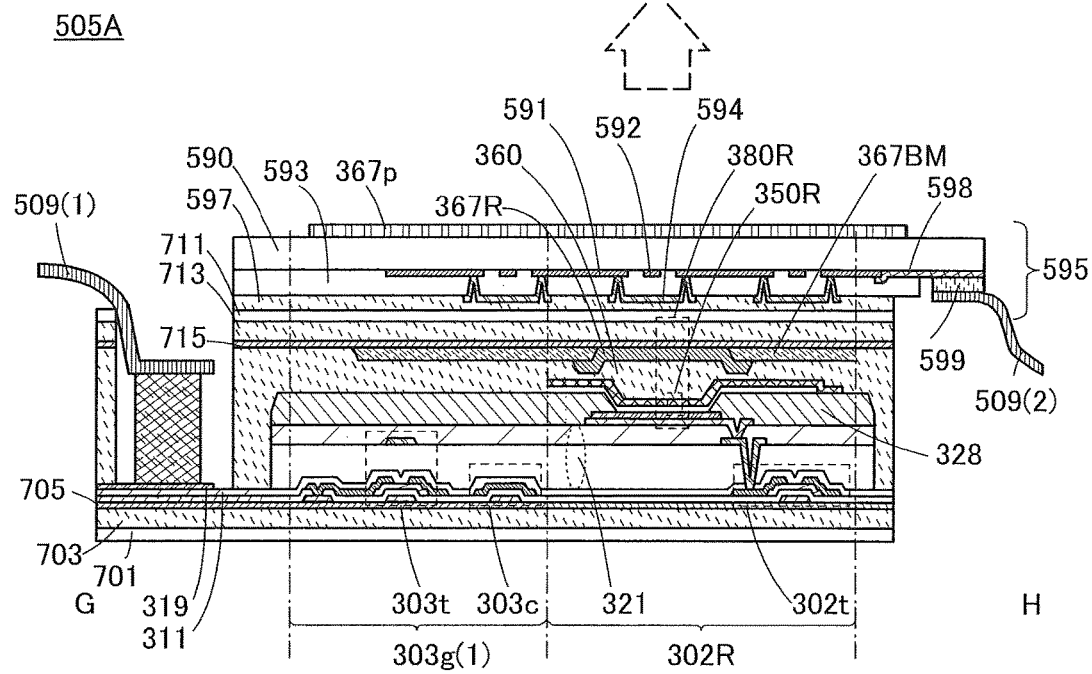
FIGS. 20A to 20C illustrate touch panels according to one embodiment.

FIGS. 19A and 19B are perspective views of a touch panel 505A. Note that FIGS. 19A and 19B illustrate only main components for simplicity. FIG. 20A is a cross-sectional view taken along the dashed-dotted line G-H in FIG. 19A.

As illustrated in FIGS. 19A and 19B, the touch panel 505A includes a display portion 501, the scan line driver circuit 303*g*(1), a touch sensor 595, and the like. Furthermore, the touch panel 505A includes the substrate 701, the substrate 711, and a substrate 590.

The touch panel 505A includes a plurality of pixels and a plurality of wirings 311. The plurality of wirings 311 can supply signals to the pixels. The plurality of wirings 311 are led to a peripheral portion of the substrate 701, and part of the plurality of wirings 311 form the terminal 319. The terminal 319 is electrically connected to an FPC 509(1).

The touch panel 505A includes the touch sensor 595 and a plurality of wirings 598. The plurality of wirings 598 are electrically connected to the touch sensor 595. The plurality of wirings 598 are led to a peripheral portion of the substrate 590, and part of the plurality of wirings 598 form a terminal. The terminal is electrically connected to an FPC 509(2). Note that in FIG. 19B, electrodes, wirings, and the like of the touch sensor 595 provided on the back side of the substrate 590 (the side facing the substrate 701) are indicated by solid lines for clarity.

As the touch sensor 595, for example, a capacitive touch sensor can be used. Examples of the capacitive touch sensor include a surface capacitive touch sensor and a projected capacitive touch sensor. An example of using a projected capacitive touch sensor is described here.

Examples of the projected capacitive touch sensor include a self capacitive touch sensor and a mutual capacitive touch sensor, which differ mainly in the driving method. The use of a mutual capacitive type is preferred because multiple points can be sensed simultaneously.

Note that a variety of sensors that can sense the closeness or the contact of a sensing target such as a finger can be used as the touch sensor 595.

The projected capacitive touch sensor 595 includes electrodes 591 and electrodes 592. The electrodes 591 are electrically connected to any of the plurality of wirings 598, and the electrodes 592 are electrically connected to any of the other wirings 598.

The electrodes 592 each have a shape of a plurality of quadrangles arranged in one direction with one corner of a quadrangle connected to one corner of another quadrangle as illustrated in FIGS. 19A and 19B.

The electrodes 591 each have a quadrangular shape and are arranged in a direction intersecting with the direction in which the electrodes 592 extend. Note that the plurality of electrodes 591 is not necessarily arranged in the direction orthogonal to one electrode 592 and may be arranged to intersect with one electrode 592 at an angle of less than 90 degrees.

The wiring 594 intersects with the electrode 592. The wiring 594 electrically connects two electrodes 591 between which the electrode 592 is positioned. The intersecting area of the electrode 592 and the wiring 594 is preferably as small as possible. Such a structure allows a reduction in the area of a region where the electrodes are not provided, reducing unevenness in transmittance. As a result, unevenness in luminance of light from the touch sensor 595 can be reduced.

Note that the shapes of the electrodes 591 and the electrodes 592 are not limited to the above-mentioned shapes and can be any of a variety of shapes. For example, the plurality of electrodes 591 may be provided so that space between the electrodes 591 are reduced as much as possible, and a plurality of electrodes 592 may be provided with an insulating layer sandwiched between the electrodes 591 and the electrodes 592 and may be spaced apart from each other to form a region not overlapping with the electrodes 591. In that case, between two adjacent electrodes 592, it is preferable to provide a dummy electrode which is electrically insulated from these electrodes, whereby the area of a region having a different transmittance can be reduced.

Note that a more specific structure example of the touch sensor 595 will be described later.

As illustrated in FIG. 20A, the touch panel 505A includes the substrate 701, the adhesive layer 703, the insulating layer 705, the substrate 711, the adhesive layer 713, and the insulating layer 715. The substrates 701 and 711 are bonded to each other with the adhesive layer 360.

An adhesive layer 597 bonds the substrate 590 to the substrate 711 so that the touch sensor 595 overlaps with the display portion 501. The adhesive layer 597 transmits light.

The electrodes 591 and the electrodes 592 are formed using a conductive material that transmits light. As a light-transmitting conductive material, a conductive oxide such as indium oxide, indium tin oxide, indium zinc oxide, zinc oxide, or zinc oxide to which gallium is added can be used. Note that a film including graphene may be used as well. The film including graphene can be formed, for example, by reducing a film including graphene oxide. As a reducing method, a method with application of heat or the like can be employed.

The resistance of a material used for conductive films such as the electrodes 591, the electrodes 592, and the wiring 594, i.e., a wiring and an electrode in the touch panel, is preferably low. Examples of the material include ITO, indium zinc oxide, ZnO, silver, copper, aluminum, a carbon nanotube, and graphene. Alternatively, a metal nanowire including a number of conductors with an extremely small width (for example, a diameter of several nanometers) may be used. Note that a metal nanowire, a carbon nanotube, graphene, or the like may be used for an electrode of the display element, e.g., a pixel electrode or a common electrode because of its high transmittance.

The electrodes 591 and the electrodes 592 may be formed by depositing a light-transmitting conductive material on the substrate 590 by a sputtering method and then removing an unnecessary portion by a variety of patterning technique such as photolithography.

The electrodes 591 and the electrodes 592 are covered with an insulating layer 593. Furthermore, openings reaching the electrodes 591 are Ruined in the insulating layer 593, and the wiring 594 electrically connects the adjacent electrodes 591. A light-transmitting conductive material can be favorably used as the wiring 594 because the aperture ratio of the touch panel can be increased. Moreover, a material with higher conductivity than the conductivities of the electrodes 591 and the electrodes 592 can be favorably used for the wiring 594 because electric resistance can be reduced.

Note that an insulating layer covering the insulating layer 593 and the wiring 594 may be provided to protect the touch sensor 595.

Furthermore, a connection layer 599 electrically connects the wirings 598 to the FPC 509(2).

The display portion 501 includes a plurality of pixels arranged in a matrix. Each pixel has the same structure as Structure Example 1; thus, description is omitted.

Any of various kinds of transistors can be used in the touch panel. A structure in the case of using bottom-gate transistors is illustrated in FIGS. 20A and 20B.

For example, a semiconductor layer containing an oxide semiconductor, amorphous silicon, or the like can be used in the transistor 302$t$ and the transistor 303$t$ illustrated in FIG. 20A.

Figure 20B:
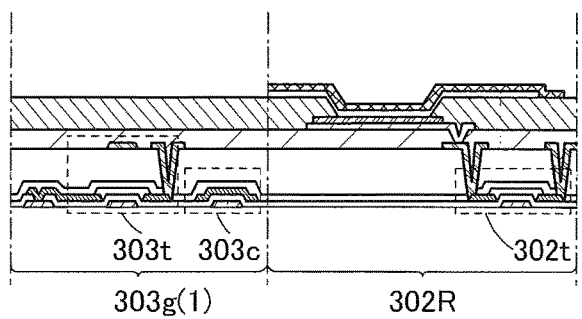

For example, a semiconductor layer containing polycrystalline silicon that is obtained by crystallization process such as laser annealing can be used in the transistor 302$t$ and the transistor 303$t$ illustrated in FIG. 20B.

Figure 20C:
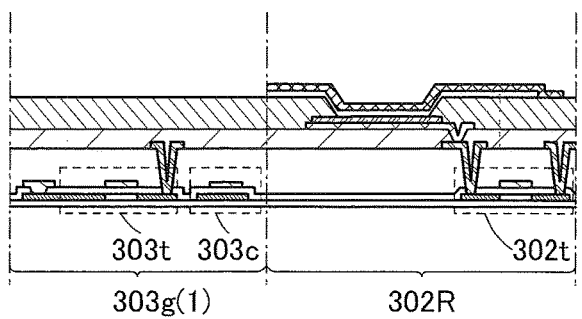

A structure in the case of using top-gate transistors is illustrated in FIG. 20C.

For example, a semiconductor layer including polycrystalline silicon, a single crystal silicon film that is transferred from a single crystal silicon substrate, or the like can be used in the transistor 302$t$ and the transistor 303$t$ illustrated in FIG. 20C.

Structure Example 3

Figure 21A:
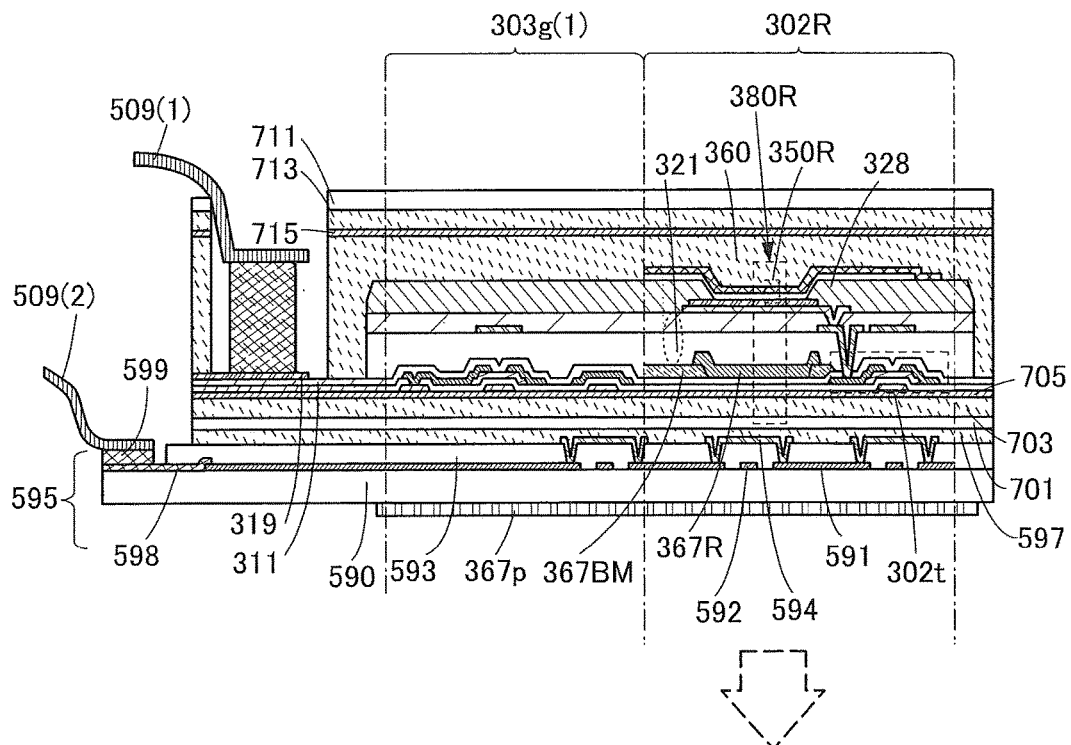
FIGS. 21A to 21C illustrate touch panels according to one embodiment.
Figure 21B:
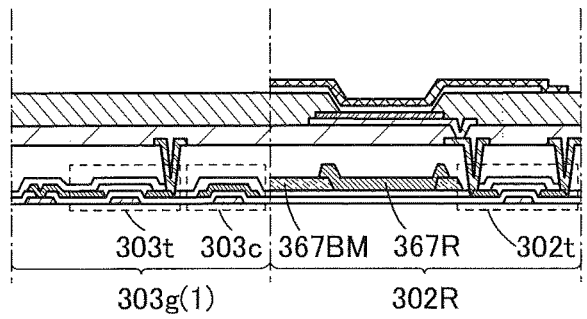
Figure 21C:
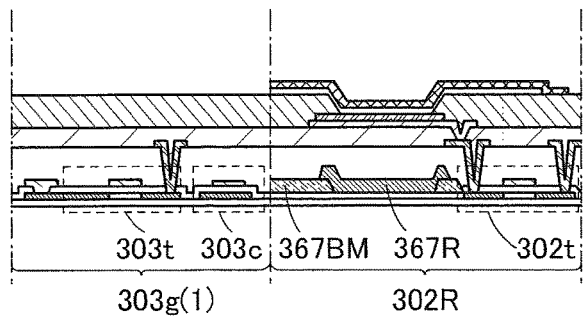

FIGS. 21A to 21C are cross-sectional views of a touch panel 505B. The touch panel 505B described in this embodiment is different from the touch panel 505A in Structure Example 2 in that received image data is displayed on the side where the transistors are provided, that the touch sensor is provided on the substrate 701 side of the display portion, and that the FPC 509(2) is provided on the same side as the FPC 509(1). Different structures will be described in detail below, and the above description is referred to for the other similar structures.

The coloring layer 367R is positioned in a region overlapping with the light-emitting element 350R. The light-emitting element 350R illustrated in FIG. 21A emits light to the side where the transistor 302$t$ is provided. Accordingly, part of light emitted from the light-emitting element 350R passes through the coloring layer 367R and is emitted to the outside of the light-emitting module 380R as indicated by an arrow in FIG. 21A.

The touch panel 505B includes the light-blocking layer 367BM on the light extraction side. The light-blocking layer 367BM is provided so as to surround the coloring layer (e.g., the coloring layer 367R).

The touch sensor 595 is provided not on the substrate 711 side but on the substrate 701 side (see FIG. 21A).

The adhesive layer 597 bonds the substrate 590 to the substrate 701 so that the touch sensor 595 overlaps with the display portion. The adhesive layer 597 transmits light.

Note that a structure in the case of using bottom-gate transistors in the display portion 501 is illustrated in FIGS. 21A and 21B.

For example, a semiconductor layer containing an oxide semiconductor, amorphous silicon, or the like can be used in the transistor 302$t$ and the transistor 303$t$ illustrated in FIG. 21A.

For example, a semiconductor layer containing polycrystalline silicon can be used in the transistor 302$t$ and the transistor 303$t$ illustrated in FIG. 21B.

A structure in the case of using top-gate transistors is illustrated in FIG. 21C.

For example, a semiconductor layer containing polycrystalline silicon, a single crystal silicon film that is transferred, or the like can be used in the transistor 302$t$ and the transistor 303$t$ illustrated in FIG. 21C.

Structural Example of Touch Sensor

A more specific structure example of the touch sensor 595 is described below with reference to drawings.

Figure 22A:
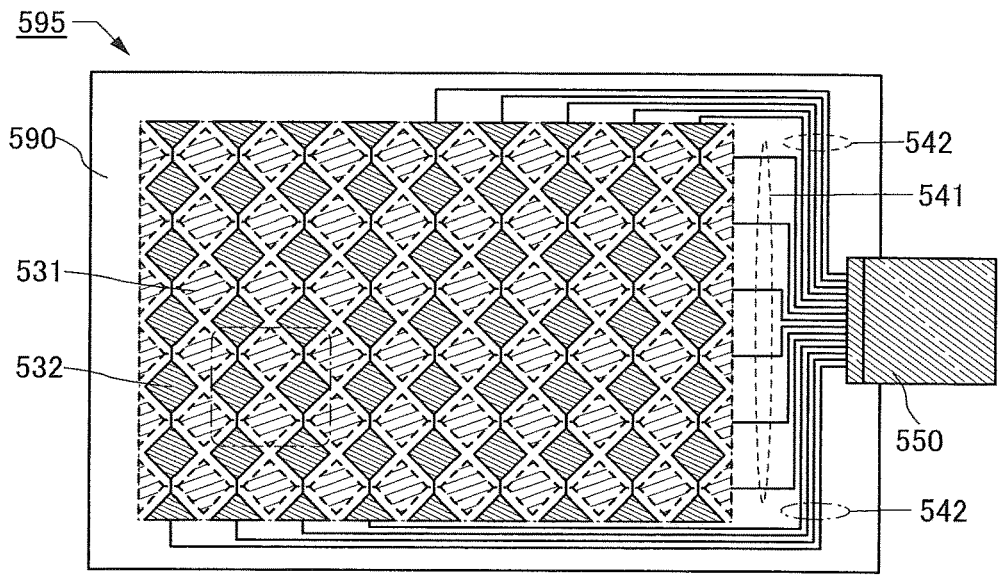
FIGS. 22A to 22D illustrate touch panels according to one embodiment.

FIG. 22A is a schematic top view of the touch sensor 595. The touch sensor 595 includes a plurality of electrodes 531, a plurality of electrodes 532, a plurality of wirings 541, and a plurality of wirings 542 over a substrate 590. The substrate 590 is provided with an FPC 550 which is electrically connected to each of the plurality of wirings 541 and the plurality of wirings 542.

Figure 22B:
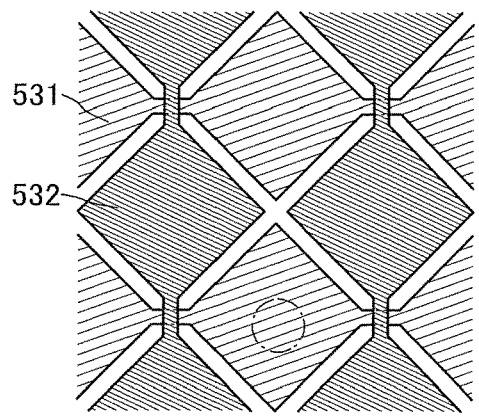

FIG. 22B shows an enlarged view of a region surrounded by a dashed dotted line in FIG. 22A. The electrodes 531 are each in the form of a series of rhombic electrode patterns aligned in a lateral direction of this figure. The rhombic electrode patterns aligned in a line are electrically connected to each other. The electrodes 532 are also each in the form of a series of rhombic electrode patterns aligned in a longitudinal direction in this figure and the rhombic electrode patterns aligned in a line are electrically connected. Part of the electrode 531 and part of the electrode 532 overlap and intersect with each other. At this intersection portion, an insulator is sandwiched in order to avoid an electrical short-circuit between the electrode 531 and the electrode 532.

Figure 22C:
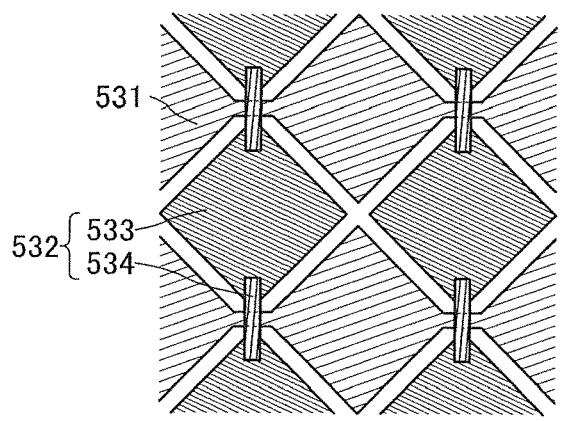

As shown in FIG. 22C, the electrodes 532 may form a plurality of island-shape rhombic electrodes 533 and bridge electrodes 534. The plurality of island-shape rhombic electrodes 533 are aligned in a longitudinal direction in this figure, and two adjacent electrodes 533 are electrically connected to each other by the bridge electrode 534. Such a structure makes it possible that the electrodes 533 and the electrodes 531 can be formed at the same time by processing the same conductive film. This can prevent variations in the thickness of these films, and can prevent the resistance value and the light transmittance of each electrode from varying from place to place. Note that although the electrodes 532 include the bridge electrodes 534 here, the electrodes 531 may have such a structure.

Figure 22D:
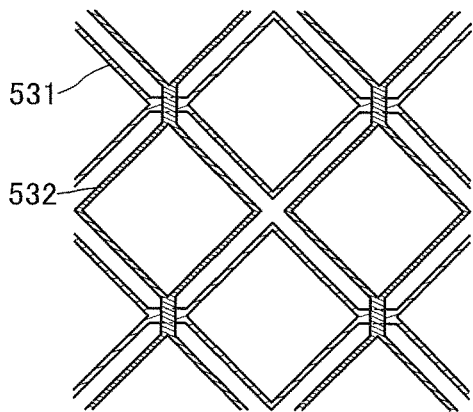

As shown in FIG. 22D, a design in which rhombic electrode patterns of the electrodes 531 and 532 shown in FIG. 22B are hollowed out and only edge portions are left may be used. At that time, when the electrodes 531 and the electrodes 532 are too small in width for the users to see, the electrodes 531 and the electrodes 532 can be formed using a light-blocking material such as a metal or an alloy, as described later. In addition, either the electrodes 531 or the electrodes 532 shown in FIG. 22D may include the above bridge electrodes 534.

One of the electrodes 531 is electrically connected to one of the wirings 541. One of the electrodes 532 is electrically connected to one of the wirings 542.

When a touch panel is formed in such a manner that the touch sensor 595 is stacked over a display surface of the display panel, a light-transmitting conductive material is preferably used for the electrodes 531 and the electrodes 532. In the case where a light-transmitting conductive material is used for the electrodes 531 and the electrodes 532 and light from the display panel is extracted through the electrodes 531 or the electrodes 532, it is preferable that a conductive film containing the same conductive material be arranged between the electrodes 531 and the electrodes 532 as a dummy pattern. Part of a space between the electrodes 531 and the electrodes 532 is filled with the dummy pattern, which can reduce variation in light transmittance. As a result, unevenness in luminance of light transmitted through the touch sensor 595 can be reduced.

As a light-transmitting conductive material, a conductive oxide such as indium oxide, indium tin oxide, indium zinc oxide, zinc oxide, or zinc oxide to which gallium is added can be used. Note that a film including graphene can be used as well. The film including graphene can be formed, for example, by reducing a film containing graphene oxide. As a reducing method, a method with application of heat or the like can be employed.

Further, a metal film or an alloy film which is thin enough to have a light-transmitting property can be used. For example, a metal material such as gold, silver, platinum, magnesium, nickel, tungsten, chromium, molybdenum, iron, cobalt, copper, palladium, or titanium, or an alloy material containing any of these metal materials can be used. Alternatively, a nitride of the metal material or the alloy material (e.g., titanium nitride), or the like may be used. Alternatively, a stacked film in which two or more of conductive films containing the above materials are stacked may be used.

For the electrodes 531 and the electrodes 532, a conductive film which is processed to be too thin to see by the users may be used. Such a conductive film is processed into a lattice shape (a mesh shape), for example, which makes it possible to achieve high conductivity and high visibility of the display device. It is preferable that the conductive film have a portion in which the width is greater than or equal to 30 nm and less than or equal to 100 µm, preferably greater than or equal to 50 nm and less than or equal to 50 µm, and further preferably greater than or equal to 50 nm and less than or equal to 20 µm. In particular, the conductive film having the pattern width of 10 µm or less is extremely difficult to see by the users, which is preferable.

Figure 23A:
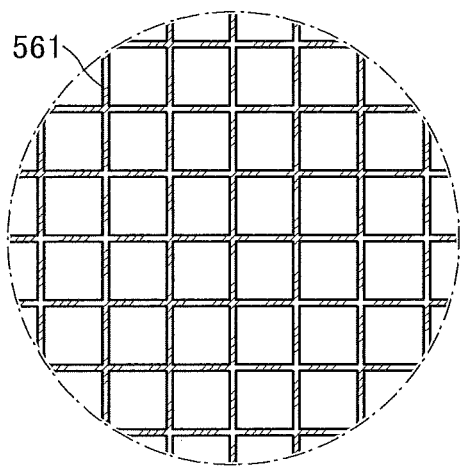
FIGS. 23A to 23D illustrate touch panels according to one embodiment.

As examples, enlarged schematic views of part of the electrodes 531 or the electrodes 532 (part in a circle formed by a dashed-dotted line in FIG. 22B) are shown in FIGS. 23A to 23D. FIG. 23A shows an example of the case in which a lattice-shape conductive film 561 is used. The lattice-shape conductive film 561 is preferably placed so as not to overlap the display element included in the display device because light from the display device is not blocked. In that case, it is preferable that the direction of the lattice be provided so as to be the same as the direction of the display element arrangement and that the pitch of the lattice be an integer multiple of the pitch of the display element arrangement.

Figure 23B:
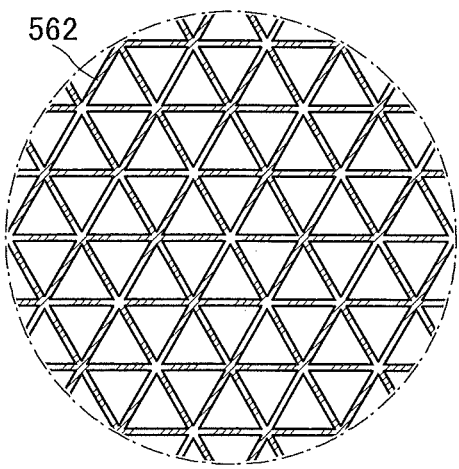

FIG. 23B shows an example of a lattice-shape conductive film 562, which is processed so as to be provided with triangle openings. Such a structure makes it possible to further reduce the resistance compared with the structure shown in FIG. 23A.

Figure 23C:
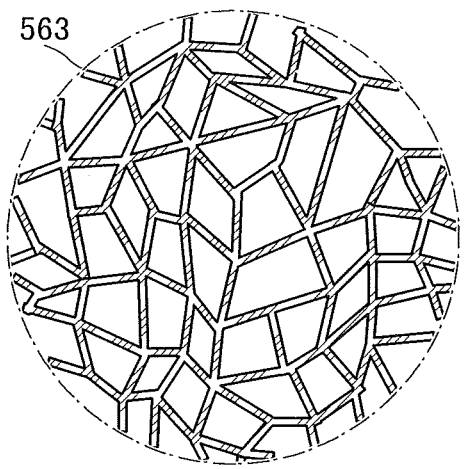

In addition, a conductive film 563, which has an irregular pattern shape, may be used as shown in FIG. 23C. Such a structure can prevent generation of moiré when overlapping with the display portion of the display device. Note that "moiré" refers to a fringe pattern created by diffraction or interference when external light or the like passes through or external light is reflected by narrow conductive films or the like spaced uniformly.

Figure 23D:
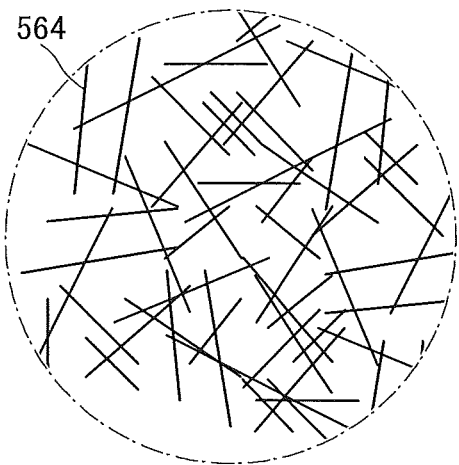

Conductive nanowires may be used for the electrodes 531 and the electrodes 532. FIG. 23D shows an example of the case in which nanowires 564 are used. The nanowires 564 are dispersed at appropriate density so as to be in contact with the adjacent nanowires, which can form a two-dimensional network; therefore, a conductive film with extremely high light-transmitting property can be provided. For example, a nanowire which has a mean value of the diameters of greater than or equal to 1 nm and less than or equal to 100 nm, preferably greater than or equal to 5 nm and less than or equal to 50 nm, further preferably greater than or equal to 5 nm and less than or equal to 25 nm can be used. As the nanowire 564, a metal nanowire such as an Ag nanowire, a Cu nanowire, and an Al nanowire, a carbon nanotube, or the like can be used. In the case of using an Ag nanowire, for example, light transmittance of 89% or more and a sheet resistance of 40 ohm/square or more and 100 ohm square or less can be achieved.

Although examples in which a plurality of rhombuses are aligned in one direction are shown in FIG. 22A and the like as top surface shapes of the electrodes 531 and the electrodes 532, the shapes of the electrodes 531 and the electrodes 532 are not limited thereto and can have various top surface shapes such as a belt shape (a rectangular shape), a belt shape having a curve, and a zigzag shape. In addition, although the above shows the electrodes 531 and the electrodes 532 are arranged to be perpendicular to each other, they are not necessarily arranged to be perpendicular and the angle formed by two of the electrodes may be less than 90°.

FIGS. 24A to 24C illustrate examples of the case where electrodes 536 and electrodes 537, which have a top surface shape of thin lines, are used instead of the electrodes 531 and the electrodes 532. FIG. 24A shows an example in which linear electrodes 536 and 537 are arranged so as to form a lattice shape.

FIG. 24B shows an example in which the electrodes 536 and the electrodes 537 have a top surface shape of a zigzag shape. As shown in FIG. 24B, the electrodes 536 and the electrodes 537 are arranged so as not to cross the straight-line portions at the centers but so as to place the centers of the straight-line portions in different positions from each other; therefore, the length of closely facing parallel parts of the electrodes 536 and the electrodes 537 can be longer. This is preferable because the capacitance between the electrodes can be increased and the sensitivity can be increased. Alternatively, as shown in FIG. 24C, the electrodes 536 and the electrodes 537 are arranged so as to have a design in which part of the straight-line portion of a zigzag shape is projected, which can increase the capacitance between the electrodes because the length of the parts facing each other can be longer even when the centers of the straight-line portions are placed in the same position.

Figure 25A:
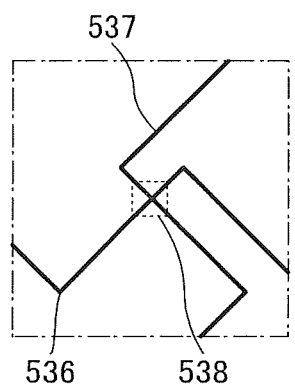
FIGS. 25A to 25F illustrate touch panels according to one embodiment.
Figure 25B:
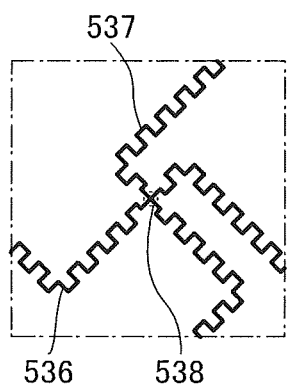
Figure 25C:
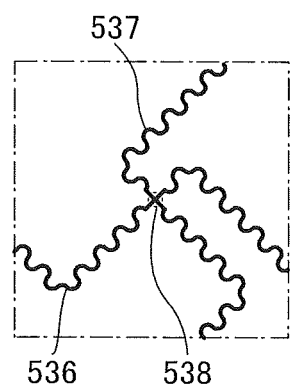
Figure 25D:
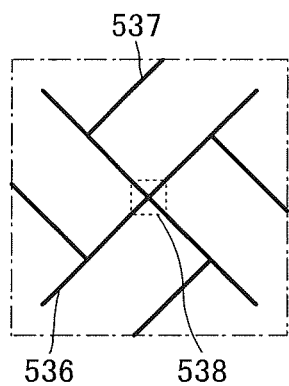
Figure 25E:
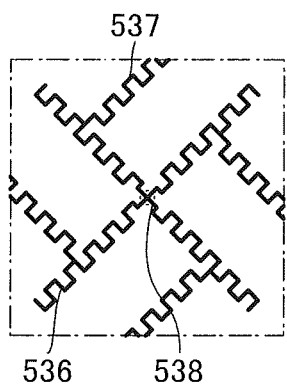
Figure 25F:
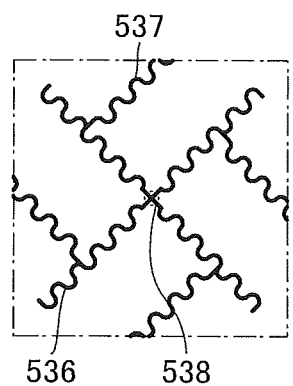

FIGS. 25A to 25C show enlarged views of a region surrounded by a dashed dotted line in FIG. 24B, and FIGS. 25D to 25F show enlarged views of a region surrounded by a dashed dotted line in FIG. 24C. In these drawings, the electrodes 536, the electrodes 537, and intersection portions 538 at which the electrodes 536 and the electrodes 537 intersect are illustrated. The straight-line portions of the electrodes 536 and the electrodes 537 shown in FIGS. 25A and 25D may have a serpentine shape that meanders with angled corners as shown in FIGS. 25B and 25E or may have a serpentine shape that continuously meanders as shown in FIGS. 25C and 25F.

Structure Example 4

Figure 26:
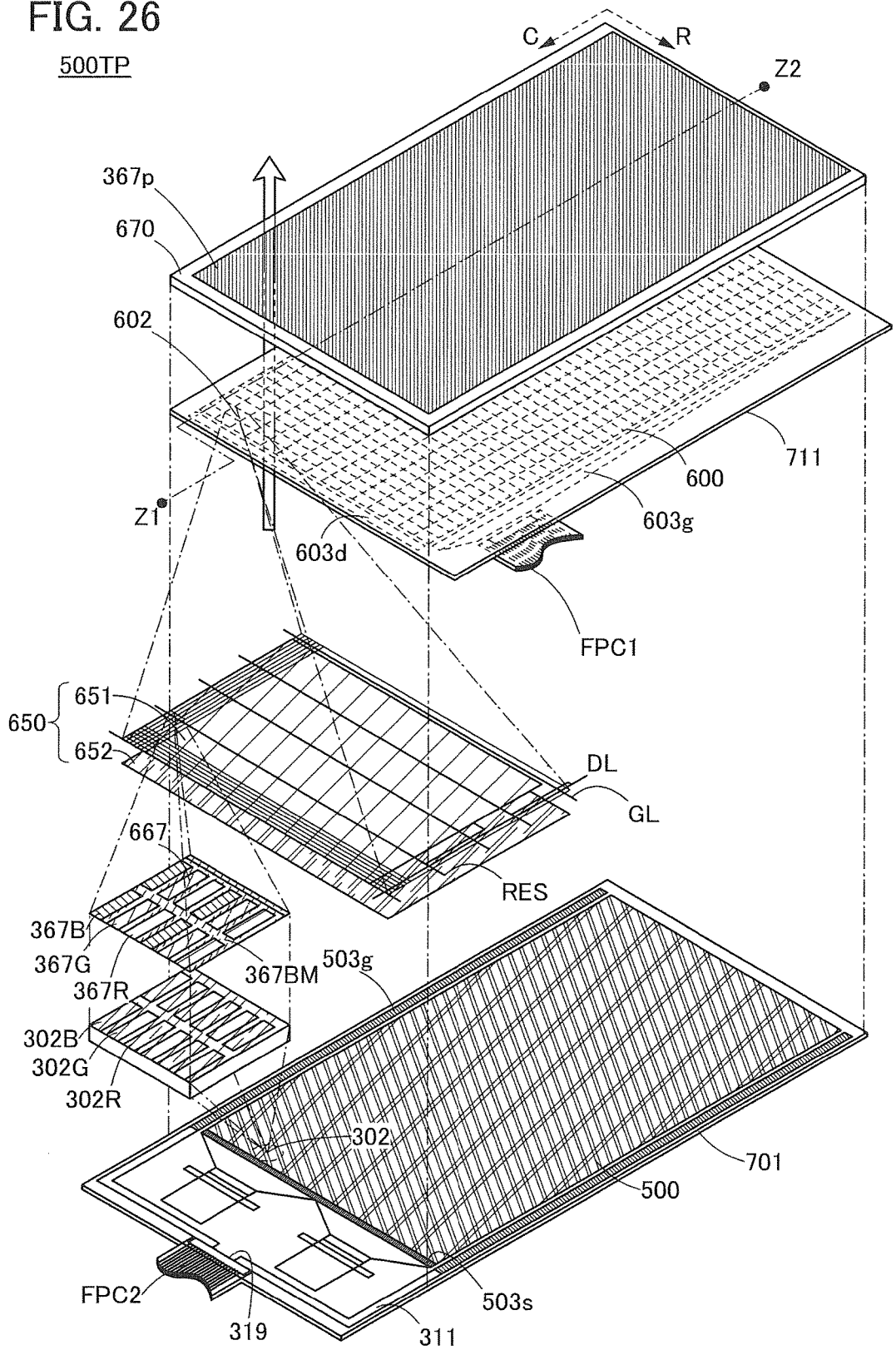
FIG. 26 illustrates a touch panel according to one embodiment.
Figure 27:
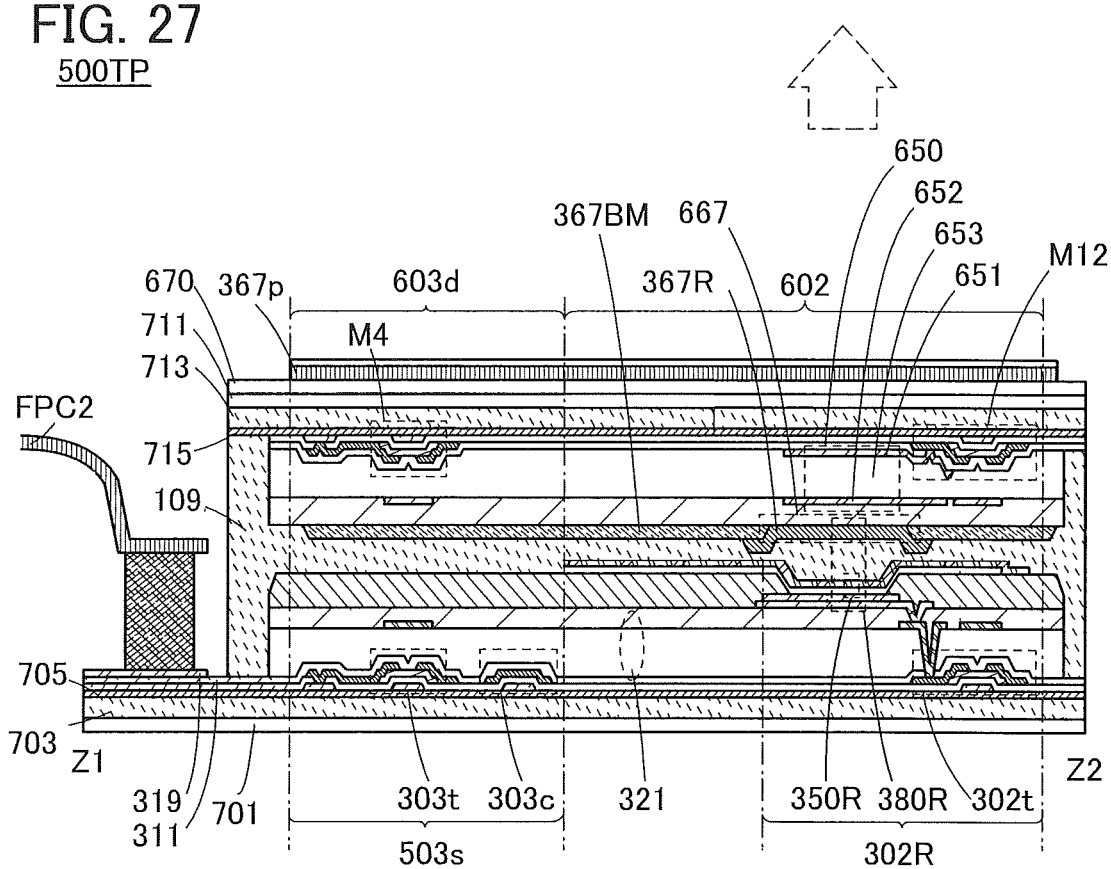
FIG. 27 illustrates a touch panel according to one embodiment.

As illustrated in FIG. 26, a touch panel 500TP includes a display portion 500 and an input portion 600 that overlap each other. FIG. 27 is a cross-sectional view taken along the dashed-dotted line Z1-Z2 in FIG. 26.

Individual components included in the touch panel 500TP are described below. Note that these components cannot be clearly distinguished and one component also serves as another component or include part of another component in some cases. Note that the touch panel 500TP in which the input portion 600 overlaps with the display portion 500 is also referred to as a touch panel.

The input portion 600 includes a plurality of sensing units 602 arranged in a matrix. The input portion 600 also includes a selection signal line GL, a control line RES, a signal line DL, and the like.

The selection signal line GL and the control line RES are electrically connected to the plurality of sensing units 602 that are arranged in the row direction (indicated by the arrow R in FIG. 26). The signal line DL is electrically connected to the plurality of sensing units 602 that are arranged in the column direction (indicated by the arrow C in FIG. 26).

The sensing unit 602 senses an object that is close thereto or in contact therewith and supplies a sensing signal. For example, the sensing unit 602 senses, for example, capacitance, illuminance, magnetic force, electric waves, or pressure and supplies data based on the sensed physical quantity. Specifically, a capacitor, a photoelectric conversion element, a magnetic sensing element, a piezoelectric element, a resonator, or the like can be used as the sensing element.

The sensing unit 602 senses, for example, a change in capacitance between the sensing unit 602 and an object close thereto or an object in contact therewith.

Note that when an object having a dielectric constant higher than that of the air, such as a finger, comes close to a conductive film in the air, the capacitance between the finger and the conductive film changes. The sensing unit 602 can sense the capacitance change and supply sensing data.

For example, distribution of charge occurs between the conductive film and the capacitor owing to the change in the electrostatic capacitance, so that the voltage across the capacitor is changed. This voltage change can be used as the sensing signal.

The sensing unit 602 is provided with a sensor circuit. The sensor circuit is electrically connected to the selection signal line GL, the control line RES, the signal line DL, or the like.

The sensor circuit includes a transistor, a sensor element, and/or the like. For example, a conductive film and a capacitor electrically connected to the conductive film can be used for the sensor circuit. A capacitor and a transistor electrically connected to the capacitor can also be used for the sensor circuit.

For example, a capacitor 650 including an insulating layer 653, and a first electrode 651 and a second electrode 652 between which the insulating layer 653 is provided can be used for the sensor circuit (see FIG. 27). Specifically, the voltage between the electrodes of the capacitor 650 changes when an object approaches the conductive film which is electrically connected to one electrode of the capacitor 650.

The sensing unit 602 includes a switch that can be turned on or off in accordance with a control signal. For example, a transistor M12 can be used as the switch.

A transistor which amplifies a sensing signal can be used in the sensing unit 602.

Transistors manufactured through the same process can be used as the transistor that amplifies a sensing signal and the switch. This allows the input portion 600 to be provided through a simplified process.

The sensing unit 602 includes a plurality of window portions 667 arranged in a matrix. The window portions 667 transmit visible light. A light-blocking layer BM may be provided between the window portions 667.

A coloring layer is provided in a position overlapping with the window portion 667 in the touch panel 500TP. The coloring layer transmits light of a predetermined color. Note that the coloring layer can be referred to as a color filter. For example, a coloring layer 367B transmitting blue light, a coloring layer 367G transmitting green light, and a coloring layer 367R transmitting red light can be used. Alternatively, a coloring layer transmitting yellow light or white light may be used.

The display portion 500 includes the plurality of pixels 302 arranged in a matrix. The pixel 302 is positioned so as to overlap with the window portions 667 of the input portion 600. The pixels 302 may be arranged at higher resolution than the sensing units 602. Each pixel has the same structure as Structure Example 1; thus, description is omitted.

The touch panel 500TP includes the input portion 600 that includes the plurality of sensing units 602 arranged in a matrix and the window portions 667 transmitting visible light, the display portion 500 that includes the plurality of pixels 302 overlapping with the window portions 667, and the coloring layers between the window portions 667 and the pixels 302. Each of the sensing units includes a switch that can reduce interference in another sensing unit.

Thus, sensing data obtained by each sensor unit can be supplied together with the positional information of the sensor unit. In addition, sensing data can be supplied in relation to the positional data of the pixel for displaying an image. In addition, the sensor unit which does not supply the sensing data is not electrically connected to a signal line, whereby interference with the sensor unit which supplies a sensing signal can be reduced. Consequently, the novel touch panel 500TP that is highly convenient or highly reliable can be provided.

For example, the input portion 600 of the touch panel 500TP can sense sensing data and supply the sensing data together with the positional data. Specifically, a user of the touch panel 500TP can make a variety of gestures (e.g., tap, drag, swipe, and pinch-in operation) using, as a pointer, his/her finger or the like on the input portion 600.

The input portion 600 can sense a finger or the like that comes close to or is in contact with the input portion 600 and supply sensing data including a sensed position, path, or the like.

An arithmetic unit determines whether or not supplied data satisfies a predetermined condition on the basis of a program or the like and executes an instruction associated with a predetermined gesture.

Thus, a user of the input portion 600 can make the predetermined gesture with his/her finger or the like and make the arithmetic unit execute an instruction associated with the predetermined gesture.

For example, first, the input portion 600 of the touch panel 500TP selects one sensing unit X from the plurality of sensing units that can supply sensing data to one signal line. Then, electrical continuity between the signal line and the sensing units other than the sensing unit X is not established. This can reduce interference of the other sensing units in the sensing unit X.

Specifically, interference of sensing elements of the other sensing units in a sensing element of the sensing unit X can be reduced.

For example, in the case where a capacitor and a conductive film to which one electrode of the capacitor is electrically connected are used for the sensing element, interference of the potentials of the conductive films of the other sensing units in the potential of the conductive film of the sensing unit X can be reduced.

Thus, the touch panel 500TP can drive the sensing unit and supply sensing data independently of its size. The touch panel 500TP can have a variety of sizes, for example, ranging from a size for a hand-held device to a size for an electronic blackboard.

The touch panel 500TP can be folded and unfolded. Even in the case where interference of the other sensing units in the sensing unit X is different between the folded state and the unfolded state, the sensing unit can be driven and sensing data can be supplied without dependence on the state of the touch panel 500TP.

The display portion 500 of the touch panel 500TP can be supplied with display data. For example, an arithmetic unit can supply the display data.

In addition to the above structure, the touch panel 500TP can have the following structure.

The touch panel 500TP may include a driver circuit 603g or a driver circuit 603d. In addition, the touch panel 500TP may be electrically connected to an FPC1.

The driver circuit 603g can supply selection signals at predetermined timings, for example. Specifically, the driver circuit 603g supplies selection signals to the selection signal lines GL row by row in a predetermined order. Any of a variety of circuits can be used as the driver circuit 603g. For example, a shift register, a flip flop circuit, a combination circuit, or the like can be used.

The driver circuit 603d supplies sensing data on the basis of a sensing signal supplied from the sensing unit. Any of a variety of circuits can be used as the driver circuit 603d. For example, a circuit that can form a source follower circuit or a current mirror circuit by being electrically connected to the sensing circuit in the sensing unit can be used as the driver circuit 603d. In addition, an analog-to-digital converter circuit that converts a sensing signal into a digital signal may be provided in the driver circuit 603d.

The FPC1 supplies a timing signal, a power supply potential, or the like and is supplied with a sensing signal.

The touch panel 500TP may include a driver circuit 503g, a driver circuit 503s, a wiring 311, and a terminal 319. In addition, the touch panel 500TP may be electrically connected to an FPC2.

In addition, a protective layer 670 that prevents damage and protects the touch panel 500TP may be provided. For example, a ceramic coat layer or a hard coat layer can be used as the protective layer 670. Specifically, a layer containing aluminum oxide or a UV curable resin can be used.

In the case of a transflective liquid crystal display or a reflective liquid crystal display, some of or all of pixel electrodes function as reflective electrodes. For example, some or all of pixel electrodes are formed to contain aluminum, silver, or the like.

Furthermore, a memory circuit such as an SRAM can be provided under the reflective electrodes, leading to lower power consumption. A structure suitable for employed display elements can be selected from among a variety of structures of pixel circuits.

The touch panel described in this embodiment can be used instead of the display panel 100 included in the display device 10 in Embodiment 1. In this case, a touch panel with a structure in which a plurality of FPCs connected to the touch panel are extracted from the same side, such as the touch panel 390 and the touch panel 505B, can be preferably used. Note that in the case where a touch panel is used instead of the display panel 100, the display device 10 can be referred to as an input/output device.

The adhesive layer 107 that bonds the plurality of touch panels to the substrate 106 is preferably provided so that the top surfaces of the touch sensors 595 (or the input portions 600) of these touch panels are level with each other and the top surfaces are parallel to the substrate 106. The distances between the surface of the input/output device (i.e., the surface of the substrate 106) and the touch sensors 595 (or the input portions 600) of the touch panels are made the same, whereby location dependence (also called in-plane variation) of detection sensitivity can be reduced.

This embodiment can be combined with any other embodiment as appropriate.

Example

In this example, an example in which a display device of one embodiment of the present invention was manufactured is described.

Figure 28A:
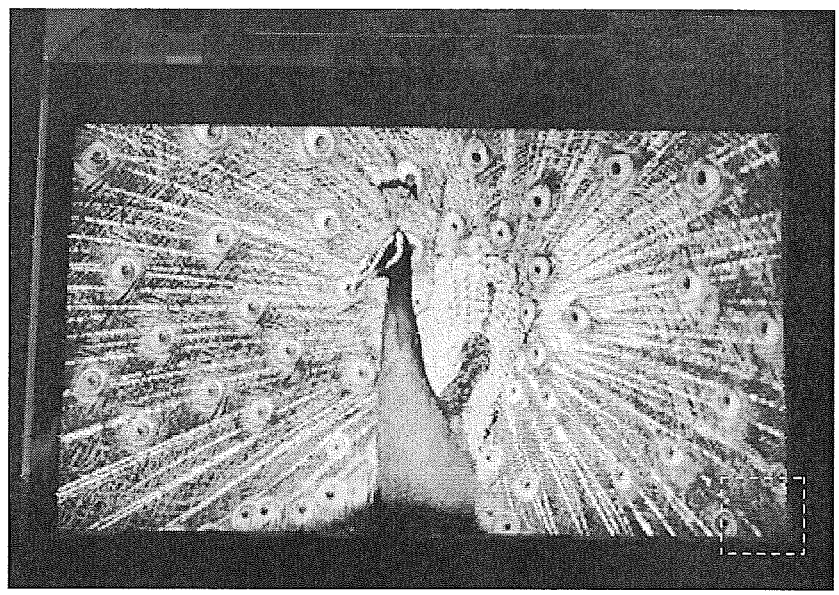
FIGS. 28A and 28B are photographs of a display panel according to one example.

The display device 20 includes four display panels 80 arranged in a matrix of two rows and two columns (two display panels in the horizontal direction and two display panels in the longitudinal direction). Table 1 shows the specifications of the display panel 80 in this example. FIG. 28A is a photograph of the display panel 80 displaying an image.

TABLE 1

| | Specifications |
|---|---|
| Panel Size | 13.5 inches |
| Driving Method | Active matrix |
| Resolution | 1280 (H) × 720 (V) HD |
| Pixel Density | 108 ppi |
| Aperture Ratio | 61.0% |
| Coloring Method | White tandem OLED, Top emission, Color filter (WTC technique) |
| Pixel Arrangement | RGBY checker |
| Source Driver | COF + DeMUX |
| Scan Driver | Integrated |
| Thickness at transparent bezel | Lower than or equal to 100 μm |

Figure 29:
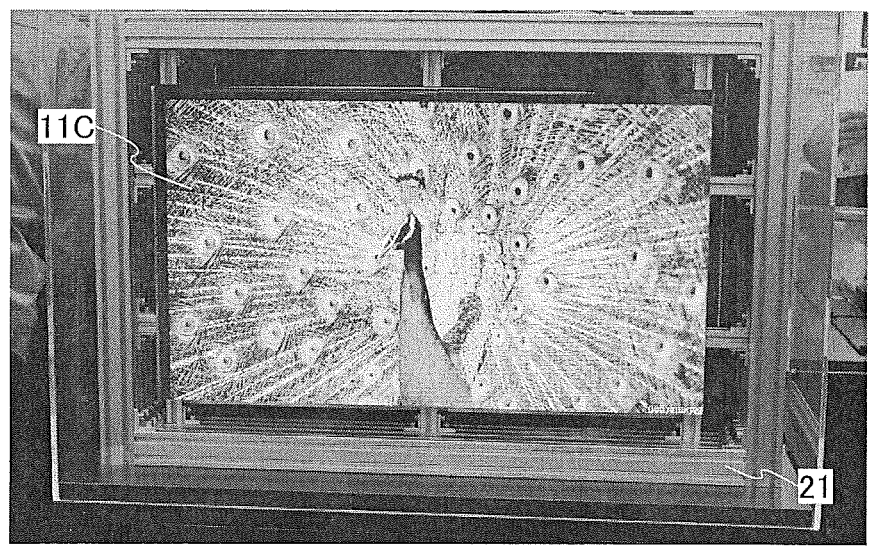
FIG. 29 is a photograph of a display device according to one example.

FIG. 29 is a photograph of the display device 20 displaying an image. The horizontal direction in FIG. 29 corresponds to the X-axis direction in FIG. 1A and FIG. 4A, and the longitudinal direction in FIG. 29 corresponds to the Y-axis direction in FIG. 1A and FIG. 4A. The display device 20 includes four plates 90, four stages 91, four driver circuits 62, four adjusting units 63, and the frame 21.

Figure 30A:
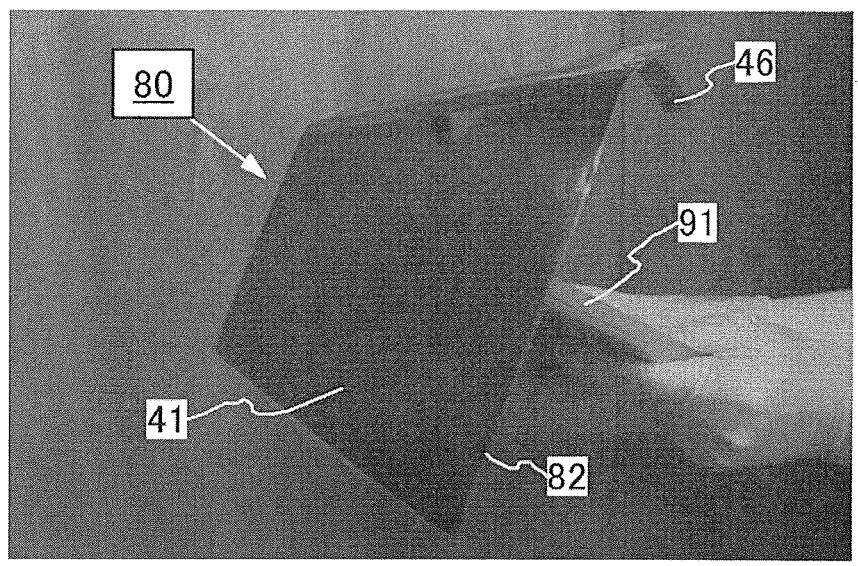
FIGS. 30A and 30B are photographs of a display panel according to one example.
Figure 30B:
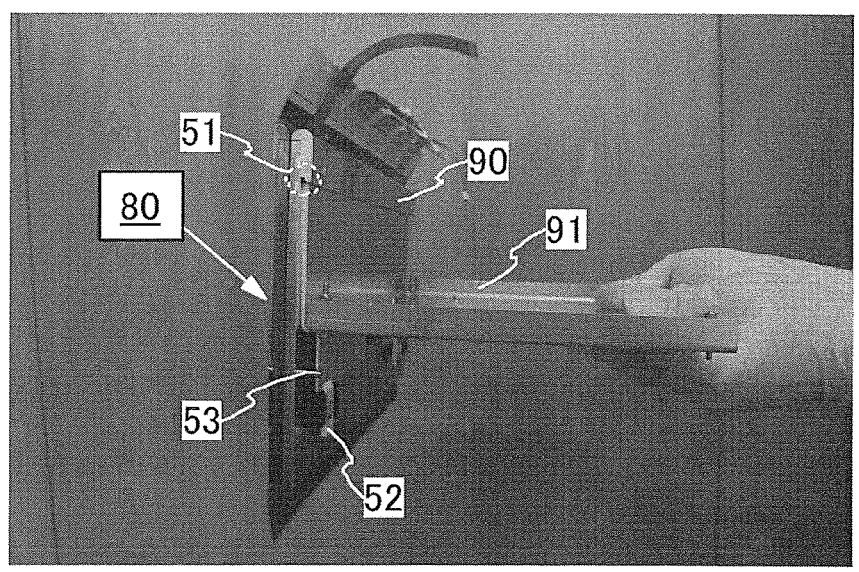

FIGS. 30A and 30B are photographs of one of four component groups 60 in the display device 20. In each component group 60, the display panel 80 and the plate 90 are fixed to each other and connected to the stage 91. FIG. 30A is a photograph of the component group 60 from the diagonally front side. The display, portion 41 of the display panel 80 is shown in FIG. 30A. FIG. 30B is a photograph of the component group 60 from the diagonally rear side.

Figure 28B:
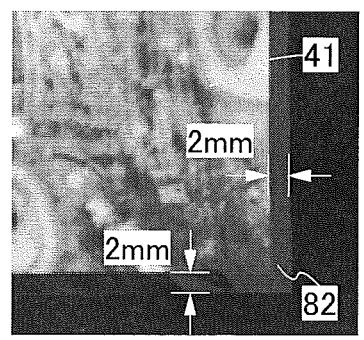

As shown in FIG. 30A, the display panel 80 includes the transparent portion 82 in a position adjacent to two sides of the display portion 41. As shown in FIG. 30B, the display panel 80 is fixed to the plate 90 so that transparent portion 82 and a part of the display portion 41 extend beyond two sides of the plate 90. In the display device 20 having such a structure, display portions 41 of the four display panels 80 can be arranged seamlessly, and an image or video without unnatural seams can be displayed on a display portion 11C used as one display area (see FIG. 29). In this example, the width of the transparent portion 82 is approximately 2 mm (see FIG. 28B). FIG. 28B is an enlarged photograph of a region surrounded by a dashed line in FIG. 28A.

Figure 31A:
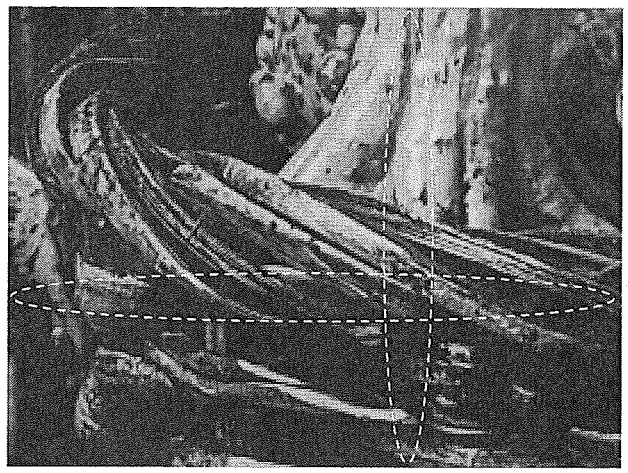
FIGS. 31A and 31B are photographs of a display device according to one example.

As shown in FIG. 30B, the alignment of the plate 90 and the stage 91 in the horizontal direction and the longitudinal direction can be performed precisely using the depression 51, the fastening 52, and the guide 53 of the plate 90. In the display device 20, the stage 91 is fixed to the frame 21 through the adjusting unit 63. As the adjusting unit 63, the combination of the X-axis stage, the Y-axis stage, and the goniometer stage is used as described in Embodiment 1. In the display device 20 having such a structure, the positions of the display panels 80 can be adjusted with high precision so that the display portions 41 of the four display panels 80 are seamlessly arranged to be parallel and that the positional shift of display on the display portions 41 of the adjacent display panels 80 does not occur. FIG. 31A is an enlarged photograph of a region in the vicinity of the joint portion of the display portions in the display device 20 displaying an image. In FIG. 31A, the joint portion of the display portions 41 is included in a region surrounded by a dashed line. It is shown from FIG. 31A that the display portions 41 of the four display panels 80 in the display device 20 are arranged so that the positional shift of display does not occur along the joint portion.

Figure 34:
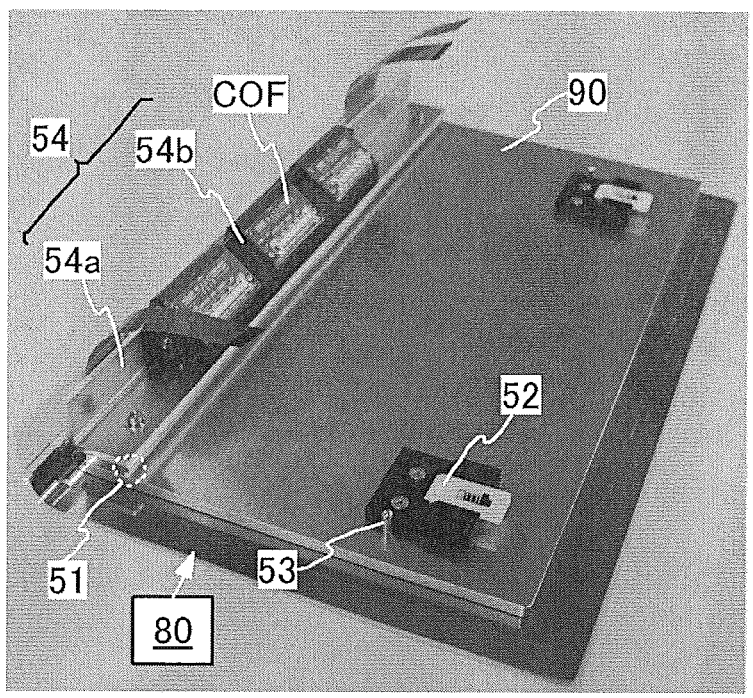
FIG. 34 is a photograph of a display device according to one example.

Note that the first surface of the plate 90 may be provided with a fixing instrument. In the case where the display panel 80 includes a chip on film (COF), the COF can be fixed to the first surface of the plate 90 using the fixing instrument. FIG. 34 is a photograph of the plate 90 in which the fixing instrument 54 is provided in the vicinity of the convexly curved surface of the first surface and the display panel 80 fixed to the plate 90. The fixing instrument 54 includes a member 54a and a member 54b. A material of the member 54a is not particularly limited. The member 54b is preferably faulted of an insulator. The member 54a is formed of a material similar to that of the plate 90. The member 54b is formed of plastic. By fixing the COF of the display device 20 to the member 54b with a screw or the like, the display panel 80 can be prevented from being broken when the plate 90 to which the display panel 80 is fixed is carried.

The driver circuits 62 can correct variation in display performance of the display panels 80 because of having a function of adjusting color tone, luminance, or the like of display of the display panels 80. Thus, the display portion 11C of the display device 20 can perform display with high display quality in which variation in color tone, luminance, or the like is suppressed.

Figure 31B:
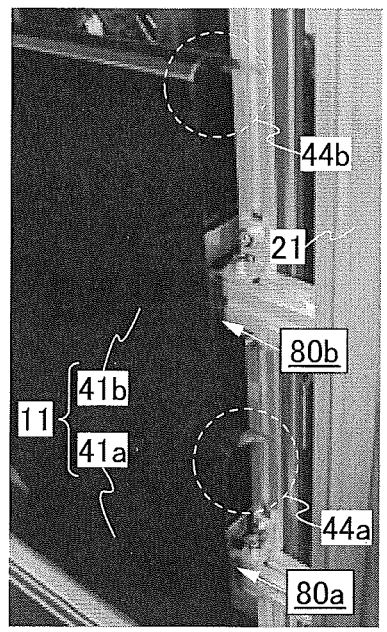

FIG. 31B is a photograph of the display device 20 from the diagonally front side with respect to the display portion 11C. As shown in FIG. 31B, the first portion 44 of the display panel 80 is bent to the rear surface side of the display surface of the display panel 80 along the convexly curved surface of the plate 50. Thus, the driver circuit 62 provided on the rear surface side of the display panel 80 can be easily connected to the external electrode 46. In addition, the external electrode 46 or the like does not hinder overlapping of the display panels 80, so that the display surface of the display portion 11C can be made almost flat with few steps. Note that in FIG. 31B, the lower (rear) display panel is denoted by 80a, whereas the upper (front) display panel is denoted by 80b.

In the display device 20, the display portion 11C has a size of 27 inches diagonal (the size of the display portion 41 of one display panel 80 is 13.5 inches diagonal), 2560×1440 effective pixels, the pixel size of 234 µm×234 µm, a resolution of 108 ppi, and an aperture ratio of 61.0%. A built-in scan driver and an external source driver attached by chip on film (COF) were used.

Figure 32:
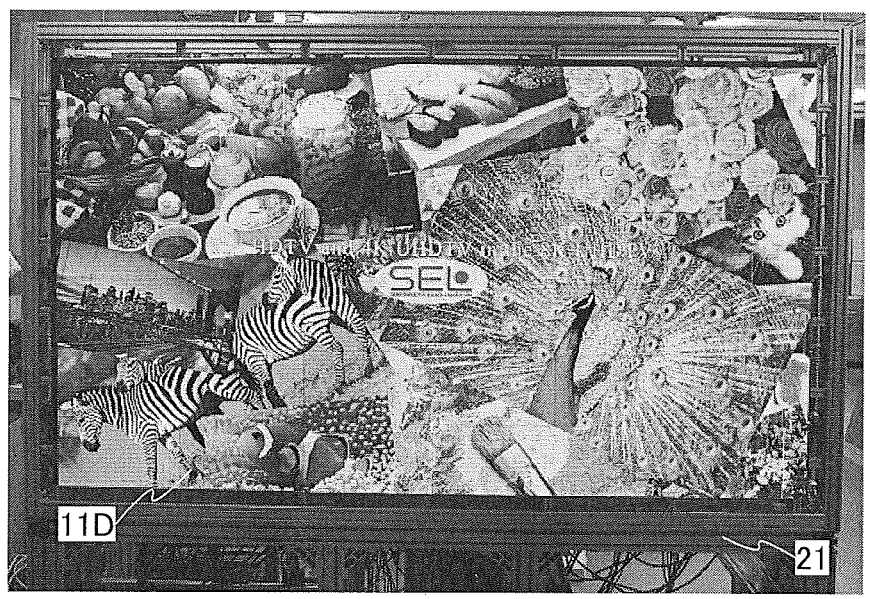
FIG. 32 is a photograph of a display device according to one example.
Figure 33A:
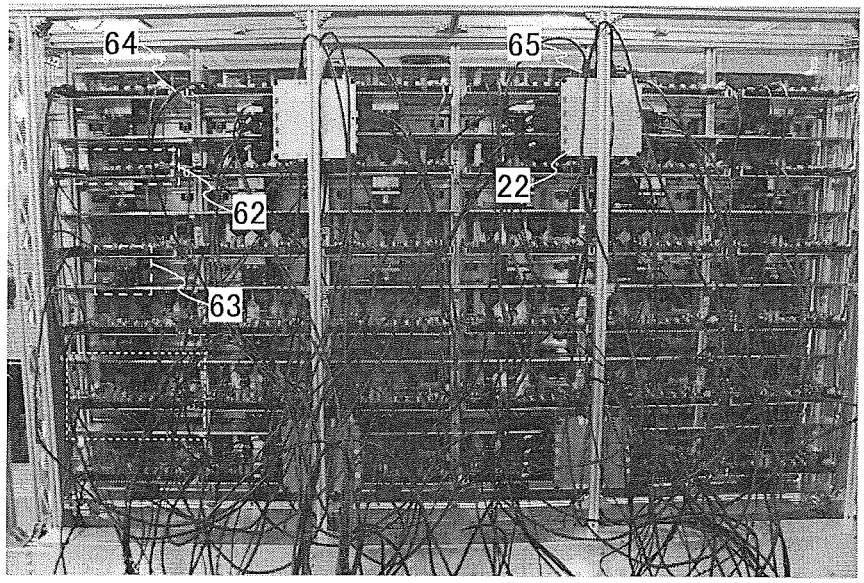
FIGS. 33A and 33B are photographs of a display device according to one example.
Figure 33B:
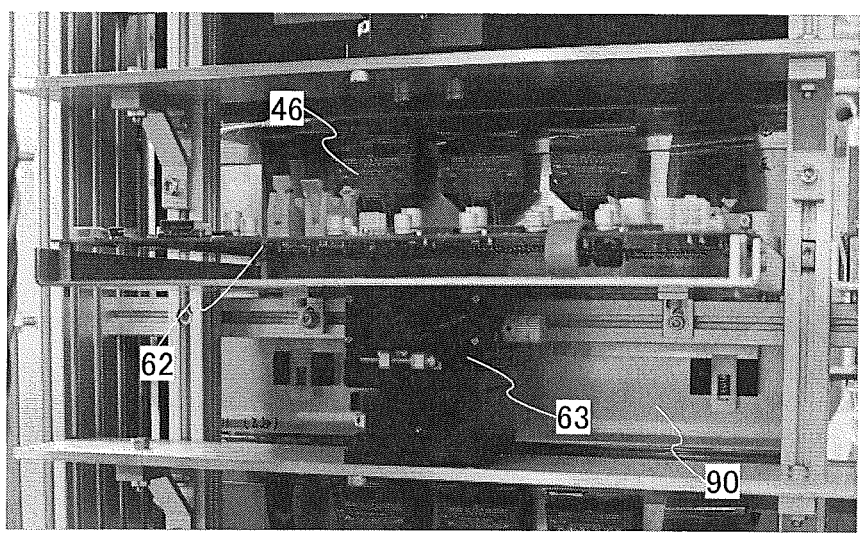

FIG. 32 is a photograph of the display device 10 displaying an image. The display device 10 includes display panels 80 of this example arranged in a matrix of six rows and six columns (six display panels in each of the horizontal direction and the longitudinal direction). FIG. 33A is a photograph of the rear side of the display surface of the display device 10. FIG. 33B is an enlarged photograph of a portion surrounded by a dotted line in FIG. 33A. FIG. 33B is a photograph showing a state in which the cables 64 connected to the driver circuits 62 in FIG. 33A are removed.

The display device 10 includes 36 plates 90, 36 stages 91, 36 driver circuits 62, 36 adjusting units 63, and the frame 21. The display device 10 also includes four video signal dividers 22 and two video output units 23 (not shown). In this example, an uncompressed disk recorder is used as the video output unit 23. Note that in the display device 10, a display portion 11D has a size of 81 inches diagonal and the number of effective pixels is 7680×4320 (8K).

In this example, as the light-emitting element included in the display portion 41, a tandem (stack) organic EL element emitting white light was used. The light-emitting element has a top emission structure. Light from the light-emitting element is extracted outside through a color filter.

As the transistor, a transistor including a c-axis aligned crystalline oxide semiconductor (CAAC-OS) was used. Unlike amorphous semiconductor, the CAAC-OS has few defect states, so that the reliability of the transistor can be improved. In addition, because laser crystallization is not needed for formation of a CAAC-OS, a uniform film can be formed even over a large-sized glass substrate or the like. Moreover, since the CAAC-OS does not have a grain boundary, stress that is caused by bending a flexible display panel does not easily make a crack in a CAAC-OS film.

A CAAC-OS is an oxide semiconductor having c-axis alignment in a direction substantially perpendicular to the film surface. It has been found that oxide semiconductors have a variety of crystal structures other than a single-crystal structure. An example of such structures is a nano-crystal (nc) structure, which is an aggregate of nanoscale microcrystals. The crystallinity of a CAAC-OS structure is lower than that of a single-crystal structure and higher than that of an nc structure.

In this example, a channel-etched transistor including an In—Ga—Zn-based oxide was used. The transistor was fabricated over a glass substrate at a process temperature lower than 500° C.

As shown in FIG. 29 and FIG. 32, in one embodiment of the present invention, a large-sized display device in which a joint portion of display portions is hardly recognized by a user was able to be obtained.

At least part of this example can be implemented in combination with any of the embodiments described in this specification as appropriate.

REFERENCE NUMERALS

10: display device, 11A: display portion, 11B: display portion, 11C: display portion, 11D: display portion, 20: display device, 20A: display device, 20B: display device, 21: frame, 21A: frame, 21B: frame, 22: video signal divider, 23: video output unit, 30: display panel, 30a: display panel, 30b: display panel, 31: pixel, 31a: pixel, 31b: pixel, 32: transparent portion, 32b: transparent portion, 33c: operating circuit, 33d: operating circuit, 34c: wiring, 34d: wiring, 35: wiring, 36: substrate, 37: substrate, 38: adhesive layer, 40: display panel, 40a: display panel, 40b: display panel, 41: display portion, 41a: display portion, 41b: display portion, 42: transparent portion, 42b: transparent portion, 43: operating circuit portion, 43a: operating circuit portion, 44: first portion, 44a: first portion, 44b: first portion, 45: terminal, 45b: terminal, 46: external electrode, 46a: external electrode, 46b: external electrode, 50: plate, 50a: plate, 50b: plate, 52: fastening, 52a: fastening, 53: guide, 53a: guide, 54: fixing instrument, 54a: member, 54b: member, 60: component group, 61: stage, 61a: stage, 61b: stage, 62: driver circuit, 62a: driver circuit, 62b: driver circuit, 63: adjusting unit, 63a: adjusting unit, 63b: adjusting unit, 64: cable, 64a: cable, 64b: cable, 65: cable, 80: display panel, 80a: display panel, 80b: display panel, 82: transparent portion, 82b: transparent portion, 90: plate, 90a: plate, 90b: plate, 91: stage, 91a: stage, 91b: stage, 100: display panel, 106: substrate, 107: adhesive layer, 301: display portion, 302: pixel, 302B: sub-pixel, 302G: sub-pixel, 302R: sub-pixel, 302t: transistor, 303c: capacitor, 303g(1): scan line driver circuit, 303g(2): imaging pixel driver circuit, 303s(1): image signal line driver circuit, 303s(2): imaging signal line driver circuit, 303t: transistor, 304: gate, 308: imaging pixel, 308p: photoelectric conversion element, 308t: transistor, 309: FPC, 311: wiring, 319: terminal, 321: insulating layer, 328: partition, 329: spacer, 350R: light-emitting element, 351R: lower electrode, 352: upper electrode, 353: EL layer, 353a: EL layer, 353b: EL layer, 354: intermediate layer, 360: adhesive layer, 367B: coloring layer, 367BM: light-blocking layer, 367G: coloring layer, 367p: anti-reflective layer, 367R: coloring layer, 380B: light-emitting module, 380G: light-emitting module, 380R: light-emitting module, 390: touch panel, 500: display portion, 500TP: touch panel, 501: display portion, 503g: driver circuit, 503s: driver circuit, 505A: touch panel, 505B: touch panel, 509(1): FPC, 509(2): FPC, 531: electrode, 532: electrode, 533: electrode, 534: bridge electrode, 536: electrode, 537: electrode, 538: intersection portion, 541: wiring, 542: wiring, 550: FPC, 561: conductive film, 562: conductive film, 563: conductive film, 564: nanowire, 590: substrate, 591: electrode, 592: electrode, 593: insulating layer, 594: wiring, 595: touch sensor, 597: adhesive layer, 598: wiring, 599: connection layer, 600: input portion, 602: sensing unit, 603d: driver circuit, 603g: driver circuit, 650: capacitor, 651: electrode, 652: electrode, 653: insulating layer, 667: window portion, 670: protective layer, 701: substrate, 703: adhesive layer, 705: insulating layer, 711: substrate, 713: adhesive layer, 715: insulating layer, 723: adhesive layer, 804: display portion, 806: operating circuit portion, 808: FPC, 810: transparent portion, 815: insulating layer, 816: insulating layer, 817: insulating layer, 817a: insulating layer, 817b: insulating layer, 820: transistor, 821: insulating layer, 822: adhesive layer, 823: spacer, 824: transistor, 825: connector, 830: light-emitting element, 831: lower electrode, 832: optical adjusting layer, 832B: optical adjusting layer, 832R: optical adjusting layer, 833: EL layer, 835: upper electrode, 845: coloring layer, 847: light-blocking layer, 849: overcoat, 856: conductive layer, 857: conductive layer, 860: auxiliary electrode, 860a: conductive layer, 860b: conductive layer, 870: transistor, 871: capacitor.

This application is based on Japanese Patent Application serial no. 2014-206873 filed with Japan Patent Office on Oct. 8, 2014, Japanese Patent Application serial no. 2014-219086 filed with Japan Patent Office on Oct. 28, 2014, Japanese Patent Application serial no. 2014-240213 filed with Japan Patent Office on Nov. 27, 2014, and Japanese Patent Application serial no. 2015-043931 filed with Japan Patent Office on Mar. 5, 2015, the entire contents of which are hereby incorporated by reference.

The invention claimed is:

1. A display device comprising:
a first unit comprising a first display panel, a first plate, a first stage, a first driver circuit, and a first adjusting unit;
a second unit comprising a second display panel, a second plate, a second stage, a second driver circuit, and a second adjusting unit; and
a frame,
wherein the first and second driver circuits are configured to output signals for driving their respective first and second display panels,
wherein the first and second adjusting units are configured to adjust positions and angles of their respective first and second stages and are fixed to the frame,
wherein the first and second plates comprise first surfaces provided with mechanisms for connection to the first and second stages, respectively,
wherein the first and second plates each comprise a convexly curved surface,
wherein the mechanisms include depressions to which parts of the first and second stages are fit, respectively,
wherein the first and second display panels cover top surfaces and the convexly curved surfaces of the first and second plates, respectively, and
wherein a part of the first display panel and a part of the second display panel extend beyond the first and second plates, respectively.

2. The display device according to claim 1, further comprising a video signal divider and a video output unit,
wherein the video output unit is configured to output a video signal or an image signal to the video signal divider, and
wherein the video signal divider is configured to divide the video signal or the image signal into a plurality of signals and output the signals to the first and second driver circuits.

3. The display device according to claim 1,
wherein the first driver circuit is configured to adjust color tone and luminance of images or video that is to be displayed on the first display panel, and
wherein the second driver circuit is configured to adjust color tone and luminance of images or video that is to be displayed on the second display panel.

4. The display device according to claim 1,
wherein each of the first and second display panels comprises a display portion comprising a plurality of pixels, and
wherein the plurality of pixels each comprise a transistor and a light-emitting element comprising a lower electrode, an upper electrode, and an EL layer between the lower electrode and the upper electrode.

5. The display device according to claim 4,
wherein each of the display portions comprises an auxiliary electrode, and wherein each of the auxiliary electrodes is in contact with the upper electrode in a region between adjacent lower electrodes in the plurality of lower electrodes.

6. A display device comprising:
two display panels;
two plates;
two stages;
two driver circuits;
two adjusting units; and
a frame,
wherein the adjusting units are configured to adjust positions and angles of their respective stages and are fixed to the frame,
wherein the driver circuits are configured to output signals for driving their respective display panels,
wherein the stages are fixed to the adjusting units and comprise regions provided with their respective driver circuits and plates,
wherein the plates comprise first surfaces provided with mechanisms for connection to their respective stages and comprise convexly curved surfaces,
wherein the mechanisms include depressions to which parts of the stages are fit and fastenings sliding in the Y-axis direction, respectively,
wherein each of the display panels comprises a display portion, an operating circuit portion, a terminal, an external electrode, a transparent portion, and a first portion and has flexibility,
wherein the display portion is configured to display an image,
wherein the operating circuit portion comprises a circuit having a function of outputting a signal to the display portion and a wiring electrically connecting the circuit and the terminal,
wherein the operating circuit portion is located in a region adjacent to the display portion,
wherein the to terminal is electrically connected to the external electrode,
wherein the external electrode is configured to transmit the signal output from the driver circuit to the operating circuit portion,
wherein the transparent portion comprises a region transmitting visible light and is located in a region not overlapping with the operating circuit portion and adjacent to one side of the display portion,
wherein, in each of the display panels, the first portion comprises a region between the terminal and the display portion,
wherein surfaces opposite to image display surfaces of the display panels are fixed to second surfaces so that the transparent portions and parts of the display portions extend beyond the plates,
wherein the first portions are provided along the convexly curved surfaces, and
wherein the display portion of one of the display panels overlaps with the transparent portion of the other of the display panels.

7. The display device according to claim 6, further comprising a video signal divider and a video output unit,
wherein the video output unit is configured to output a video signal or an image signal to the video signal divider, and
wherein the video signal divider is configured to divide the video signal or the image signal into a plurality of signals and output the signals to the driver circuits.

8. The display device according to claim 6,
wherein, in each of the display panels, the transparent portion is located in a region not overlapping with the operating circuit portion and adjacent to two sides of the display portion, and
wherein the first portion of one of the display panels overlaps with the first portion of the other of the display panels.

9. The display device according to claim 6,
wherein the driver circuits are configured to adjust color tone and luminance of images or video that is to be displayed on the display panels.

10. The display device according to claim 6,
wherein the display portions each comprise a plurality of pixels, and
wherein the plurality of pixels each comprise a transistor and a light-emitting element comprising a lower electrode, an upper electrode, and an EL layer between the lower electrode and the upper electrode.

11. The display device according to claim 10,
wherein each of the display portions comprises an auxiliary electrode, and
wherein each of the auxiliary electrodes is in contact with the upper electrode in a region between adjacent lower electrodes in the plurality of lower electrodes.

* * * * *